(12) United States Patent
Ching et al.

(10) Patent No.: US 9,960,273 B2
(45) Date of Patent: May 1, 2018

(54) INTEGRATED CIRCUIT STRUCTURE WITH SUBSTRATE ISOLATION AND UN-DOPED CHANNEL

(71) Applicant: Taiwan Semiconductor Manufacturing Company, Ltd., Hsin-Chu (TW)

(72) Inventors: Kuo-Cheng Ching, Hsinchu County (TW); Ching-Wei Tsai, Hsin-Chu (TW); Chung-Cheng Wu, Hsin-Chu County (TW); Chih-Hao Wang, Hsinchu County (TW); Wen-Hsing Hsieh, Hsinchu County (TW); Ying-Keung Leung, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 59 days.

(21) Appl. No.: 14/942,740

(22) Filed: Nov. 16, 2015

(65) Prior Publication Data
US 2017/0141220 A1  May 18, 2017

(51) Int. Cl.
| | |
|---|---|
| *H01L 29/78* | (2006.01) |
| *H01L 29/06* | (2006.01) |
| *H01L 27/06* | (2006.01) |
| *H01L 29/66* | (2006.01) |
| *H01L 29/417* | (2006.01) |

(52) U.S. Cl.
CPC ........ *H01L 29/785* (2013.01); *H01L 27/0635* (2013.01); *H01L 29/0649* (2013.01); *H01L 29/41791* (2013.01); *H01L 29/66545* (2013.01); *H01L 29/66795* (2013.01)

(58) Field of Classification Search
CPC ......... H01L 29/41791; H01L 29/66772; H01L 29/66795–29/66818; H01L 29/7831; H01L 29/785–29/786; H01L 29/7855–29/7856; H01L 2029/7858; H01L 2924/13067; H01L 21/823412; H01L 21/823807; H01L 29/7838; H01L 21/845; H01L 21/823821; H01L 21/823431; H01L 27/0886; H01L 27/0924; H01L 27/10826; H01L 27/10879; H01L 27/1211; H01L 27/092; H01L 27/0922; H01L 27/2454
See application file for complete search history.

(56) References Cited

U.S. PATENT DOCUMENTS

| | | | |
|---|---|---|---|
| 6,972,466 B1 * | 12/2005 | Liang | H01L 21/84 257/338 |
| 7,425,740 B2 | 9/2008 | Liu et al. | |

(Continued)

*Primary Examiner* — Maliheh Malek
(74) *Attorney, Agent, or Firm* — Haynes and Boone, LLP

(57) ABSTRACT

The present disclosure provides a semiconductor structure. The semiconductor structure includes a substrate having a first region and a second region; a first fin feature formed on the substrate within the first region; and a second fin feature formed on the substrate within the second region. The first fin feature includes a first semiconductor feature of a first semiconductor material formed on a dielectric feature that is an oxide of a second semiconductor material. The second fin feature includes a second semiconductor feature of the first semiconductor material formed on a third semiconductor feature of the second semiconductor material.

20 Claims, 58 Drawing Sheets

(56) References Cited

U.S. PATENT DOCUMENTS

| | | | |
|---|---|---|---|
| 7,449,733 B2 * | 11/2008 | Inaba | H01L 29/42392 257/250 |
| 7,667,271 B2 | 2/2010 | Yu et al. | |
| 8,048,723 B2 | 11/2011 | Chang et al. | |
| 8,053,299 B2 | 11/2011 | Xu | |
| 8,183,627 B2 | 5/2012 | Currie | |
| 8,236,634 B1 * | 8/2012 | Kanike | H01L 21/845 257/E21.431 |
| 8,278,184 B1 * | 10/2012 | Chen | H01L 21/823431 257/519 |
| 8,362,575 B2 | 1/2013 | Kwok et al. | |
| 8,367,498 B2 | 2/2013 | Chang et al. | |
| 8,377,779 B1 * | 2/2013 | Wang | H01L 29/66795 257/E21.421 |
| 8,415,718 B2 | 4/2013 | Xu | |
| 8,440,517 B2 | 5/2013 | Lin et al. | |
| 8,497,177 B1 | 7/2013 | Chang et al. | |
| 8,497,528 B2 | 7/2013 | Lee et al. | |
| 8,609,495 B2 * | 12/2013 | Gan | H01L 29/66795 257/204 |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,679,925 B2 * | 3/2014 | Wang | H01L 29/66795 257/E21.421 |
| 8,680,576 B2 | 3/2014 | Ching et al. | |
| 8,703,565 B2 | 4/2014 | Chang et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,872,161 B1 * | 10/2014 | Ching | H01L 29/0673 257/24 |
| 8,901,607 B2 * | 12/2014 | Wang | H01L 29/785 257/192 |
| 9,006,786 B2 * | 4/2015 | Ching | H01L 29/7856 257/188 |
| 9,054,219 B1 * | 6/2015 | Hoffmann | H01L 21/823431 |
| 9,224,864 B1 * | 12/2015 | Wu | H01L 29/7848 |
| 9,257,559 B2 * | 2/2016 | Ching | |
| 9,324,656 B1 * | 4/2016 | Labonte | H01L 21/76831 |
| 9,368,594 B2 * | 6/2016 | Chang | H01L 29/735 |
| 9,418,994 B1 * | 8/2016 | Chao | H01L 27/0886 |
| 9,437,683 B2 * | 9/2016 | Ching | H01L 29/16 |
| 9,461,110 B1 * | 10/2016 | Wang | H01L 29/0649 |
| 9,484,461 B2 * | 11/2016 | Ching | H01L 29/785 |
| 9,543,418 B2 * | 1/2017 | Ching | H01L 29/785 |
| 9,590,077 B2 * | 3/2017 | Cheng | H01L 29/66795 |
| 9,608,116 B2 * | 3/2017 | Ching | H01L 29/785 |
| 9,613,949 B1 * | 4/2017 | Pan | H01L 27/0635 |
| 9,627,481 B2 * | 4/2017 | Park | H01L 29/0847 |
| 9,659,962 B2 * | 5/2017 | Schulz | H01L 27/1211 |
| 9,666,581 B2 * | 5/2017 | Ching | H01L 27/0886 |
| 9,711,535 B2 * | 7/2017 | Wang | H01L 27/1211 |
| 9,721,955 B2 * | 8/2017 | Ching | H01L 27/1104 |
| 2004/0009636 A1 * | 1/2004 | Ichinose | H01L 21/76224 438/199 |
| 2009/0294801 A1 * | 12/2009 | Harley | H01L 21/823807 257/192 |
| 2009/0309167 A1 * | 12/2009 | Russ | H01L 21/8249 257/370 |
| 2011/0068407 A1 | 3/2011 | Yeh et al. | |
| 2011/0175152 A1 * | 7/2011 | Booth, Jr. | H01L 21/845 257/306 |
| 2013/0011983 A1 | 1/2013 | Tsai et al. | |
| 2013/0175578 A1 * | 7/2013 | Lee | H01L 27/088 257/192 |
| 2013/0285143 A1 * | 10/2013 | Oh | H01L 21/823821 257/347 |
| 2013/0285153 A1 | 10/2013 | Lee et al. | |
| 2013/0292777 A1 * | 11/2013 | Liaw | G11C 11/412 257/369 |
| 2013/0328162 A1 * | 12/2013 | Hu | H01L 27/0629 257/526 |
| 2014/0008734 A1 * | 1/2014 | Lu | H01L 21/2652 257/401 |
| 2014/0117422 A1 * | 5/2014 | Reznicek | H01L 27/0886 257/288 |
| 2014/0124863 A1 * | 5/2014 | Cheng | H01L 21/845 257/350 |
| 2014/0183600 A1 | 7/2014 | Huang et al. | |
| 2014/0197456 A1 * | 7/2014 | Wang | H01L 29/785 257/192 |
| 2014/0197457 A1 * | 7/2014 | Wang | H01L 29/785 257/192 |
| 2014/0203334 A1 * | 7/2014 | Colinge | H01L 29/66795 257/288 |
| 2014/0203370 A1 * | 7/2014 | Maeda | H01L 29/785 257/365 |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0273366 A1 * | 9/2014 | Lin | H01L 27/092 438/200 |
| 2014/0312432 A1 * | 10/2014 | Ching | H01L 29/66795 257/401 |
| 2014/0353731 A1 * | 12/2014 | Colinge | H01L 29/7843 257/288 |
| 2014/0353760 A1 * | 12/2014 | Loubet | H01L 21/823821 257/369 |
| 2015/0034899 A1 * | 2/2015 | Ching | H01L 29/66439 257/9 |
| 2015/0091100 A1 * | 4/2015 | Xie | H01L 21/76224 257/401 |
| 2015/0102348 A1 * | 4/2015 | Cai | H01L 29/785 257/69 |
| 2015/0144998 A1 * | 5/2015 | Ching | H01L 29/785 257/190 |
| 2015/0144999 A1 * | 5/2015 | Ching | H01L 29/66795 257/190 |
| 2015/0200252 A1 * | 7/2015 | Ching | H01L 29/0649 257/510 |
| 2015/0200300 A1 * | 7/2015 | Ching | H01L 29/785 257/397 |
| 2015/0236116 A1 * | 8/2015 | Chang | H01L 29/6625 438/338 |
| 2015/0287650 A1 * | 10/2015 | Chang | H01L 21/225 438/236 |
| 2015/0295089 A1 * | 10/2015 | Huang | H01L 29/7853 257/401 |
| 2015/0303118 A1 * | 10/2015 | Wang | H01L 21/823481 257/401 |
| 2015/0303198 A1 * | 10/2015 | Ching | H01L 29/16 257/192 |
| 2015/0303305 A1 * | 10/2015 | Ching | H01L 29/7851 257/192 |
| 2015/0311207 A1 * | 10/2015 | Ching | H01L 27/0924 257/192 |
| 2015/0311335 A1 * | 10/2015 | Ching | H01L 29/785 257/192 |
| 2015/0311336 A1 * | 10/2015 | Ching | H01L 29/0607 257/192 |
| 2016/0005738 A1 * | 1/2016 | Liu | H01L 27/0924 257/369 |
| 2016/0027777 A1 * | 1/2016 | Eneman | H01L 29/1054 257/192 |
| 2016/0027781 A1 * | 1/2016 | Glass | H01L 29/0847 257/192 |

(56) References Cited

U.S. PATENT DOCUMENTS

| | | | |
|---|---|---|---|
| 2016/0079428 A1* | 3/2016 | Zhao | H01L 29/7853 257/347 |
| 2016/0093726 A1* | 3/2016 | Ching | H01L 29/785 257/192 |
| 2016/0099352 A1* | 4/2016 | Lee | H01L 29/0653 257/192 |
| 2016/0104765 A1* | 4/2016 | Ching | H01L 21/823431 257/29 |
| 2016/0104776 A1* | 4/2016 | Ching | H01L 29/1083 257/401 |
| 2016/0104793 A1* | 4/2016 | Ching | H01L 29/785 257/347 |
| 2016/0141423 A1* | 5/2016 | Diaz | H01L 29/78618 257/329 |
| 2016/0148935 A1* | 5/2016 | Chen | H01L 21/823878 257/369 |
| 2016/0190325 A1* | 6/2016 | Liu | H01L 29/7856 257/401 |
| 2016/0197004 A1* | 7/2016 | Akarvardar | H01L 21/76202 257/509 |
| 2016/0204260 A1* | 7/2016 | Ching | H01L 29/7851 257/401 |
| 2016/0211251 A1* | 7/2016 | Liaw | H01L 27/0207 |
| 2016/0211346 A1* | 7/2016 | Shifren | H01L 21/823807 |
| 2016/0218104 A1* | 7/2016 | Wen | H01L 21/845 |
| 2016/0240652 A1* | 8/2016 | Ching | H01L 29/785 |
| 2016/0240681 A1* | 8/2016 | Ching | H01L 29/7856 |
| 2016/0268312 A1* | 9/2016 | Wang | H01L 21/02532 |
| 2016/0268375 A1* | 9/2016 | Chen | H01L 29/0673 |
| 2016/0268434 A1* | 9/2016 | Ching | H01L 29/7851 |
| 2016/0293598 A1* | 10/2016 | Kim | H01L 27/0886 |
| 2016/0293761 A1* | 10/2016 | Liu | G06N 3/04 |
| 2016/0308048 A1* | 10/2016 | Ching | H01L 29/7848 |
| 2016/0322358 A1* | 11/2016 | Ching | H01L 27/0924 |
| 2016/0322477 A1* | 11/2016 | Huang | H01L 29/785 |
| 2016/0379982 A1* | 12/2016 | You | H01L 29/0657 257/369 |
| 2017/0005002 A1* | 1/2017 | Ching | H01L 21/823412 |
| 2017/0005005 A1* | 1/2017 | Chen | H01L 21/823437 |
| 2017/0005195 A1* | 1/2017 | Ching | H01L 29/7848 |
| 2017/0025313 A1* | 1/2017 | Ching | H01L 21/823807 |
| 2017/0033194 A1* | 2/2017 | Chen | H01L 29/6681 |
| 2017/0047432 A1* | 2/2017 | Ching | H01L 29/785 |
| 2017/0053912 A1* | 2/2017 | Ching | H01L 27/0886 |
| 2017/0053915 A1* | 2/2017 | Ando | H01L 27/0924 |
| 2017/0077309 A1* | 3/2017 | Risaki | H01L 29/42344 |
| 2017/0084501 A1* | 3/2017 | Bedell | H01L 21/845 |
| 2017/0084746 A1* | 3/2017 | Lee | H01L 29/16 |
| 2017/0104087 A1* | 4/2017 | Chang | H01L 29/66795 |
| 2017/0110374 A1* | 4/2017 | Xu | H01L 21/823431 |
| 2017/0125304 A1* | 5/2017 | Wang | H01L 21/823821 |
| 2017/0125307 A1* | 5/2017 | Lee | H01L 21/823878 |
| 2017/0125413 A1* | 5/2017 | Wu | H01L 21/26513 |
| 2017/0125592 A1* | 5/2017 | Ching | H01L 29/7849 |
| 2017/0133508 A1* | 5/2017 | Ching | H01L 29/7851 |
| 2017/0140980 A1* | 5/2017 | Chiang | H01L 21/2636 |
| 2017/0140996 A1* | 5/2017 | Lin | H01L 21/823821 |
| 2017/0141112 A1* | 5/2017 | Ching | H01L 27/0924 |
| 2017/0141189 A1* | 5/2017 | Chang | H01L 29/1083 |
| 2017/0141215 A1* | 5/2017 | Ching | H01L 29/66795 |
| 2017/0154820 A1* | 6/2017 | Lee | H01L 21/823412 |
| 2017/0154958 A1* | 6/2017 | Fung | H01L 29/0673 |
| 2017/0154973 A1* | 6/2017 | Ching | H01L 29/41791 |
| 2017/0207126 A1* | 7/2017 | Ching | H01L 21/823431 |
| 2017/0221765 A1* | 8/2017 | Ching | H01L 21/3065 |
| 2017/0278865 A1* | 9/2017 | Ching | H01L 27/11807 |
| 2017/0278970 A1* | 9/2017 | Ching | H01L 29/7851 |
| 2017/0309629 A1* | 10/2017 | Ching | H01L 29/42392 |
| 2017/0317109 A1* | 11/2017 | Wang | H01L 27/1211 |

\* cited by examiner

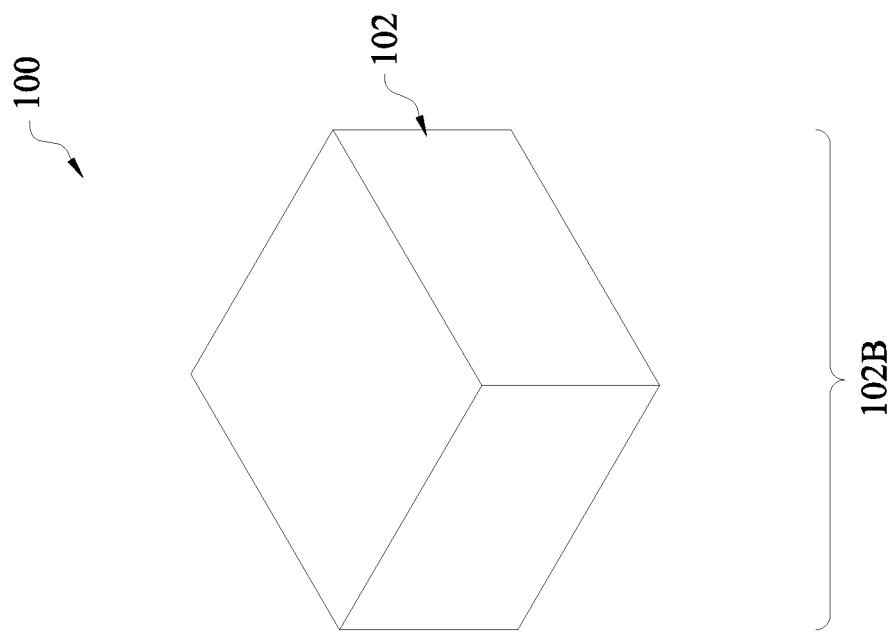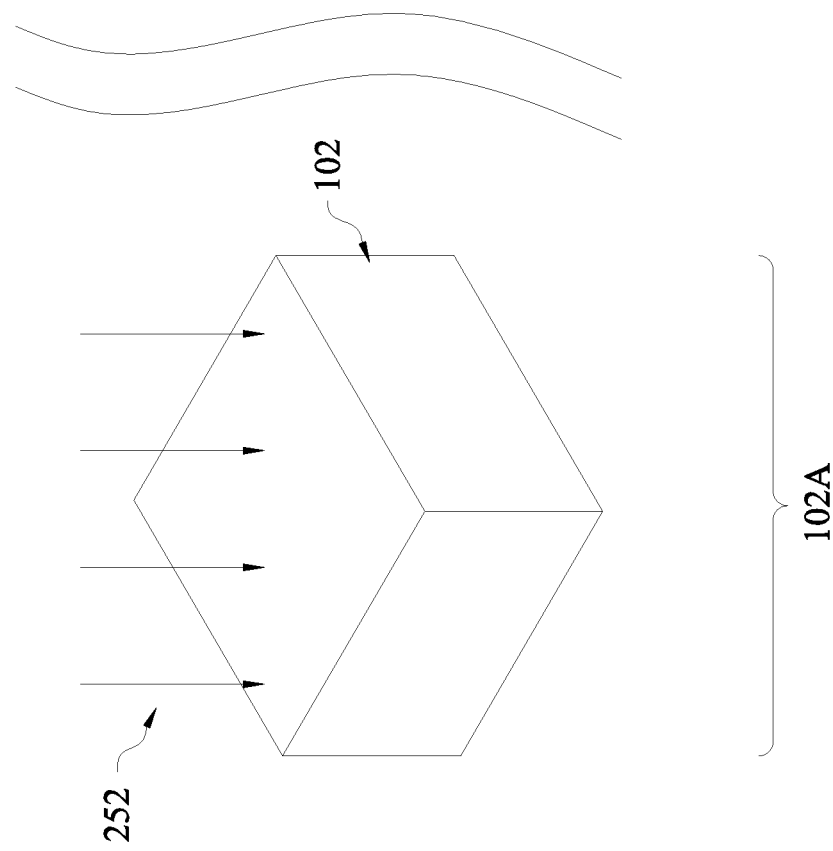
Fig. 3

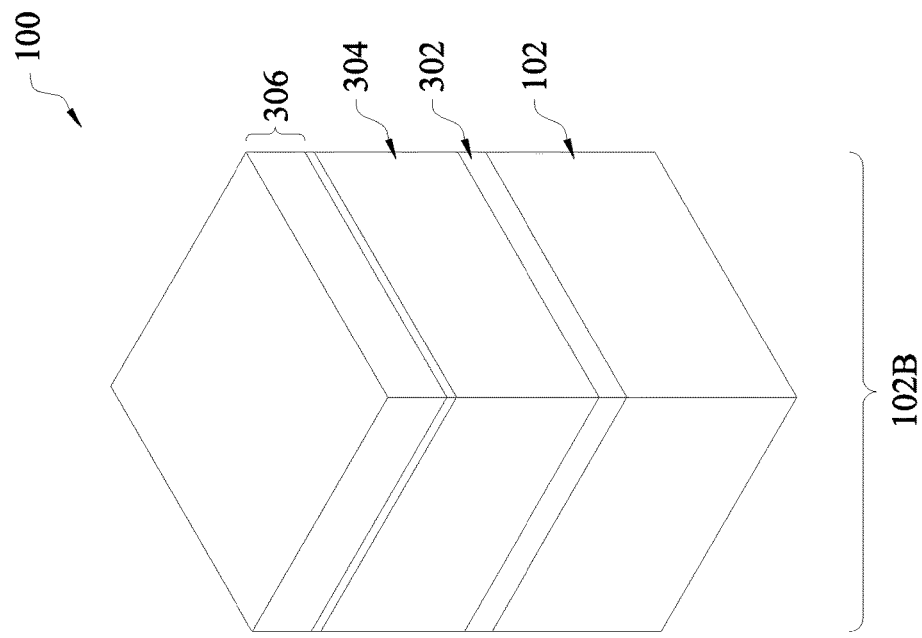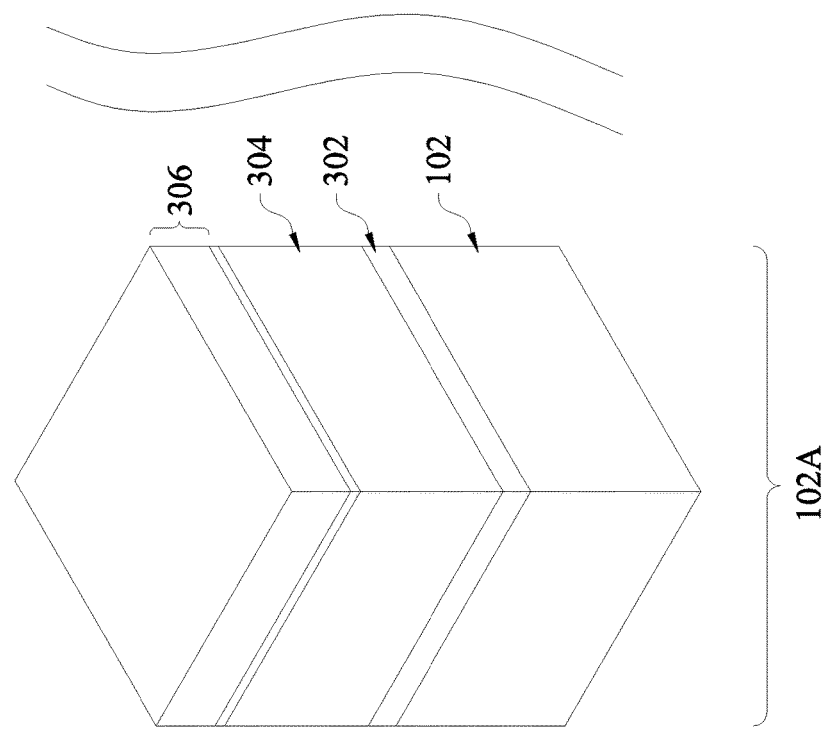
Fig. 4

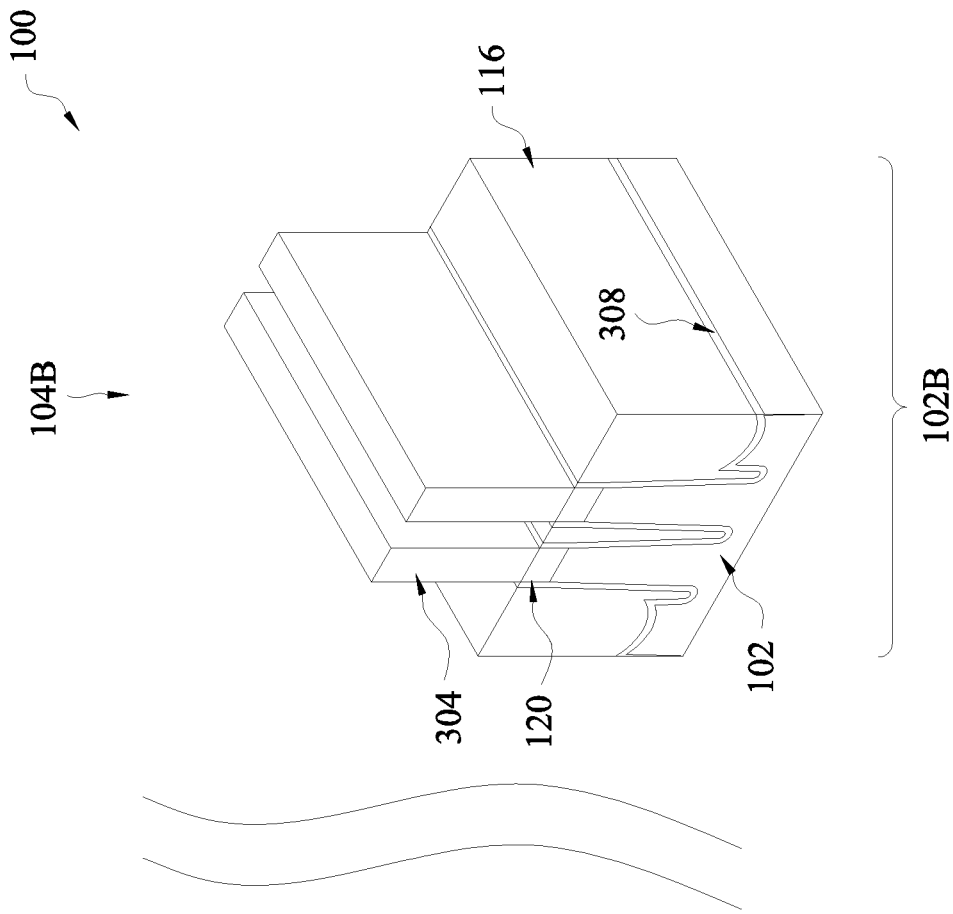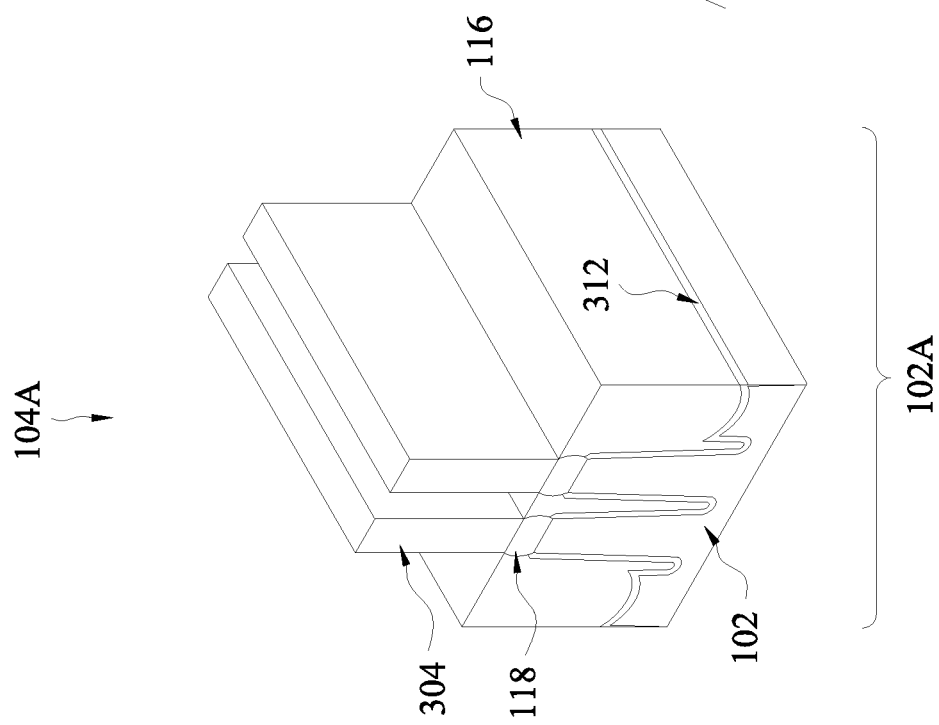
Fig. 11

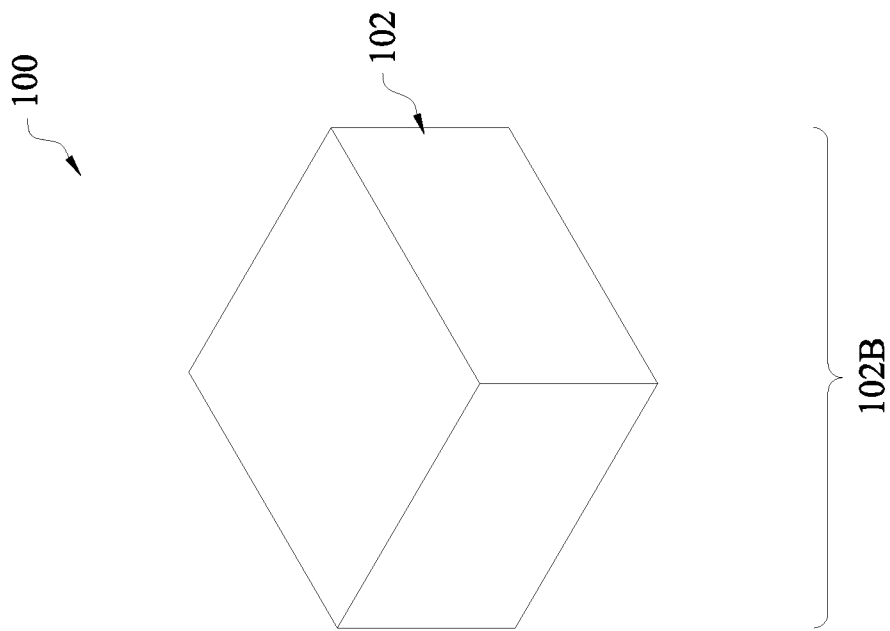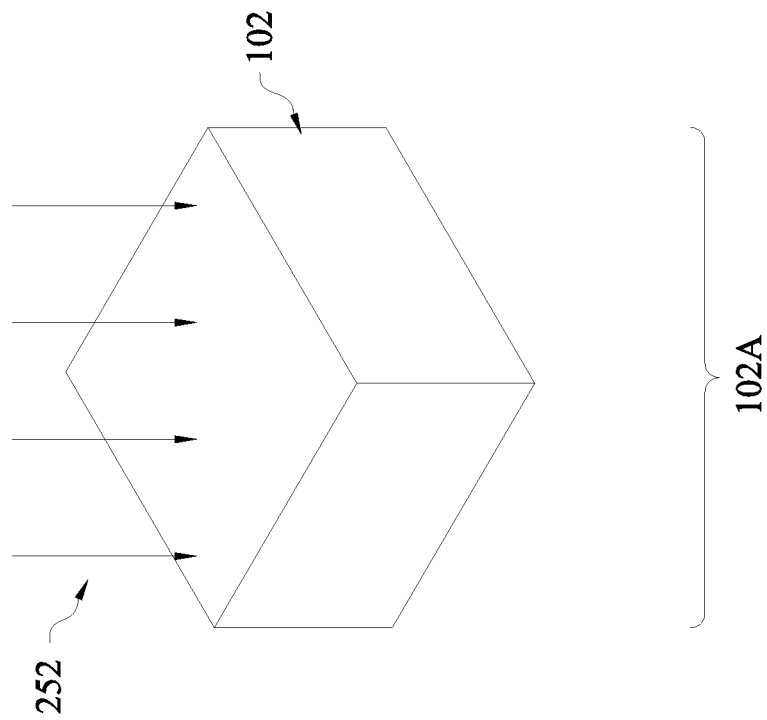
Fig. 20

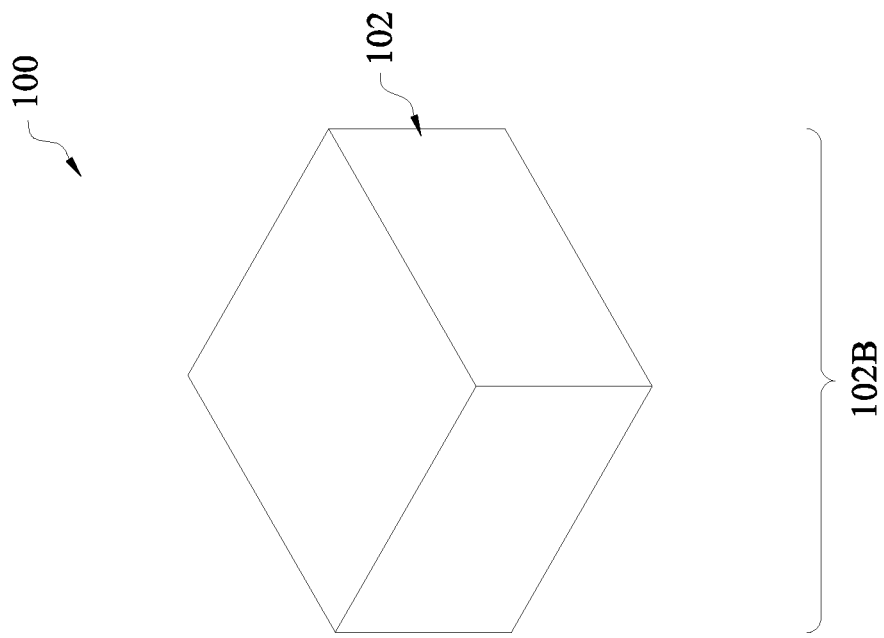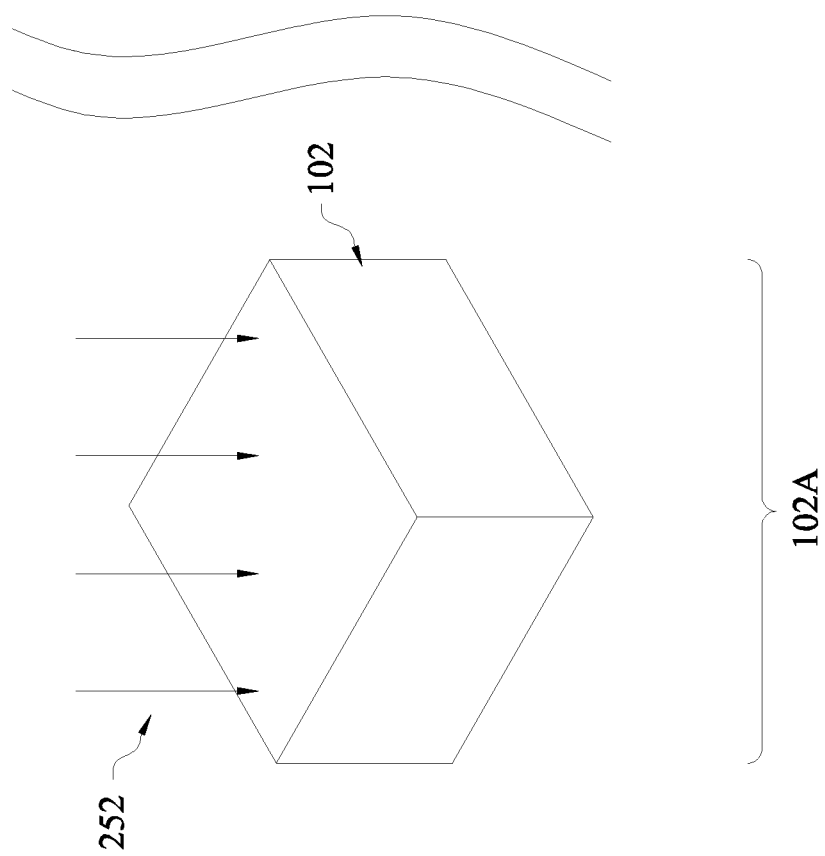
Fig. 37

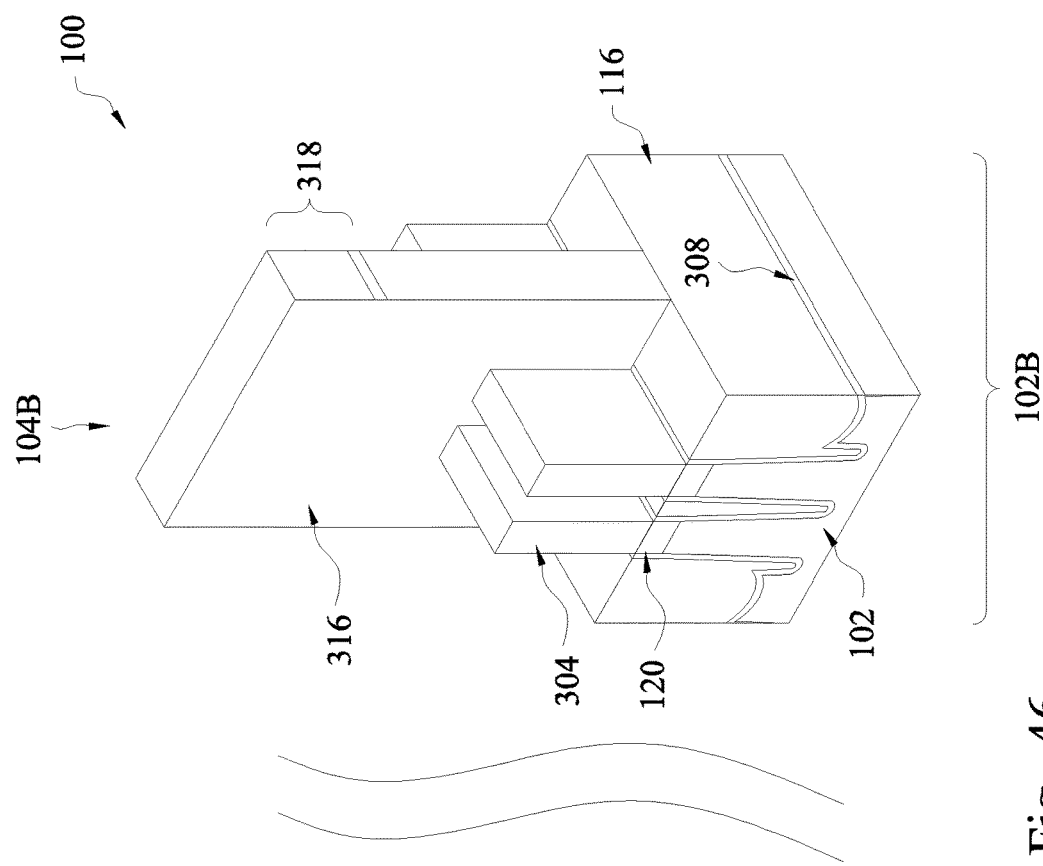
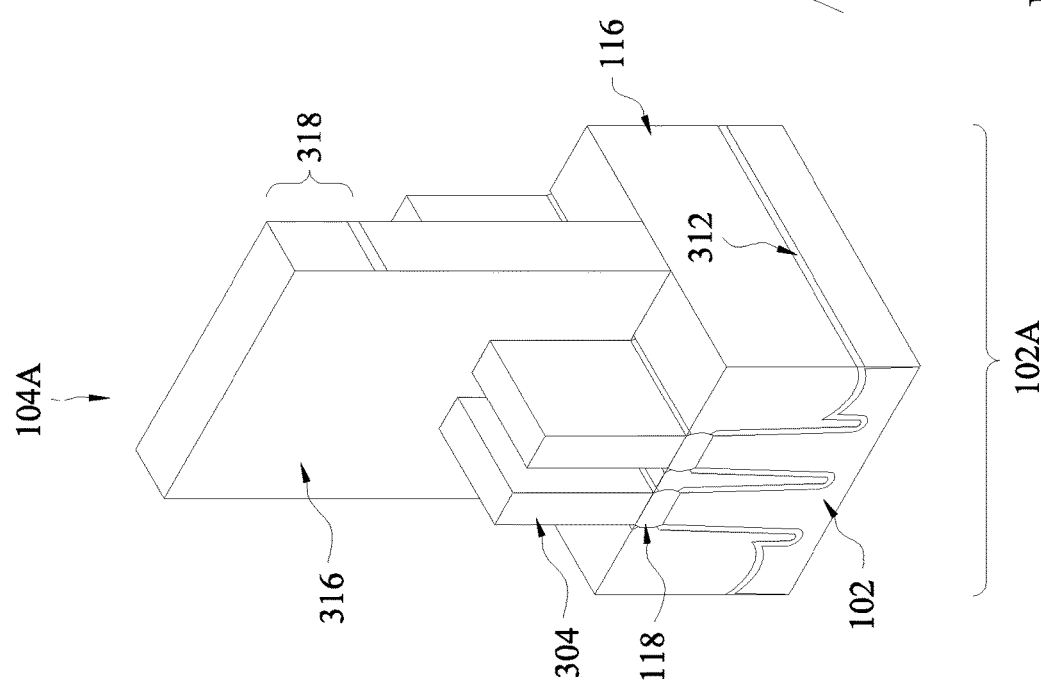
Fig. 46

INTEGRATED CIRCUIT STRUCTURE WITH SUBSTRATE ISOLATION AND UN-DOPED CHANNEL

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized. Similar developments in IC processing and manufacturing are needed. For example, a three dimensional transistor, such as a fin-like field-effect transistor (FinFET), has been introduced to replace a planar transistor. A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, because of the complexity inherent in FinFETs and other nonplanar devices, a number of techniques used in manufacturing planar transistors are not well suited to fabricating nonplanar devices. As merely one example, conventional techniques for forming FinFETs may produce undesirable epitaxy growth degradation and induce epitaxy growth related defects and voids in the regions for other devices, such as bipolar junction transistors (BJTs), diodes or passive devices, such as pickup features. Therefore, while existing fabrication techniques have been generally adequate for planar devices, in order to continue to meet ever-increasing design requirements, further advances are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11, 12, 13, 14, 15, 16, 17 and 18 are perspective views of a semiconductor structure at various fabrication stages, constructed in accordance with some embodiments.

FIGS. 20, 21, 22, 23, 24, 25, 26, 27, 28, 29, 30, 31, 32, 33, 34 and 35 are perspective views of a semiconductor structure at various fabrication stages, constructed in accordance with some embodiments.

FIGS. 37, 38, 39, 40, 41, 42, 43, 44, 45, 46, 47, 48, 49, 50, 51, 52, 53, 54 and 55 are perspective views of a semiconductor structure at various fabrication stages, constructed in accordance with some embodiments.

DETAILED DESCRIPTION

Figure 1:
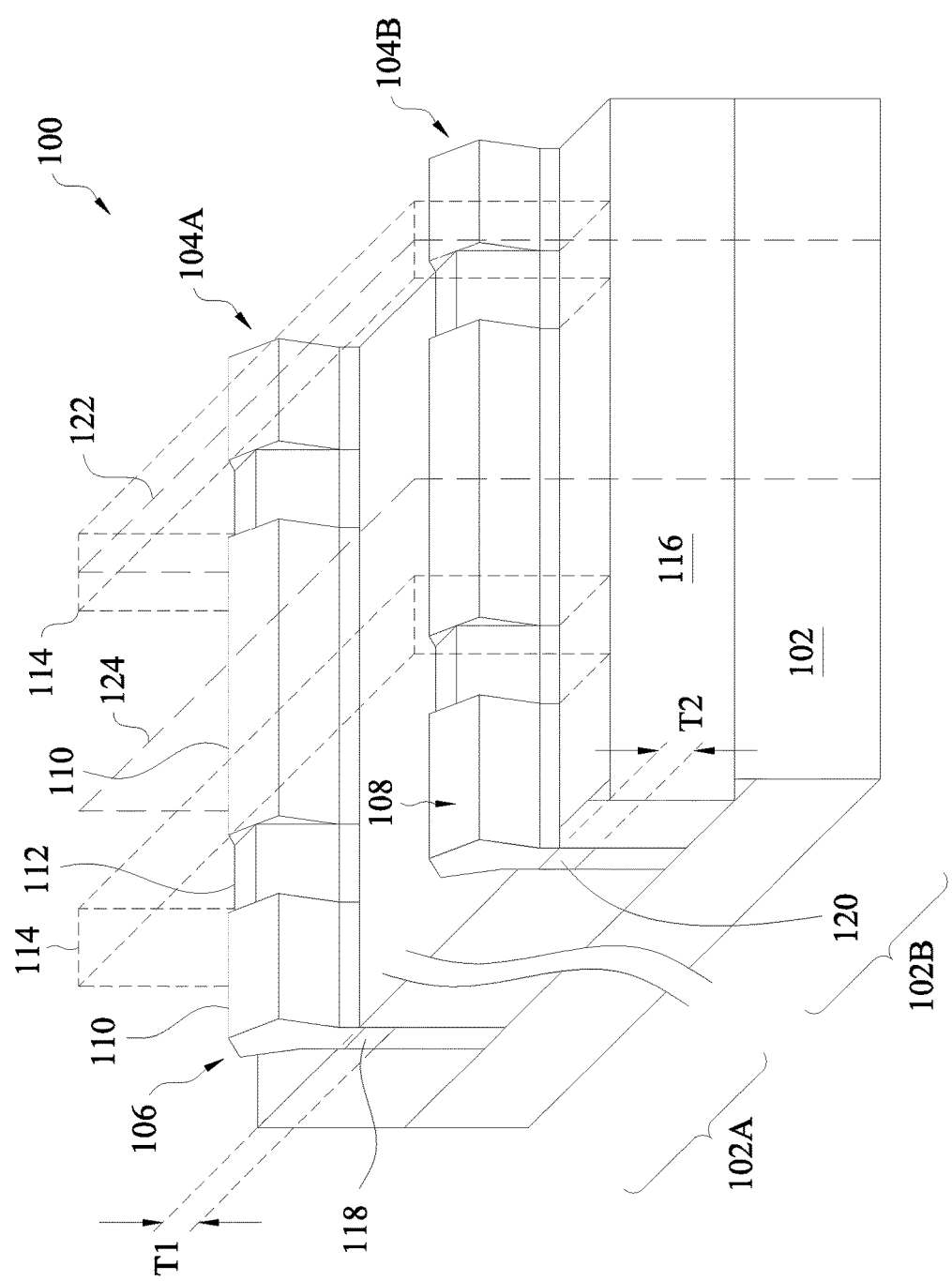
FIG. 1 is a perspective view of a semiconductor structure, constructed in accordance with some embodiments.

The present disclosure relates generally to IC device manufacturing and, more particularly, to an insulating layer that isolates a FinFET from a substrate upon which it is formed and to tuning the channel strain generated by the insulating layer to suit the channel type of the FinFET.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 or wafer having a first region 102A and a second region 102B. In the present embodiments, the first region 102 is designed for core devices, such as one or more field-effect transistor (FET), particularly one or more fin-like FET (FinFET). The second region 102B is designed to form non-core devices, such as a diode, a contact pickup, a bipolar junction transistor, and a combination thereof.

The workpiece 100 includes a fin-like structure 104 formed on the substrate 102. The fin-like structure 104 has raised active regions (fin features). As illustrated in FIG. 1, the workpiece 100 includes a first fin feature 104A formed in the first region 102A and a second fin feature 104B formed in the second region 102. In some embodiments, the first fin feature 104A includes one or more FinFET, further embodiments include other raised active and passive devices formed upon the substrate 102 within the first region 102A. In some embodiments, the illustrated first fin feature 104A includes FinFETs 106, such as an n-channel (NMOS) FinFET, a p-channel (PMOS) FinFET, or both. In turn, each of FinFETs includes a pair of opposing source/drain regions (or source/drain features) 110, which may include various doped semiconductor materials, and a channel region 112 disposed between the source/drain regions 110. The flow of carriers (electrons for the n-channel device and holes for the p-channel device) through the channel region 112 is controlled by a voltage applied to a gate stack 114 adjacent to and overwrapping the channel region 112. The gate stack 114 is shown as translucent to better illustrate the underlying channel region 112. In the illustrated embodiment, the channel region 112 rises above the plane of the substrate 102 upon which it is formed, and accordingly, the fin structure 104 may be referred to as a "nonplanar" device. The raised channel region 112 provides a larger surface area proximate to the gate stack 114 than comparable planar devices. This strengthens the electromagnetic field interactions between the gate stack 114 and the channel region 112, which may reduce threshold voltage, leakage and short channel effects associated with smaller devices. Thus in many embodiments, FinFETS and other nonplanar devices deliver better performance in a smaller footprint than their planar counterparts.

As described in more detail below, the fin structure 104 are formed on a semiconductor substrate 102. To electrically isolate the corresponding FinFETs 106 from the semiconductor substrate 102, the fin structure 104 are separated by isolation features 116 (such as shallow trench isolation or STI features) horizontally and buried isolation feature 118 vertically. In various embodiments, the methods and structures of the present disclosure provides a buried isolation feature 118 for FinFETs. The buried isolation feature 118 includes semiconductor oxide material to electrically separate the active regions from the substrate, thereby reducing or eliminating the punch-through effect and enhancing the device performance.

In the second region 102B, formed on the second fin feature 104B are one or more non-core devices 108, such as a diode, a contact pickup, a bipolar junction transistor, and a combination thereof. The second fin feature 104B is isolated from adjacent fin features and the devices formed on the adjacent fin features by the STI features 116 horizontally. However, the fin feature 104B is isolated from the substrate 102 vertically. The fin feature 104B is formed on a semiconductor feature 120. In the present embodiment, the semiconductor feature 120 is made of a semiconductor material while the buried isolation feature 118 is a made of dielectric material having oxide of the semiconductor material.

In the present embodiment, the first fin feature 104A includes the buried isolation semiconductor feature 118 while the second feature 104B includes the semiconductor feature 120. The substrate 102 includes a first semiconductor material; the semiconductor feature 120 includes a second semiconductor material; and the first and second fin features include a third semiconductor material. The buried isolation feature 118 includes an oxide of the second semiconductor material. The second semiconductor material is different from the third semiconductor material in composition. In some embodiments, the second semiconductor material is different from the first semiconductor material in composition. For example, the first and third semiconductor materials include silicon. In the present embodiment, the second semiconductor material is a compound semiconductor material, such as silicon germanium. In furtherance of the embodiment, the semiconductor feature 120 includes silicon germanium; and the buried isolation feature 118 includes silicon germanium oxide.

The buried isolation feature 118 is formed from a semiconductor material of the second semiconductor material by a selective oxidation process that is tuned to oxidize the second semiconductor material but not oxidize the third semiconductor material. Especially, the buried isolation feature 118 is converted from a portion of a semiconductor layer of the second semiconductor material that forms the semiconductor feature 120. The buried isolation feature 118 has a first thickness T1 and the semiconductor feature 120 has a second thickness T2 different from the first thickness T1. In the present embodiment, the second thickness T2 is less than the first thickness T1. In furtherance of the embodiment, the first thickness T1 is about twice of the second thickness T2, within a variation less than 30%, or preferably less than 10%. The 30% variation is defined as $|T1/T2-2|\leq 0.3$. In some embodiments, the first thickness T1 ranges from 10 nm to 30 nm and the second thickness T2 ranges from 5 nm to 15 nm.

In some embodiments, the structure and the method of the present disclosure provides the channel regions 112 that is un-doped and has higher carrier mobility and further enhanced device performance, such as increased device speed. In some other embodiments, the channel region 112 may be alternatively doped with proper types of dopants, such as a p-type dopant for an nFET or an n-type dopant for a pFET.

Figure 2:
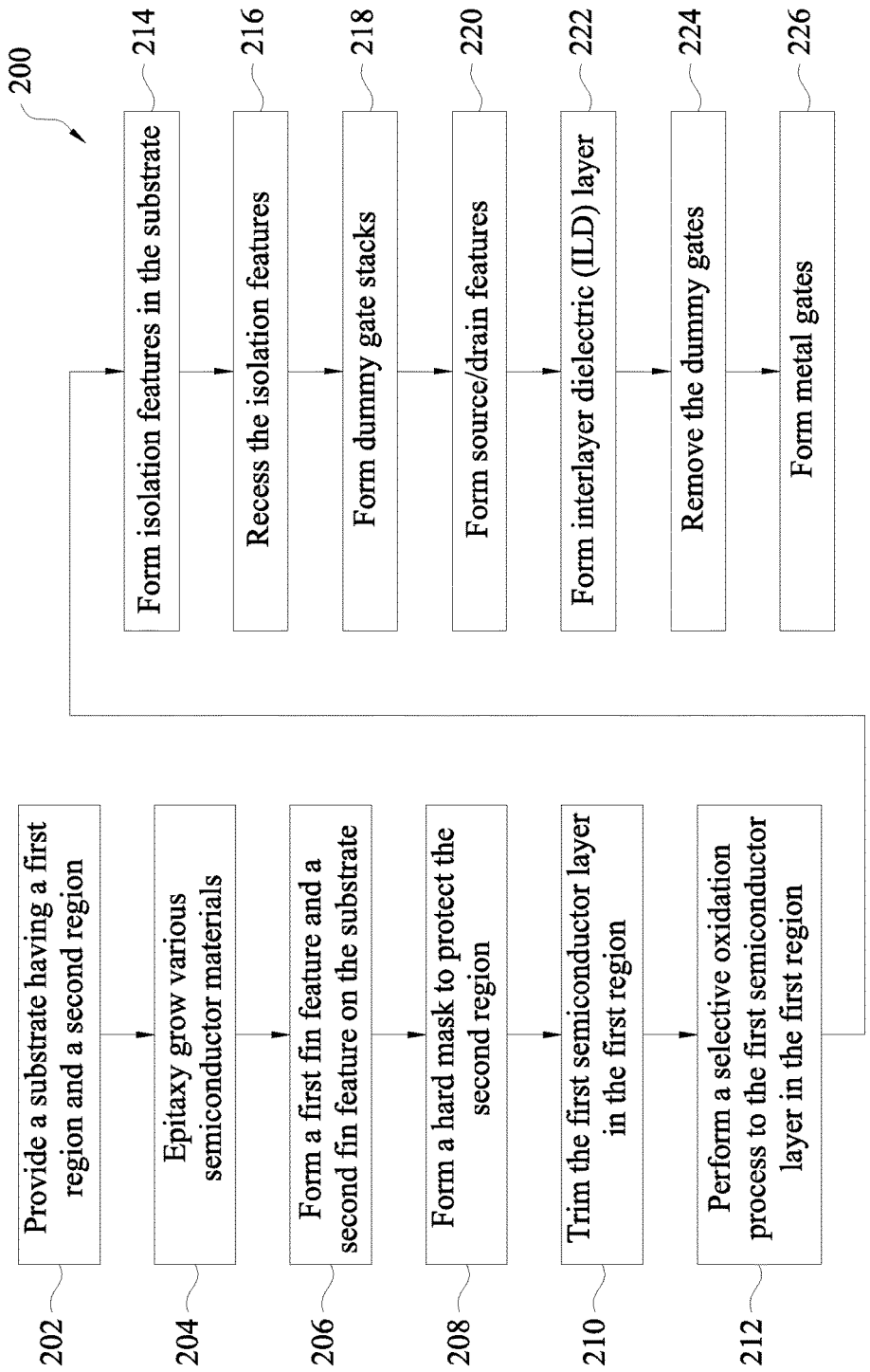
FIG. 2 is a flowchart of an integrated circuit fabrication method in accordance with some embodiments.

Exemplary methods of forming the workpiece 100 having a FinFET device 106 and a non-core device 108 will now be described with reference to FIGS. 2-18 and 18A. FIG. 2 is a flowchart of a method 200 for fabricating a FinFET or other fin-based device on a workpiece 100 according to various aspects of the present disclosure. The figures that follow refer perspective views of the workpiece 100, and/or cross-sections taken through the channel region 112 (e.g., along plane 122) or through the source/drain regions 110 (e.g., along plane 124) of the FinFET device 106.

The method 200 and the structure of the workpiece 100 are collectively described according to various aspects of the present disclosure. It is understood that additional steps can be provided before, during, and after the method 200 and that some of the steps described can be replaced or eliminated for other embodiments of the method.

Referring first to block 202 of FIG. 2 and to FIG. 3, a workpiece 100 is received a substrate 102 having the first region 102A and the second region 102B. Suitable substrates 102 include a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The received workpiece 100 may have one or more dopants already introduced upon it. In the illustrated embodiment, the workpiece 100 includes an anti-punch-through (APT) dopant introduced to the substrate 102 within the first region 102A by an ion implantation process 252. The ion implantation process 252 is designed to introduce a proper type of dopant into the corresponding channel regions, such as p-type dopant for an nFET or n-type dopant for a pFET. In some embodiments, the APT ion implantation process 252 includes forming a first mask by lithography patterning and performing an n-type ion implantation selectively to the pFET using the first mask as an implantation mask. The APT ion implantation process 252 may further include forming a second mask by lithography patterning and performing a p-type ion implantation selectively to the nFET using the second mask as an implantation mask. The first and second masks are patterned to protect the nFET region and the pFET region from the corresponding ion implantation, respectively.

Referring FIG. 2 and to FIG. 4, the method 200 includes an operation 204 by epitzxy grow various semiconductor material layers on the substrate 102. In the illustrated embodiment, a first semiconductor layer 302 formed on the substrate 102 and a second semiconductor layer 304 formed on the first semiconductor layer 302. The first semiconductor layer 302 includes a first semiconductor material and the second semiconductor layer 304 includes a second semiconductor material different from the first semiconductor material. The first and second semiconductor layers epitaxially grown by suitable techniques, such as selective epitaxy growth (SEG).

The first semiconductor layer 302 may include a compound semiconductor formed on and physically contacting an elementary semiconductor of the substrate 102. In the present embodiment, the substrate 102 is a silicon substrate, the first semiconductor material is silicon germanium (SiGe) and the second semiconductor material is silicon. In some embodiments, the first semiconductor layer 302 includes SiGe with a Ge concentration of between about 10 atomic percent and about 35 atomic percent. Accordingly, the first semiconductor layer 302 may have an intermediate Ge concentration such as between about 10 atomic percent and about 35 atomic percent without introducing significant dislocation defects. In further embodiments, the first semiconductor layer 302 has a Ge gradient such that a portion of the semiconductor layer 302 closest to and contacting the substrate 102 has a Ge concentration between about 10 atomic percent and about 35 atomic percent, while a portion of the first semiconductor layer 302 furthest from the substrate 102 has a Ge concentration of about 60 atomic percent.

The first semiconductor layer 302 may be formed by suitable techniques. In some embodiments, the first semiconductor layer 302 may be formed on the substrate 102 by any suitable process to epitaxially grow the first semiconductor layer 302. Suitable deposition processes include atomic layer deposition (ALD), chemical vapor deposition (CVD), high-density plasma CVD (HDP-CVD), physical vapor deposition (PVD) and/or other suitable deposition processes. Any of these techniques may be used to grow a semiconductor layer 302 having any composition including a graduated composition. For example, in an exemplary epitaxial growth process, the concentration of a Ge-containing reaction gas (e.g., $GeH_4$) is varied over time as the first semiconductor layer 302 grows to deposit a first semiconductor layer 302 with a Ge gradient. The first semiconductor layer 302 may be formed to any suitable thickness, and in various embodiments, ranges in thickness from about 10 nm to about 30 nm.

In the illustrated embodiment, the second semiconductor layer 304 is formed on and contacting the first semiconductor layer 302. The second semiconductor layer 304 is processed to form the core of the fin structure 104 as described below. As such, the second semiconductor layer 304 may include any suitable elementary or compound semiconductor, and in an exemplary embodiment, includes an elementary silicon semiconductor. Similar to the first semiconductor layer, the second semiconductor layer 304 may be epitaxially grown by ALD, CVD, HDP-CVD, PVD, and/or other suitable deposition processes.

In some embodiments, the second semiconductor layer 304 is formed without doping, therefore also referred to as un-doped semiconductor layer. For example, during the deposition, the precursor does not include dopant-containing chemical. In furtherance of the example, no further ion implantation is implemented to eliminate introduce dopant to the second semiconductor layer 304. In this embodiment, the formed channel region is un-doped and has fewer defects. In some embodiments, the second semiconductor layer 304 is grown with in-situ doping, which eliminates the implantation damages. Alternatively, the dopants are introduced to the second semiconductor layer 304 by ion implantation or diffusion. The ion implantations may be selectively applied to different portions of the substrate for different types of dopants. For example, a first ion implantation process of a p-type dopant is applied to first portions of the substrate for nMOS channels using a first mask to protect second portions for pMOS channels; and then a second ion implantation process of an n-type dopant is applied to the second portions of the substrate for pMOS channels using a second mask to protect the first portions for nMOS channels.

To facilitate fabrication and to avoid damage to the semiconductor layer 304, one or more hard mask layers 306 may be formed on the semiconductor layer 304. The hard mask layers 306 include a dielectric such as a semiconductor oxide, a semiconductor nitride, a semiconductor oxynitride, and/or a semiconductor carbide, and in an exemplary embodiment, the hard mask layers 306 include a silicon oxide layer and a silicon nitride layer. The hard mask layers 306 may be formed by thermal growth, ALD, chemical vapor deposition (CVD), high-density plasma CVD (HDP-CVD), physical vapor deposition (PVD), and/or other suitable deposition processes.

Figure 5:
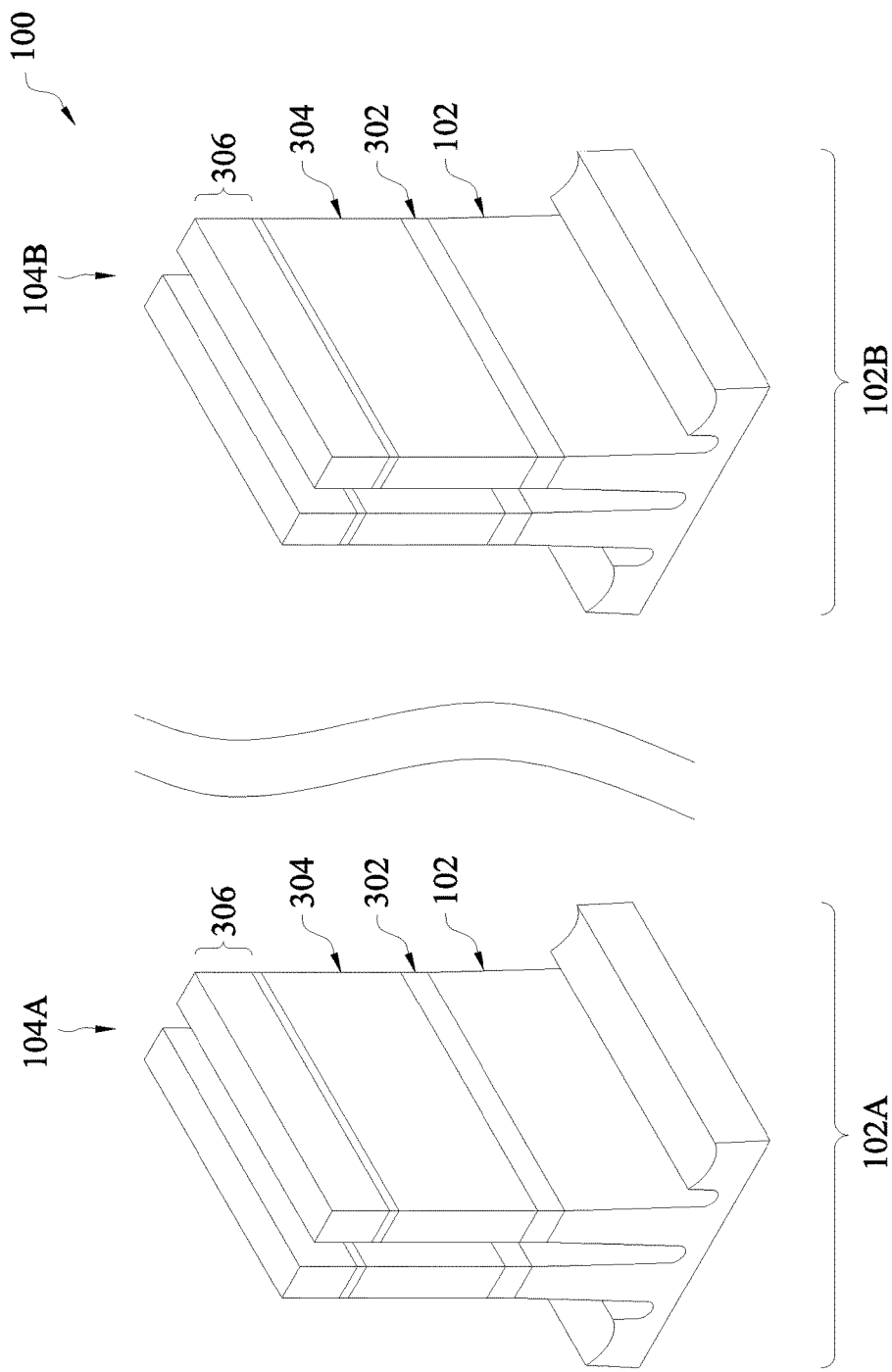

Referring to FIGS. 2 and 5, the method 200 includes an operation 206 by forming the fin structure 104 on the substrate, particularly forming the fin structure having the first fin feature 104A in the first region 102A and the second fin feature 104B in the second region 102B. In the present embodiment for illustration, two exemplary fin features 104A are formed in the first region 102A and two exemplary fin features 104B are formed in the second region 102B.

A photoresist layer (or resist) used to define fin structure 104 in later operations of the method 200 may be formed on the hard mask layers 306. An exemplary resist layer includes a photosensitive material that causes the layer to undergo a property change when exposed to light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the fin structure 104 by the lithography process. After patterning the resist, an etching process is performed on the workpiece 100 to open the hard mask layers 306, thereby transferring the pattern from the resist layer to the hard mask layer 306. The remaining resist layer may be removed after the patterning the hard mask layer 306. An exemplary lithography process includes spin-on coating a resist layer, soft baking of the resist layer, mask aligning, exposure, post-exposure baking, developing the resist layer, rinsing, and drying (e.g., hard baking). Alternatively, a lithographic process may be implemented, supplemented, or replaced by other methods such as maskless photolithography, electron-beam writing, ion-beam writing or molecular imprint.

After the hard mask layer is patterned, the second semiconductor layer 304 and the first semiconductor layer 302 are etched to define the fin structure 104 through openings of the patterned hard mask layer. One or more etching processes are performed on the workpiece 100 to etch the portions of the second semiconductor layer 304 and the first semiconductor layer 302 not covered by the patterned hard mask layer 306. The patterned hard mask layer 306 is used as an etch mask during the etching processes to pattern the semiconductor layers.

The etching processes may include any suitable etching technique such as dry etching, wet etching, and/or other etching methods (e.g., reactive ion etching (RIE)). In some embodiments, etching includes multiple etching steps with different etching chemistries, each targeting a particular material of the workpiece 100. For examples, in an embodiment, the silicon oxide film in the hard mask layer may be etched by a diluted hydrofluorine solution and the silicon nitride film in the hard mask layer may be etched by a phosphoric acid solution. In other embodiment, the first and second semiconductor layers are etched by a dry etching process using a fluorine-based etchant.

The etching processes are designed to produce fin structure 104 of any suitable height and width extending above the reminder of the first semiconductor layer 302. In addition to defining the fin structure 104, the etching in the operation 206 also defines one or more isolation feature trenches between the raised active regions of the fin structure 104.

In the present embodiment, the etching operation 206 is also applied to the substrate 102 and is controlled such that the substrate 102 is partially etched, as illustrated in FIG. 5. This may be achieved by controlling etching time relative to the expected trench depth and fin height or by controlling other etching parameter(s). After the etching processes, the fin structure 104 (that includes the first fin feature 104A and the second fin feature 104B) is formed and extended from the second semiconductor material layer 304 to the first semiconductor material layer 302.

Figure 6:
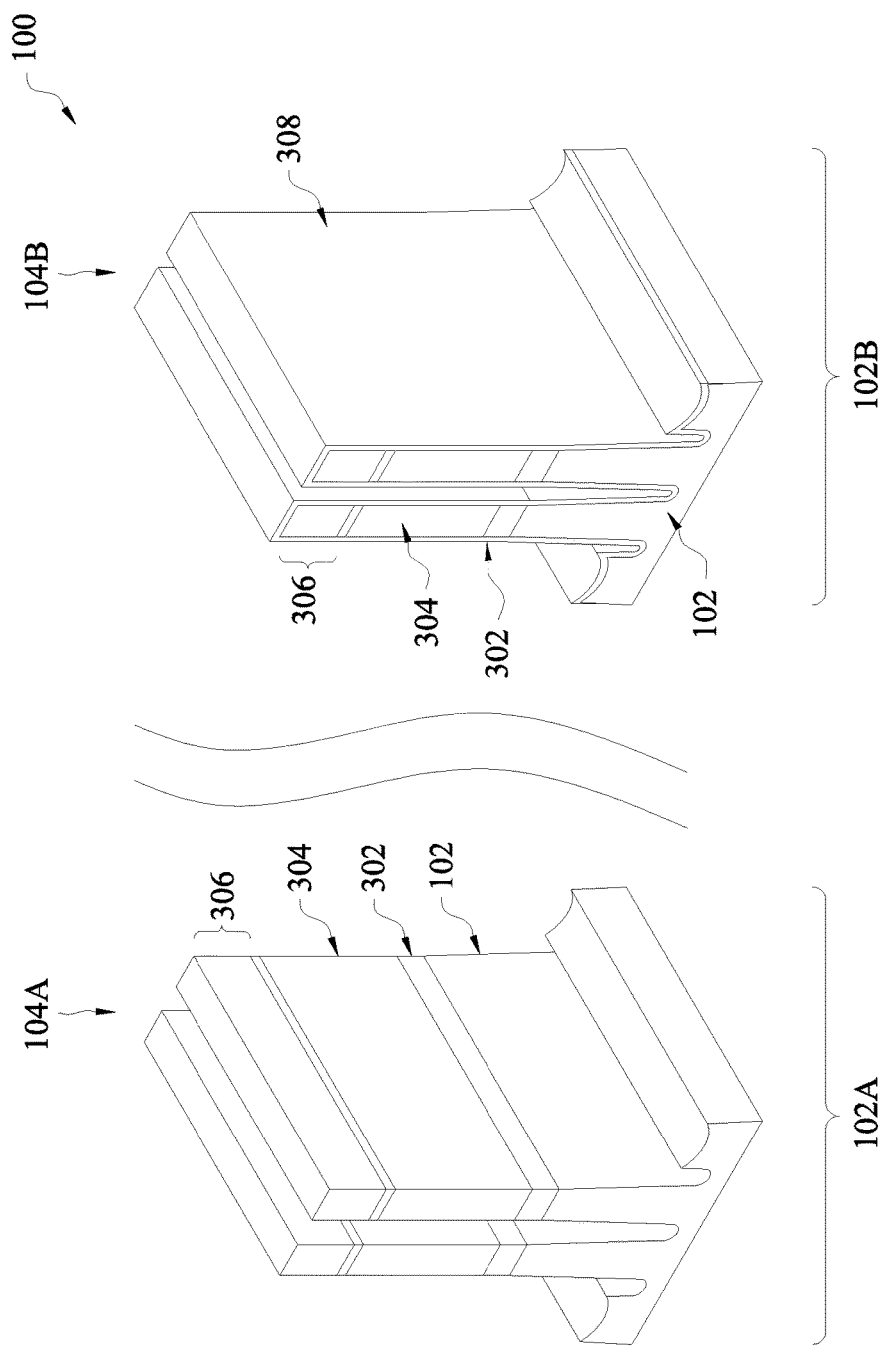

Referring to FIG. 2 and to FIG. 6, the method 200 proceeds to an operation 208 by forming a liner (or second hard mask) 308 to protect the second region 102B. The formation of the hard mask 308 includes deposition and patterning, which is similar to the formation of the hard mask 306. However, the hard mask 306 is a planar layer while the hard mask 308 is three dimensional. The hard mask 308 is patterned to cover the second region 102B and has an opening to expose the first region 102A. In the second region 102B, the hard mask 308 is conformal to the fin feature 104B such that the sidewalls of the second fin feature 104B are also covered thereby.

The hard mask 308 is capable of protecting the second fin feature 104B from subsequent oxidation. The hard mask 308 may include any suitable dielectric material, and an exemplary liner 308 includes a silicon nitride. The hard mask 308 may be different from the hard mask 306 in term of composition in order to provide etch selectivity. For example, the hard mask 306 includes silicon nitride and the hard mask 308 includes silicon oxide or silicon carbide. The hard mask 308 may be deposited by CVD. In some examples, the deposition of silicon nitride includes a CVD process with a precursor having hexachlorodisilane ($Si_2Cl_6$), dichlorosilane ($SiH_2Cl_2$), bis(tertiary-butylamino) Silane ($C_8H_{22}N_2Si$), and disilane ($Si_2H_6$), or a combination thereof.

Figure 7:
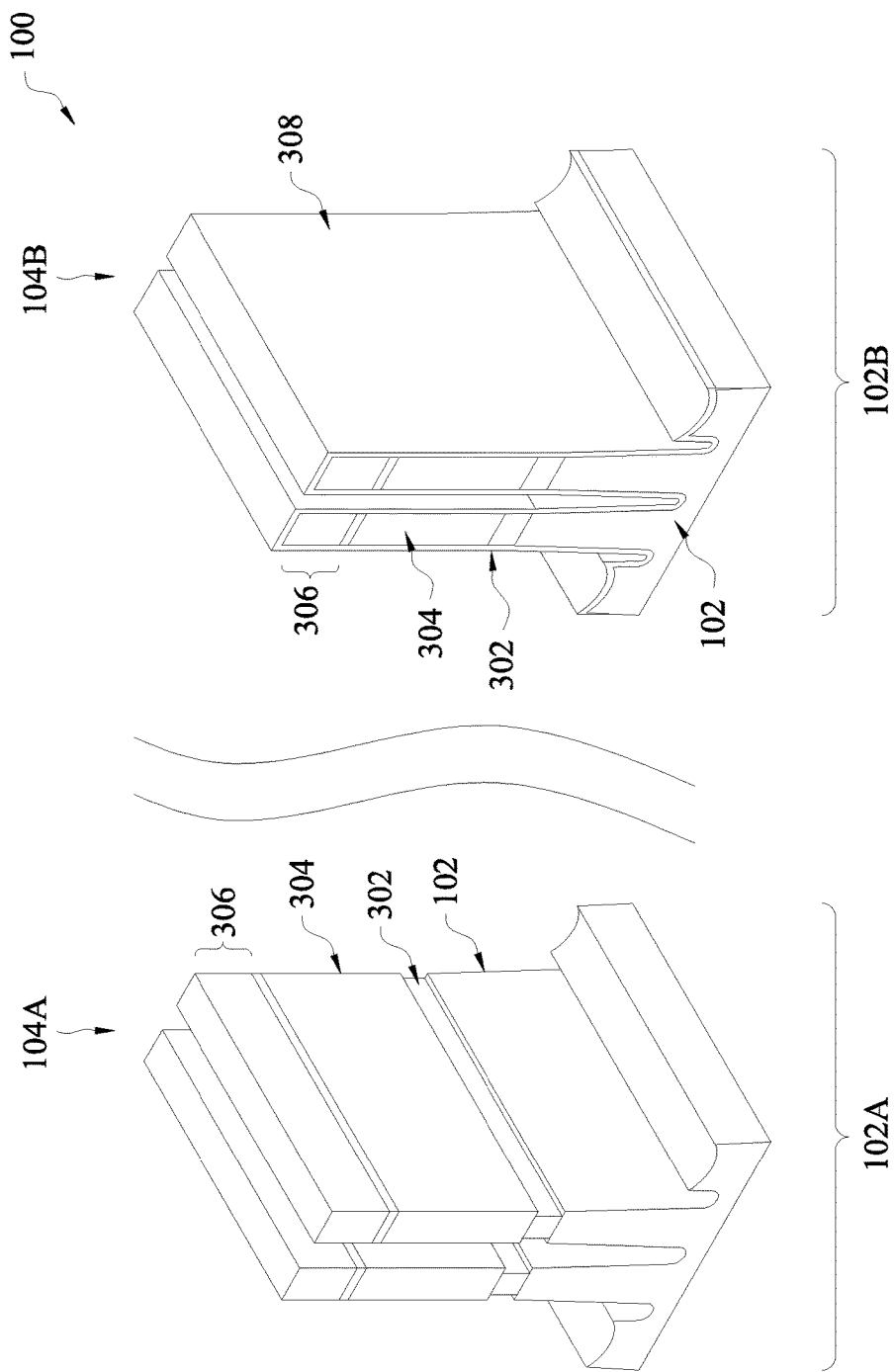

Referring to FIG. 2 and to FIG. 7, the method 200 may proceed to an operation 210 by trimming the first semiconductor layer 302 in the first region 102A, thereby the first semiconductor layer 302 in the first region 102A is recessed horizontal from the sidewalls of the first fin feature 104A. In the present embodiment, the recessed dimension is controlled such that the oxidized feature at later stage fits in the same space. In some embodiments, the trimming process is an etching process designed with an etchant to selectively etch the first semiconductor material of the first semiconductor layer 302 but substantially not etch the second semiconductor material of the second semiconductor layer 304. In some examples, the trimming process may include wet etch, dry etch or a combination thereof.

Figure 8:
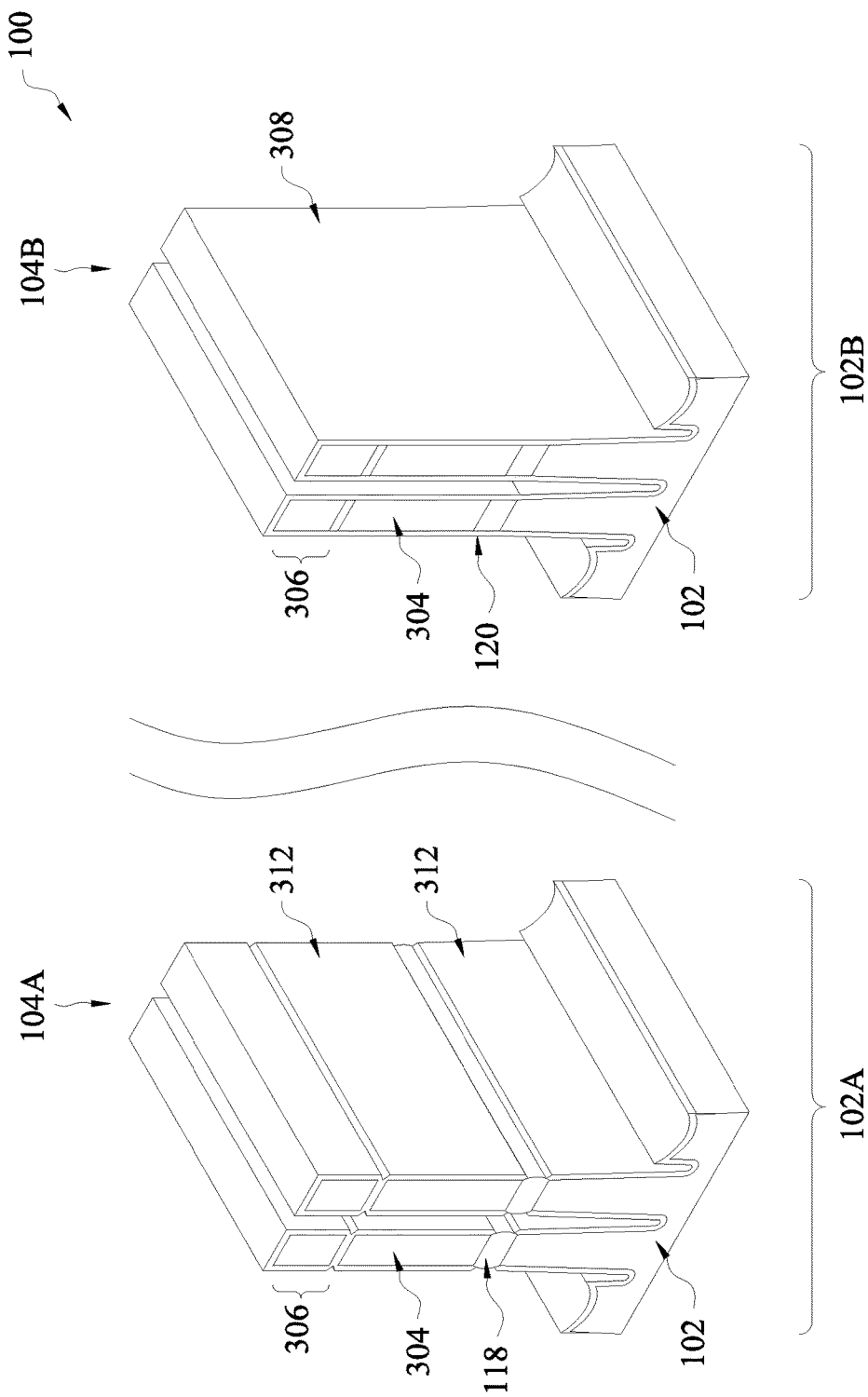

Referring to FIG. 2 and to FIG. 8, the method 200 proceeds to an operation 212 by performing a selective oxidation process to the first semiconductor layer 302 in the first region 102A. The selective oxidation process is designed to selectively oxidize the first semiconductor material of the first semiconductor layer 302 but not the second semiconductor material of the second semiconductor layer 304. In the present example, the first semiconductor material is silicon germanium and the second semiconductor material is silicon. It is found that SiGe and Si have different oxidation rates and different oxidation behaviors, such as temperature dependences. In one example, the SiGe has almost zero oxidation rate until the temperature is greater than about 400° C., and the Si has almost zero oxidation rate until the temperature is greater than about 600° C. When the oxidation temperature is tuned and chosen in the range between 400° C. and 600° C., the corresponding oxidation process is selective and substantially oxidizes SiGe but substantially does not oxidize Si. Accordingly, the first semiconductor layer 302 is converted into a dielectric material by the selective oxidation. Second, since the second region 102B is covered the patterned hard mask 308, which functions as an oxidation mask and protects the portion of the first semiconductor layer 302 within the second region from oxidation. Thus, with the selective oxidation process using the hard mask 308, the portion of the first semiconductor layer 302 in the first region 102A is converted to a dielectric layer or particularly, the dielectric feature (buried isolation feature) 118 underlying the first fin feature 104A, while the portion of the first semiconductor layer 302 in the second region 102B remains as semiconductor material or particularly, the semiconductor feature 120 underlying the second fin feature 104B.

In the present embodiment, the selective oxidation process is a thermal oxidation process. The tuning of the thermal oxidation process for selective oxidation includes tuning the oxidation such that the first semiconductor material layer 302 in the first region 102A is completely consumed and converted into oxide. In a particular example, the oxidation rate of SiGe is also a function of germanium concentration. Therefore, in various examples, the tuning of the thermal oxidation process includes adjusting the composition of the first semiconductor material layer 302 (such as germanium concentration), and the oxidation temperature. In one embodiment, the thermal oxidation process is conducted in oxygen ambient. In another embodiment, the thermal oxidation process is conducted in a combination of steam ambient and oxygen ambient. In the present example, the thermal oxidation process to the semiconductor structure 200 is performed in a $H_2O$ reaction gas with a temperature ranging from about 400° C. to about 600° C. and under a pressure ranging from about 1 atm. to about 20 atm.

It is further noted, even though the oxidation process is tuned to be selective, the oxidation rate of silicon is substantially less than that of SiGe but may not be zero. In this case, a semiconductor oxide (such as silicon oxide) layer 312 of the second semiconductor layer 304 is formed on the sidewalls of the first fin feature 104A and the sidewalls of the substrate in the first region 102A. The oxidation process is tuned such that the first semiconductor layer 302 underlying the first fin feature 104A is completely oxidized but only a thin oxide layer 312 is formed on the sidewalls of the second semiconductor layer 304. Thus formed buried isolation layer 118 provides full isolation of the first fin feature 104A from the substrate 102, thereby effectively reducing (or eliminating) the anti-punch-through effect, reducing the leakage, and enhancing the device performance. Any suitable selective oxidation process may be used to oxidize the exposed semiconductor material of the semiconductor layer 120.

Figure 9:
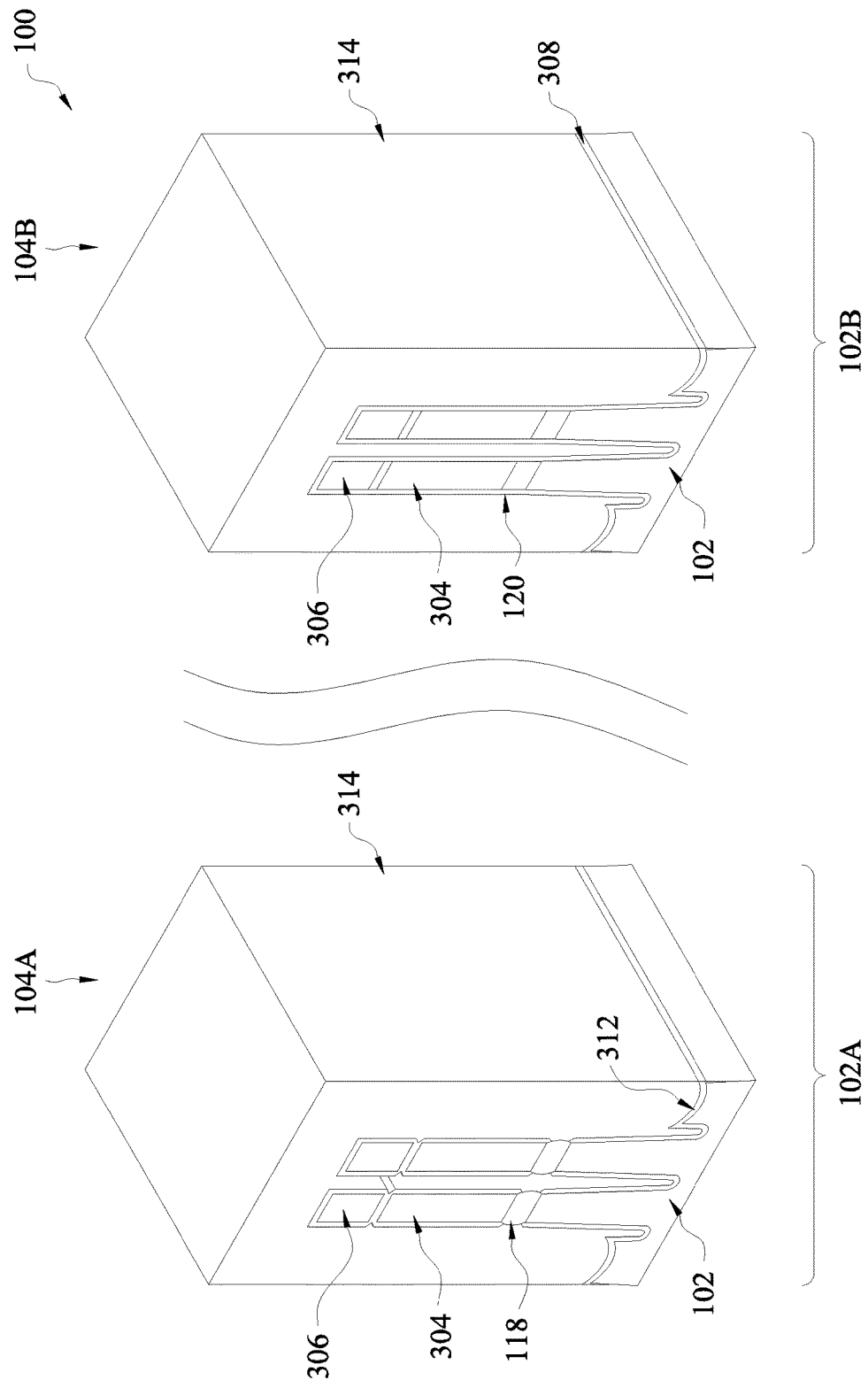
Figure 10:
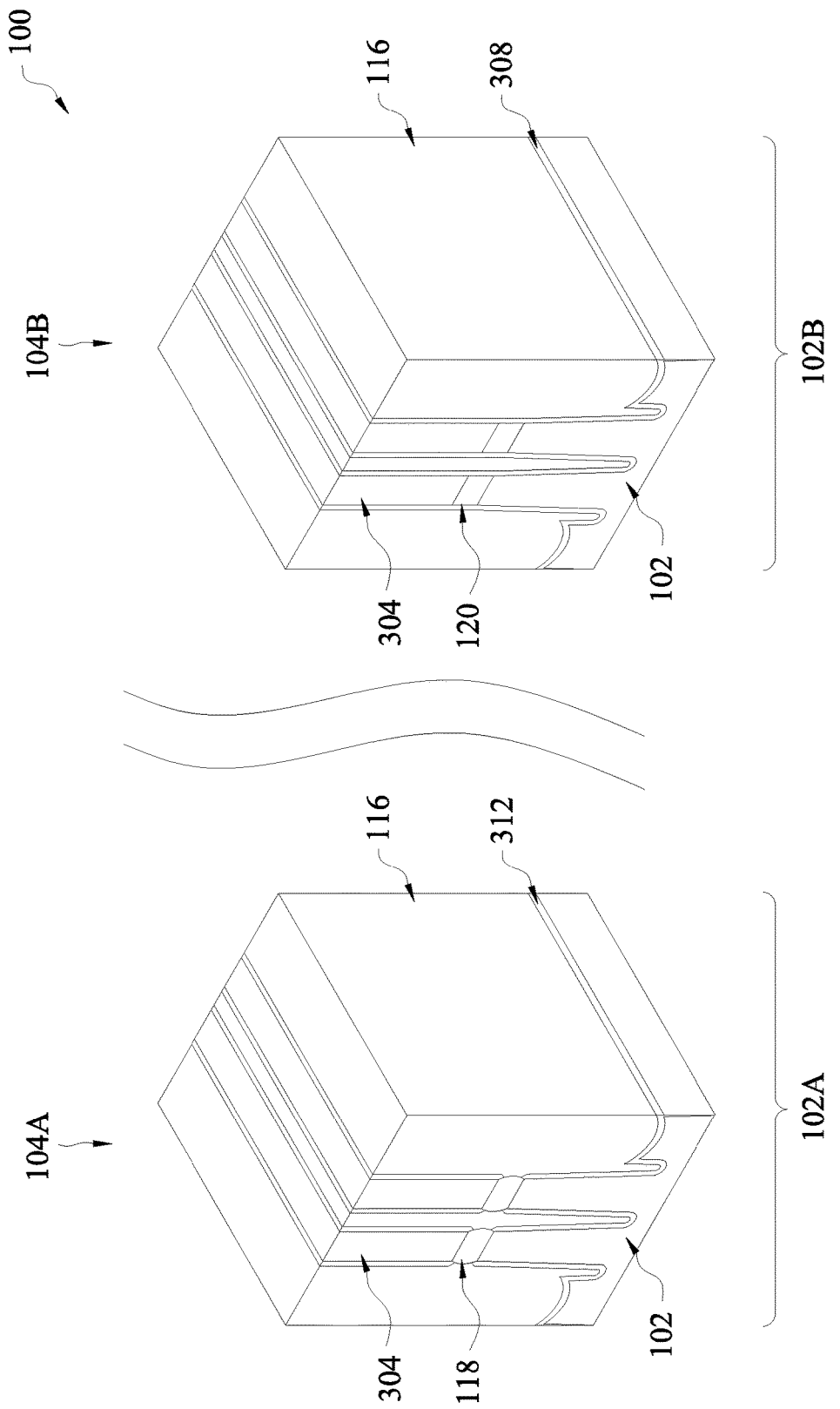

Referring to FIG. 2 and to FIGS. 9 and 10, the method proceeds to an operation 214 by forming isolation features 116 on the substrate 102. Shallow trench isolation (STI) features or other type of isolation features may be formed between raised active regions of the fin structure 104 as shown in FIG. 10. The formation of the isolation features 314 includes deposition and polishing.

Referring to FIG. 9, a dielectric material 314 is deposited within the isolation feature trenches to form the isolation features. Suitable fill dielectric materials 314 include semiconductor oxides, semiconductor nitrides, semiconductor oxynitrides, FSG, low-K dielectric materials, and/or combinations thereof. In various exemplary embodiments, the dielectric material 314 is deposited using a HDP-CVD process, a sub-atmospheric CVD (SACVD) process, a high-aspect ratio process (HARP), and/or a spin-on process. In one such embodiment, a flowable CVD process (FCVD) is used to deposit a flowable dielectric material that includes both a dielectric material 314 and a solvent in a liquid or semiliquid state. A curing process is used to drive off the solvent, leaving behind the dielectric material 314 in its solid state. In furtherance of the embodiment, the FCVD process may include depositing a material containing both silicon and nitrogen (Si—N-containing film, such as Si—N—H film) from a carbon-free Si—N-containing precursor. The film in converted into solid silicon oxide with fewer defects since the Si—N-containing film is carbon free. The conversion of the Si—N-containing film to silicon oxide includes thermal curing the Si—N-containing film in an oxygen atmosphere, such as a gas having steam ($H_2O$), radical atomic oxygen (O), molecular oxygen ($O_2$), ozone ($O_3$), or a combination thereof.

Referring to FIG. 10, the deposition of the dielectric material 314 may be followed by a chemical mechanical polishing/planarization (CMP) process. The CMP process may use the hard mask layers 306 as a polishing stop layer to prevent polishing the semiconductor layer 304. In the illustrated embodiment, the CMP process completely removes the hard mask layers 306, further embodiments, some portion of the hard mask layers 306 remain after the CMP process. In some embodiments, the CMP process includes two steps with different slurries tuned effectively remove the dielectric material 314 and the hard mask. In some embodiments, the CMP process is controlled with proper endpoint checking mechanism such that it stops after the hard mask layer 306 is removed.

Referring to FIG. 2 and to FIG. 11, the method 200 proceeds to an operation 216 by recessing the isolation features 116 to expose the second semiconductor layer 304, thereby forming raised active regions or fin structure 104, such as the first features 104A and the second fin features 104B. In the illustrated embodiment, the fill material is recessed to expose the semiconductor layer 304 in its entirety. The semiconductor layer 302 (including the buried isolation feature 118 converted therefrom and the semiconductor feature 120) may be partially exposed. In this embodiment, the fill material 314 is recessed such that the upper surface of the fill material 314 is below the upper surfaces of the second semiconductor layer 304 with a distance tuned according to the desired fin height. Any suitable etching technique may be used to recess the fill material 314 including dry etching, wet etching, RIE, and/or other etching methods, and in an exemplary embodiment, an anisotropic dry etching is used to selectively remove the fill material 314 without etching the second semiconductor layer 304.

In the first region 102A, the first fin features 104A are electrically isolated from each other and from the substrate 102 by the buried isolation feature 118 and STI features 116. In the second region 102B, the second fin features 104B are electrically coupled to the substrate 102 through the semiconductor feature 120.

Figure 12:
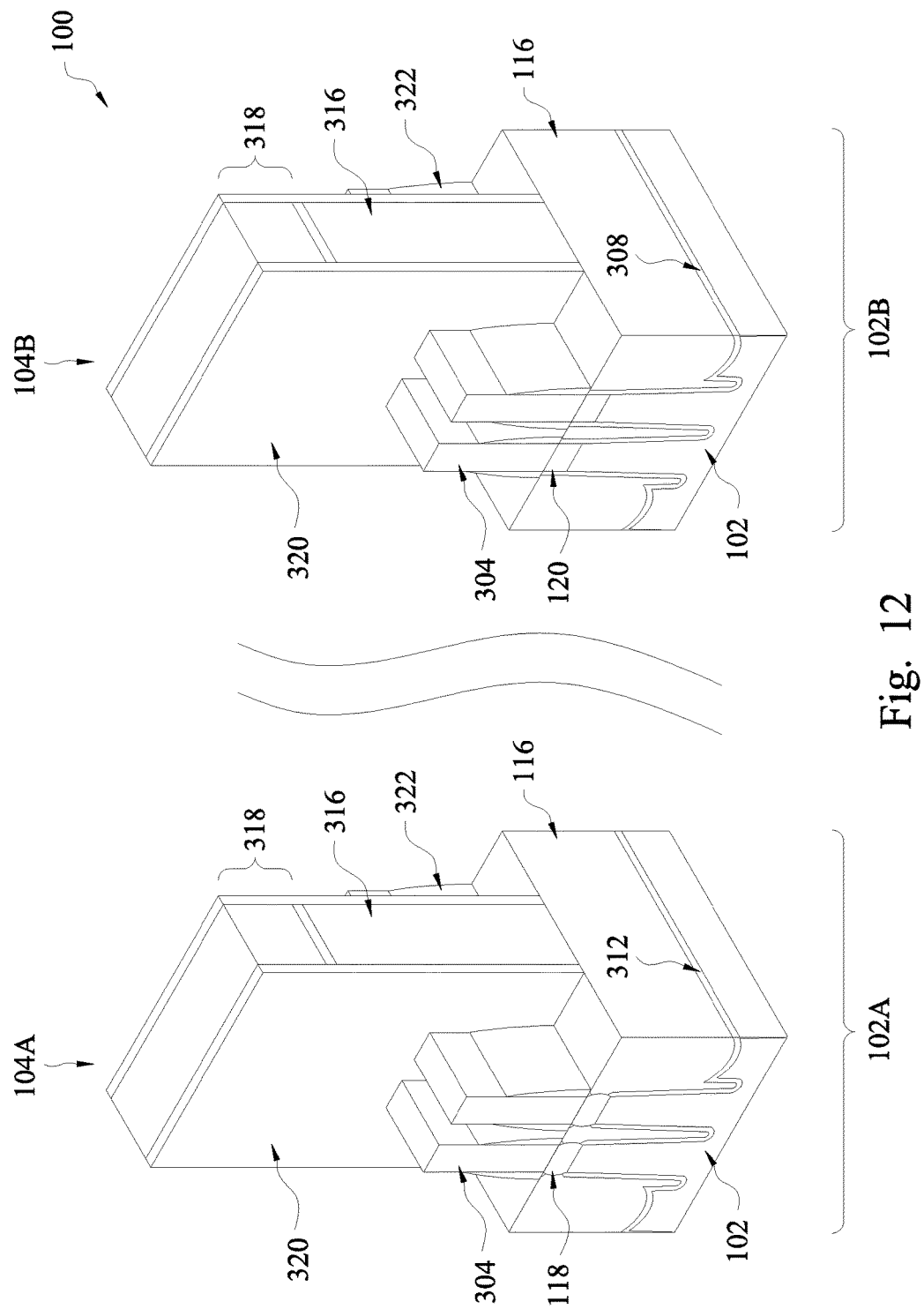
Figure 13:
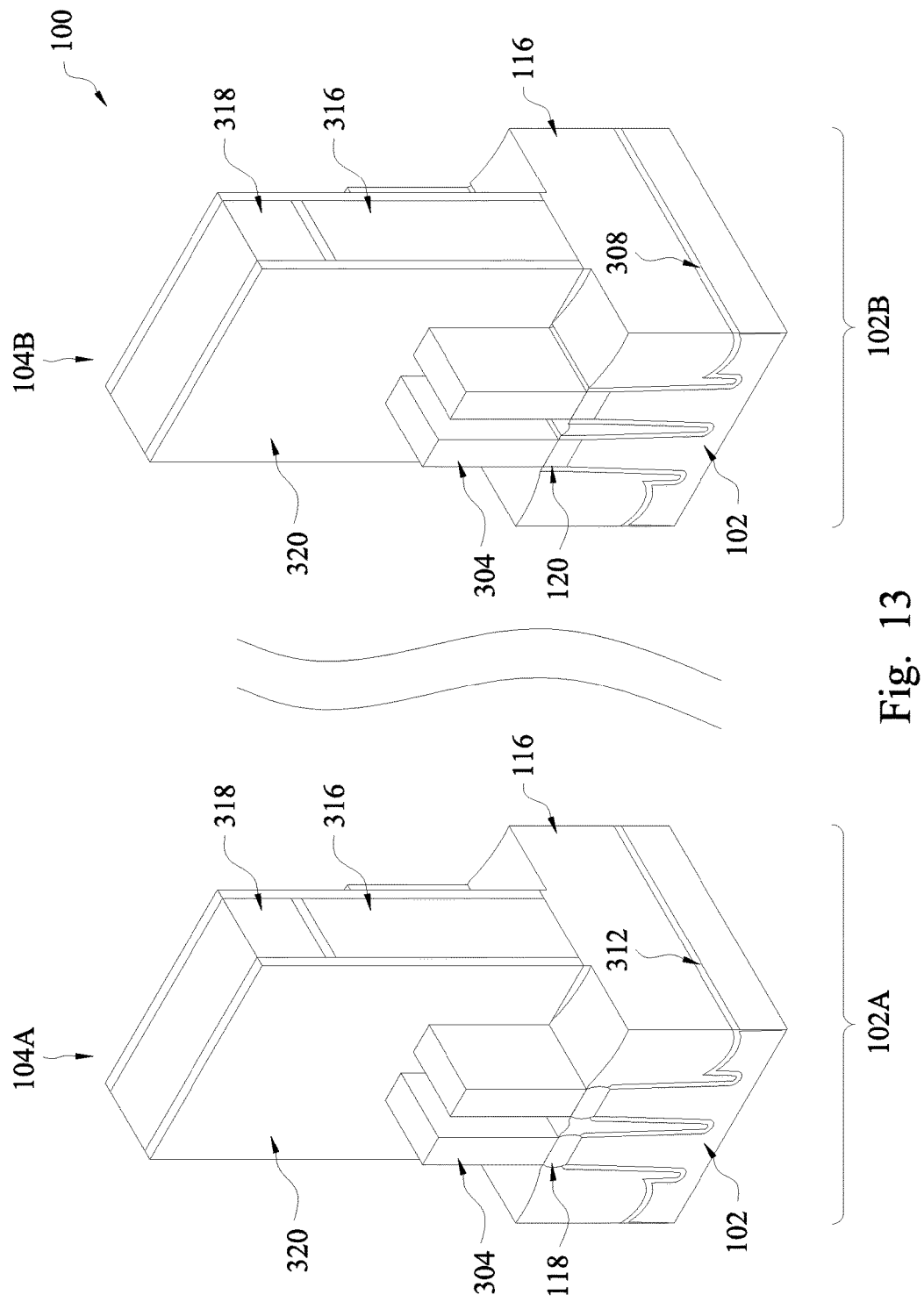
Figure 14:
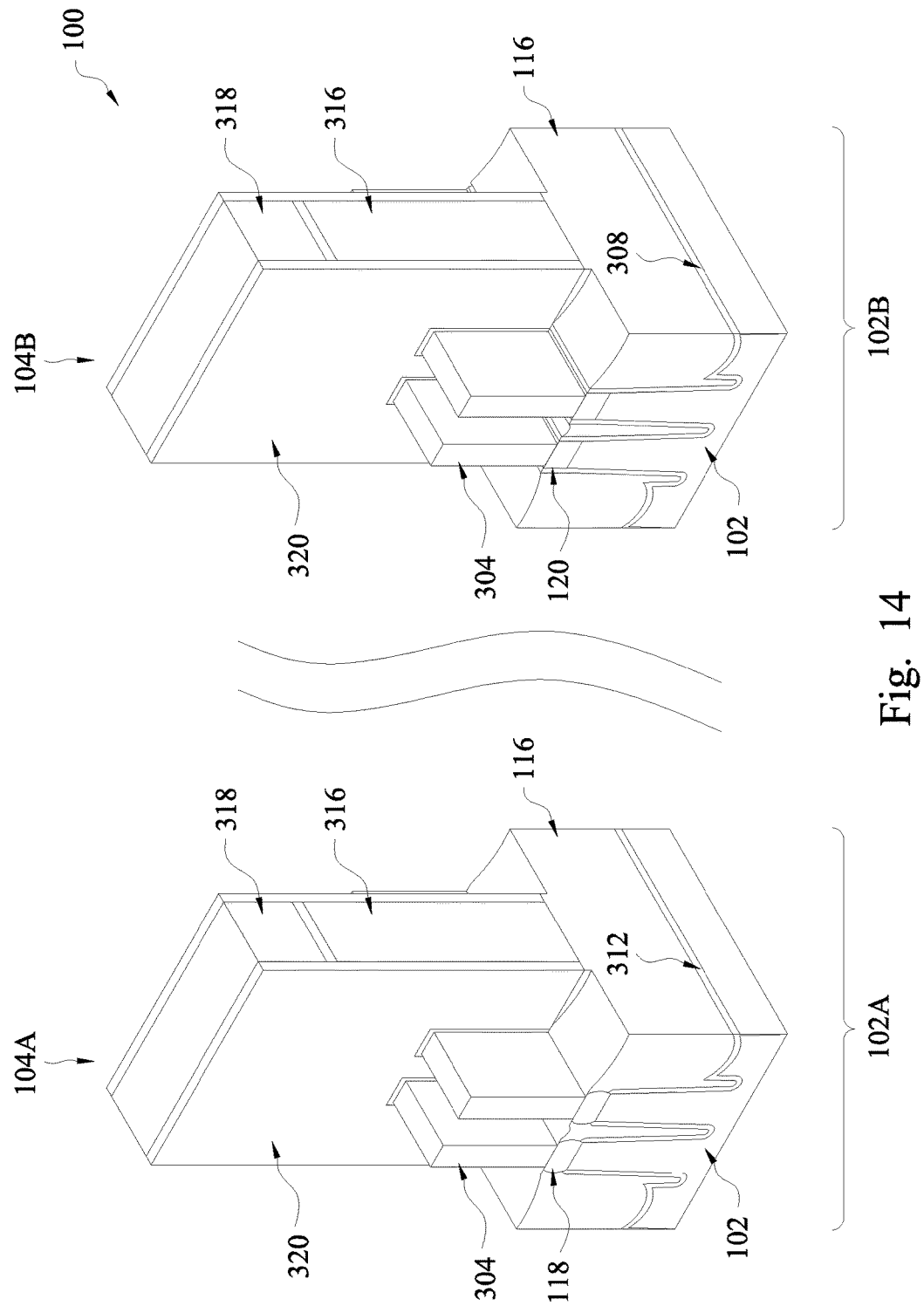

Referring to of FIG. 2 and to FIGS. 12 through 14, the method 200 proceeds to an operation 218 by forming dummy gates 316. The dummy gates 316 are formed over the channel region 112 (the portions of the fin features covered by the dummy gates, respectively). Forming the dummy gate 316 may include depositing a dummy gate layer containing polysilicon or other suitable material and patterning the layer in a lithographic process. A gate hard mask layer 318 may be formed on the dummy gate 316. The gate hard mask layer 318 may include any suitable material, such as a silicon oxide, a silicon nitride, a silicon carbide, a silicon oxynitride, other suitable materials, and/or combinations thereof. In some embodiments, the gate hard mask layer 318 includes two dielectric films, such as a silicon oxide film and a silicon nitride on the silicon oxide film. The formation of the gate stack 316 includes deposition of gate material layers and patterning the gate material layers. In some embodiments, the patterning process includes forming a patterned resist layer; etching the hard mask layer using the patterned resist layer as an etch mask; and etching the gate material layers using the patterned hard mask layer as an etch mask.

In some embodiments, gate spacers 320 or sidewall spacers are formed on the sidewalls of the dummy gate 316. The gate spacers 320 may be used to offset the subsequently formed source/drain features and may be used for designing or modifying the source/drain structure (junction) profile. The gate spacers 320 may include any suitable dielectric material, such as a semiconductor oxide, a semiconductor nitride, a semiconductor carbide, a semiconductor oxynitride, other suitable materials, and/or combinations thereof. The formation of the gate spacer includes deposition and anisotropic etching, such as dry etching. When the spacers 320 are formed on the sidewalls of the dummy gates 316, spacers 322 are simultaneously formed on the sidewalls of the fin structure 104 as well.

Referring to FIG. 13, the fin spacers 322 are removed, such as for subsequent epitaxy growth to form the source and drain features. The removal of the fin spacers 322 is achieved by a proper etching procedure. In some embodiments, a dry etching process is applied to remove the fin spacers 322. Due to the thickness difference between the gate spacers 320 and the fin spacers 322, the fin spacers 322 are removed while the gate spacers 320 are thinned but survived after the dry etching process. In alternative embodiments, a hard mask is formed to cover the dummy gates and the gate spacers and uncover the fin structure; and an etching process (such as a wet etch) is applied to remove the fin spacers 322 using the hard mask as an etch mask.

Referring to FIG. 14, the fin structure 104 may be trimmed to reduce the dimensions of the fin features, such as 104A and 104B, by an etching process. The etching process may be a wet etch, a dry etch, or a combination thereof. The etching process is designed with a suitable etchant to selectively etch the second semiconductor layer. For example, this etching process may be similar to the etching process used to pattern the semiconductor layer 304 at the operation 206.

Figure 15:
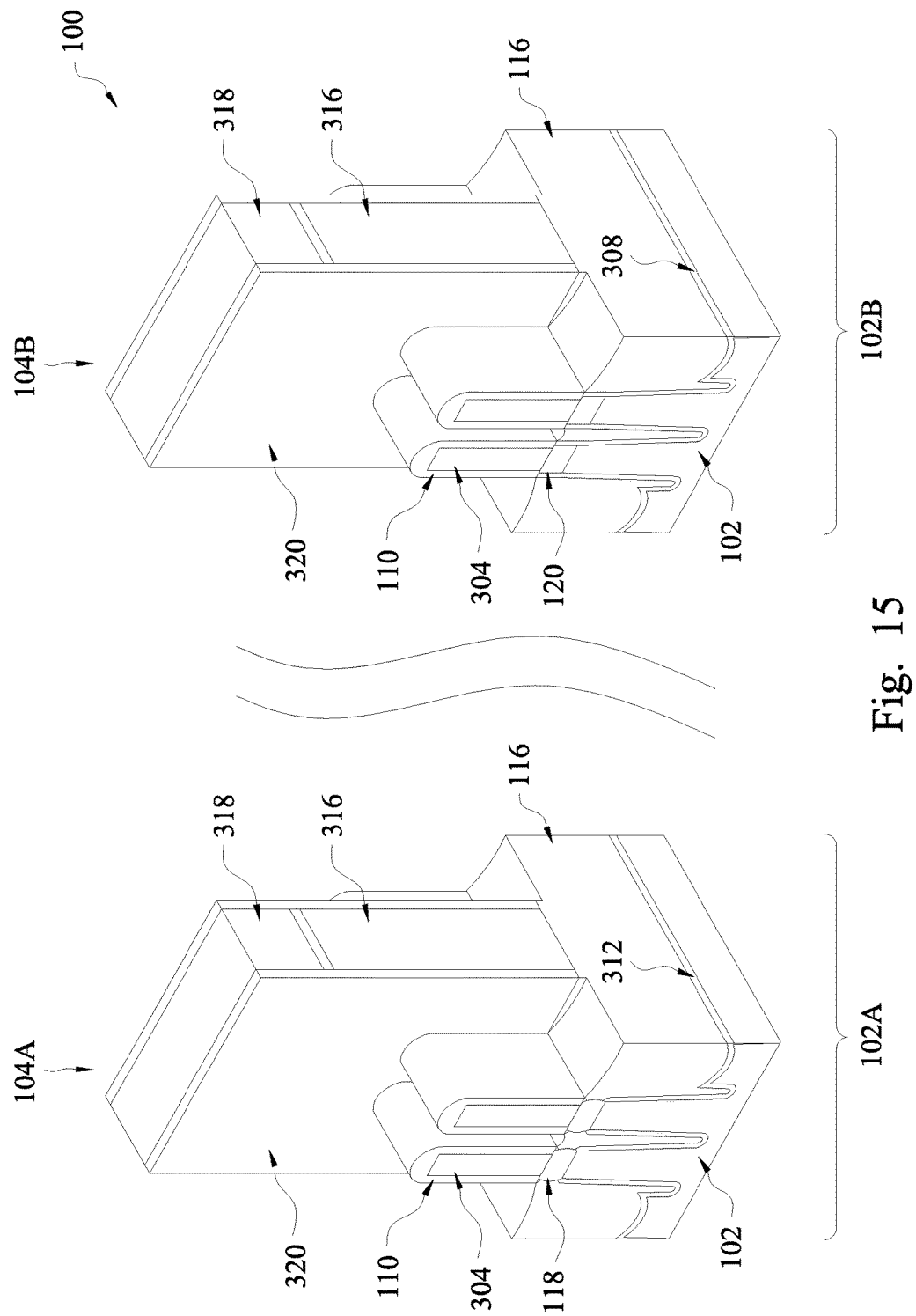

Referring to FIG. 2 and to FIG. 15 and, the method 200 proceeds to an operation 220 by forming the source and drain features 110. The raised source/drain (S/D) features 110 are formed on the raised fin active regions. The dummy gate 316 and/or gate spacers 320 limit the source/drain features 110 to the source/drain regions. In many embodiments, the source/drain features 110 are formed by one or more epitaxy or epitaxial (epi) processes, whereby Si features, SiGe features, SiC features, and/or other suitable features are grown in a crystalline state on the fin structure 104. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 104.

In the illustrated embodiments, since the fin spacers 322 are removed, the epitaxy growth are on top surfaces and sidewalls of the fin features, or surrounding (cladding) the fin features from various surfaces. Even though various features in the second region 102B are referred by same terms (such as dummy gates, source and drain features), those features are designed and configured to form the non-core devices, such BJT, pickup features, diodes, or a combination thereof.

The source/drain features 110 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 110 are not in-situ doped, an implantation process (i.e., a junction implant process) is performed to dope the source/drain features 110. In an exemplary embodiment, the source/drain features 110 in an NMOS include SiCP or SiP, while those in a PMOS include GeSnB (tin may be used to tune the lattice constant) and/or SiGeSnB. One or more annealing processes may be performed to activate the source/drain features 110. Suitable annealing processes include rapid thermal annealing (RTA) and/or laser annealing processes.

Figure 16:
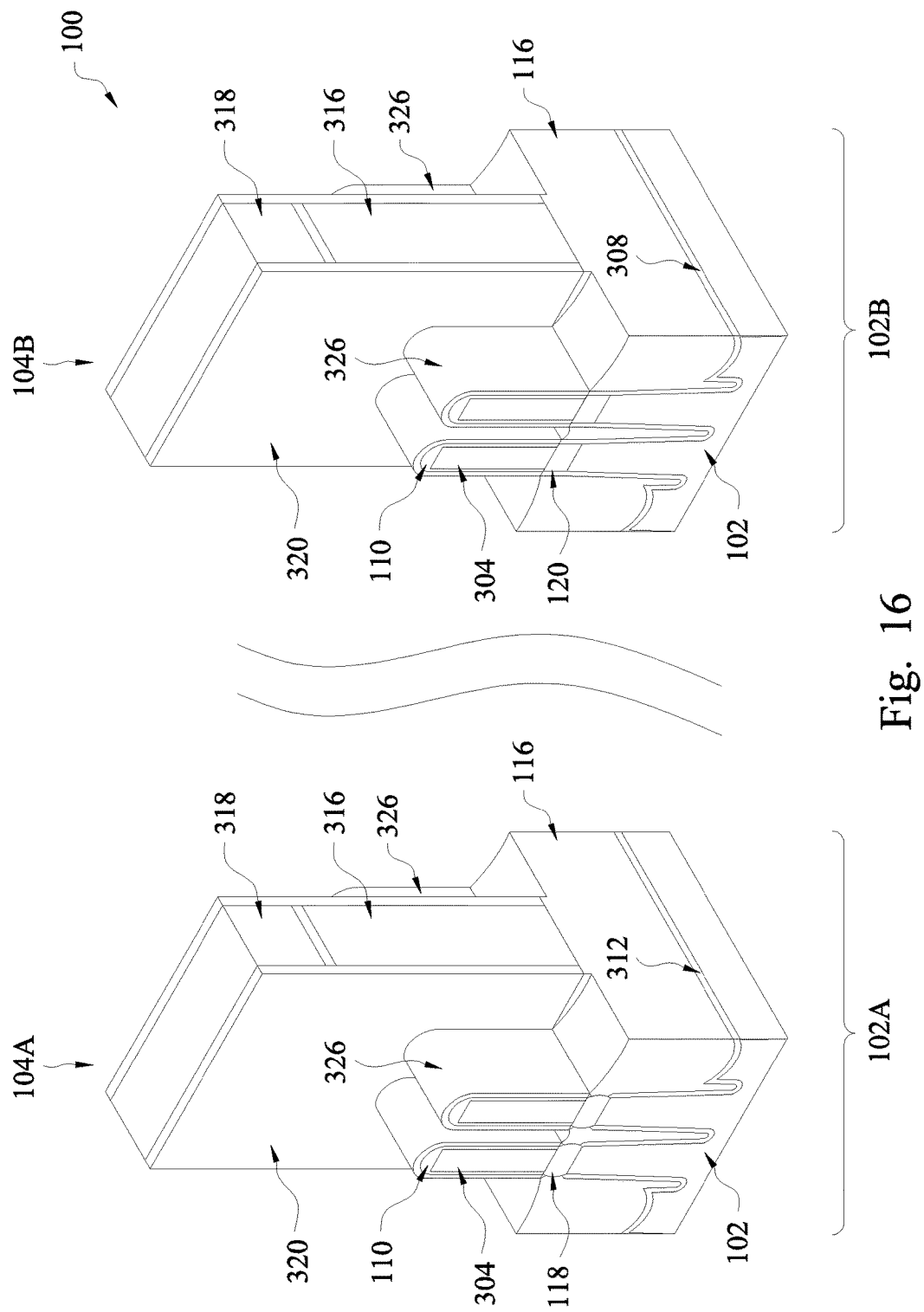

Referring to FIG. 16, silicide features 326 may be formed on the source and drain features 110. The silicide features 326 may include such materials as nickel silicide, cobalt silicide, tungsten silicide, tantalum silicide, titanium silicide, platinum silicide, erbium silicide, palladium silicide, or combinations thereof. The silicide features 326 may be formed by silicidation such as self-aligned silicide (Salicide), in which a metal is deposited, reacted with silicon during an annealing process, and then the unreacted metal is removed by etch. Particularly, after the metal deposition, temperature is raised to for annealing to enhance reaction between Si and metal to form silicide, finally unreacted metal may be etched away. Annealing may be one step or multi-step annealing depending on metal material and other conditions. Alternatively, the silicide features 326 may be formed by a procedure including silicide deposition, such as CVD, PVD, or ALD.

Figure 17:
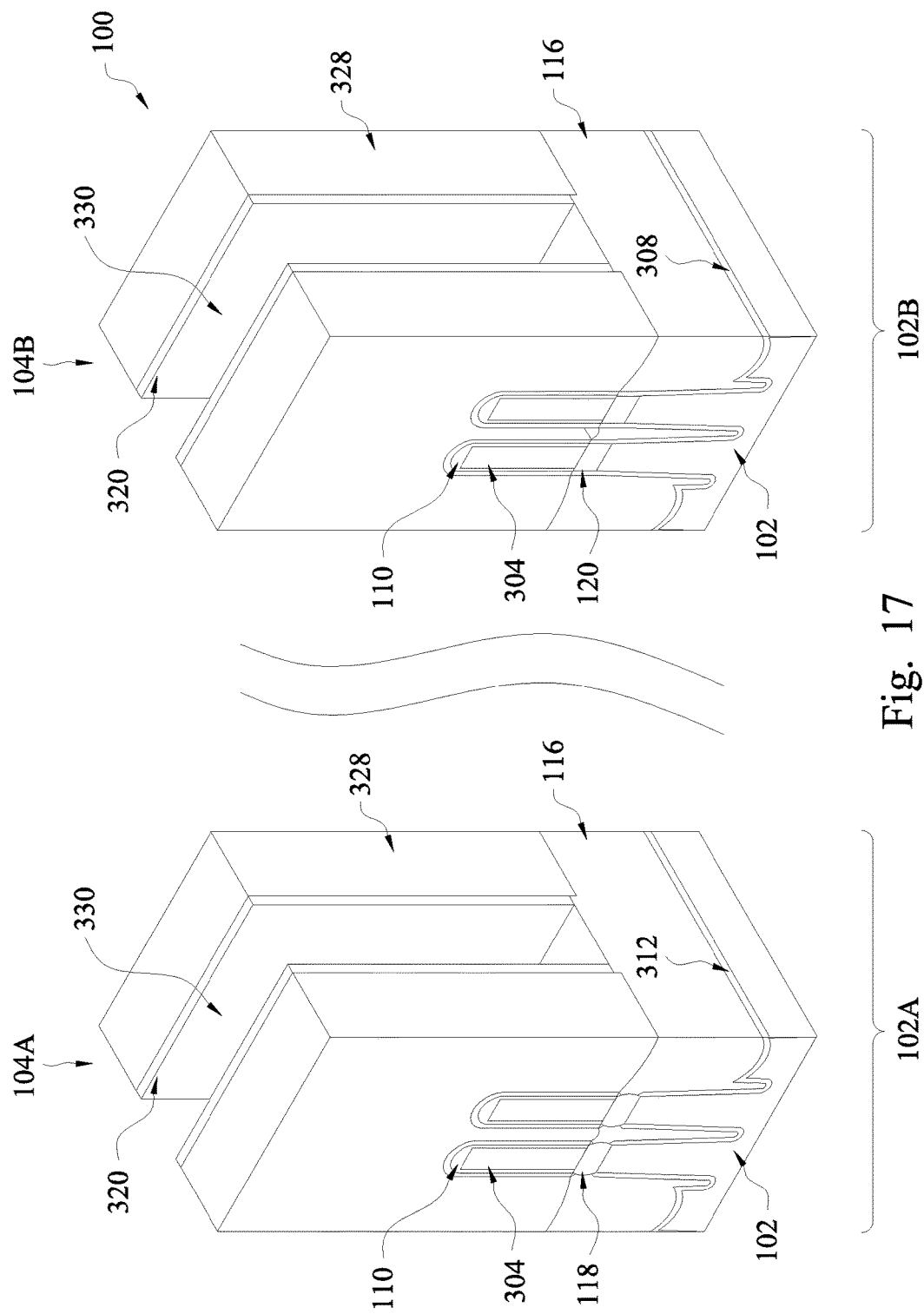

Referring to FIG. 2 and to FIG. 17, the method 200 proceeds to an operation 222 by forming an inter-level dielectric (ILD) 328 on the substrate 102. Particularly, the ILD 328 is formed on the source/drain features 110 in the source/drain regions. The ILD 328 may surround the dummy gates 316 and/or gate spacers 320 allowing these features to be removed and replacement gates to be formed in the resulting cavity. The ILD 328 may include any suitable dielectric material, such as a semiconductor oxide, a semiconductor nitride, a semiconductor oxynitride, a semiconductor carbide, other suitable materials, and/or combinations thereof. In various embodiments, the ILD layer 328 includes silicon dioxide, polyimide, spin-on glass (SOG), fluoride-doped silicate glass (FSG), carbon doped silicon oxide, or various low-k dielectric materials. The low-k dielectric material may have a dielectric constant "k" that is less than 3.9, as the dielectric constant of thermal silicon dioxide.

In some embodiments, the formation of the ILD 328 includes deposition and CMP. The ILD layer 328 may be deposited by CVD, ALD, PVD, spin-on coating or other deposition technique. After the deposition of the ILD layer 328, a CMP process may be followed to planarize the top surface of the ILD layer 328 and remove the hard mask 318. In some embodiments, the hard mask 318 functions as a polishing stop layer during the CMP process, and thereafter the hard mask 318 is removed by etch.

The ILD layer 328 may also be part of an electrical interconnect structure that electrically interconnects the devices of the workpiece. In such embodiments, the ILD 328 acts as an insulator that supports and isolates the conductive traces.

Referring to FIG. 2 and to FIG. 17, the method 200 proceeds to an operation 224 by removing the dummy gates 316. The dummy gates 316 are removed after depositing the ILD layer 328, resulting in gate trenches (cavities) 330 in the ILD layer 328, as shown in FIG. 17. The removal of the dummy gates 316 includes an etching procedure having one or more etching steps with proper etchant. In some embodiments, the dummy gate stack is removed by a process, such as a wet etch, to selectively the dummy gate stack. The etching may include multiple etching steps to respective dummy gate layers.

Figure 18:
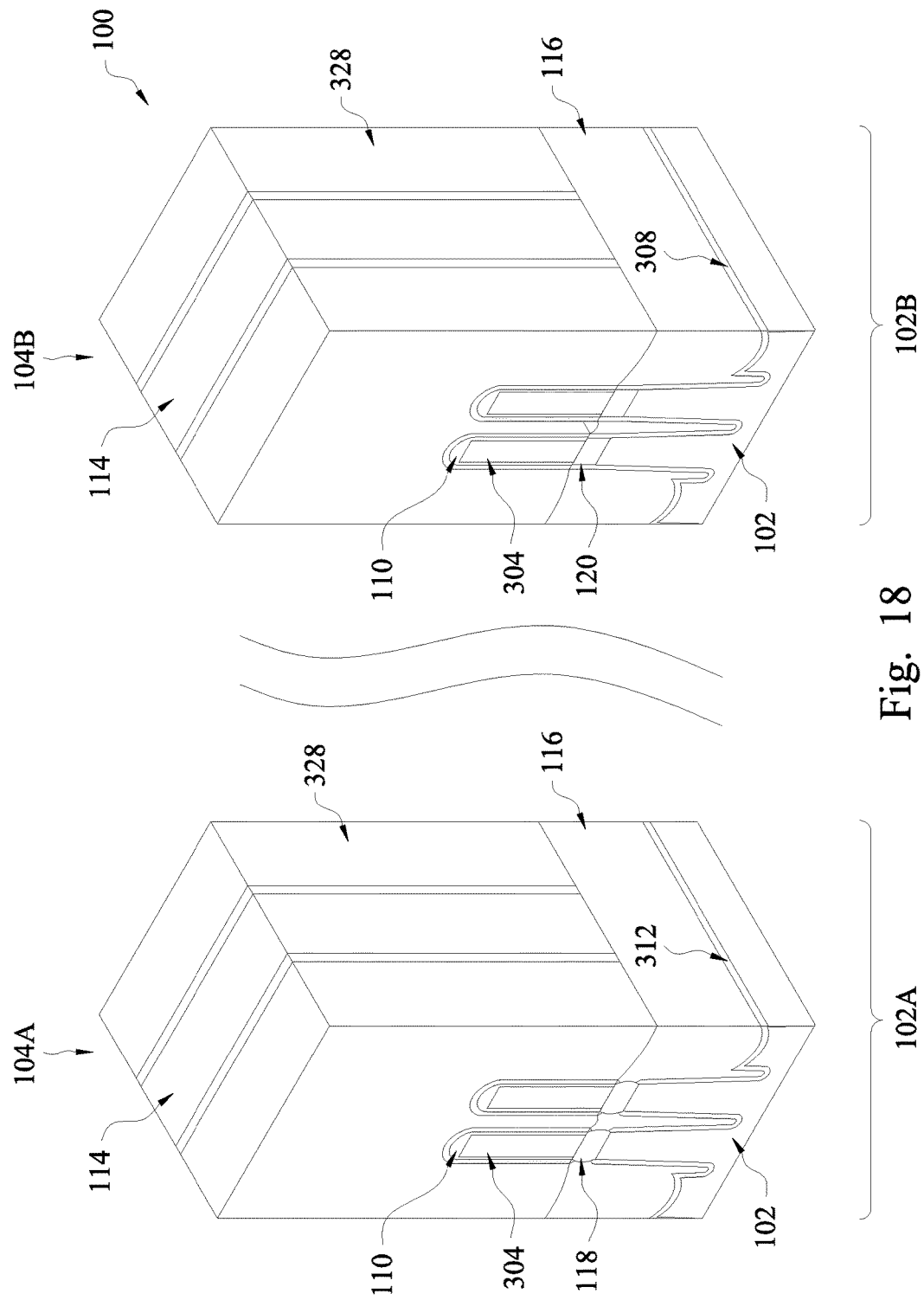

Referring to FIG. 2 and to FIG. 18, gate stacks 114 are formed on the workpiece 100. The gate stacks 114 are formed on the workpiece 100 wrapping around the channel regions 112 of the fin structure 104. The gate stacks 114 are formed in the gate trenches 330 by a procedure, such as a procedure that includes deposition and CMP. Although it is understood that the gate stacks 114 may be any suitable gate structure, in some embodiments, gate stack 114 is a high-k metal gate that includes a gate dielectric layer, and a gate electrode layer that each may include a number of sub-layers.

In one such embodiment, the gate dielectric layer includes an interfacial layer deposited by a suitable method, such as ALD, CVD, ozone oxidation, etc. The interfacial layer may include silicon oxide, HfSiO, silicon nitride, silicon oxynitride, and/or other suitable material. In some embodiments, the gate dielectric layer 1602 includes a high-k dielectric layer deposited on the interfacial layer by a suitable technique, such as ALD, CVD, metal-organic CVD (MOCVD), PVD, thermal oxidation, combinations thereof, and/or other suitable techniques. The high-k dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The gate electrode layer is then formed by ALD, PVD, CVD, or other suitable process, and may include a single layer or multiple layers, such as a metal layer, a liner layer, a wetting layer, and/or an adhesion layer. The gate electrode layer may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to produce a substantially planar top surface of the gate stack 114. After the gate stack 114 is formed, the workpiece 100 may be provided for further fabrication, such as contact formation and further fabrication of the interconnect structure.

The channel region 112 corresponds to the second semiconductor layer 304 and its thickness represents fin vertical thickness within the channel region. In some examples, the fin thickness ranges from about 10 nm to about 40 nm. The buried isolation layer 118 has a continuous structure to separate the channel region 112 and the S/D features 110 from the substrate 102. The buried isolation layer 118 has a first thickness and the semiconductor feature 120 has a second thickness less than the first thickness. In some examples, the semiconductor feature 120 has a thickness ranging between 5 nm and 15 nm and the dielectric feature 118 has a thickness ranging between 10 nm and 30 nm. In some embodiments, the source and drain features have a thickness ranging from about 3 nm to about 10 nm. In some examples, the silicide features 326 have a thickness ranging from 3 nm to 10 nm.

Figure 18A:
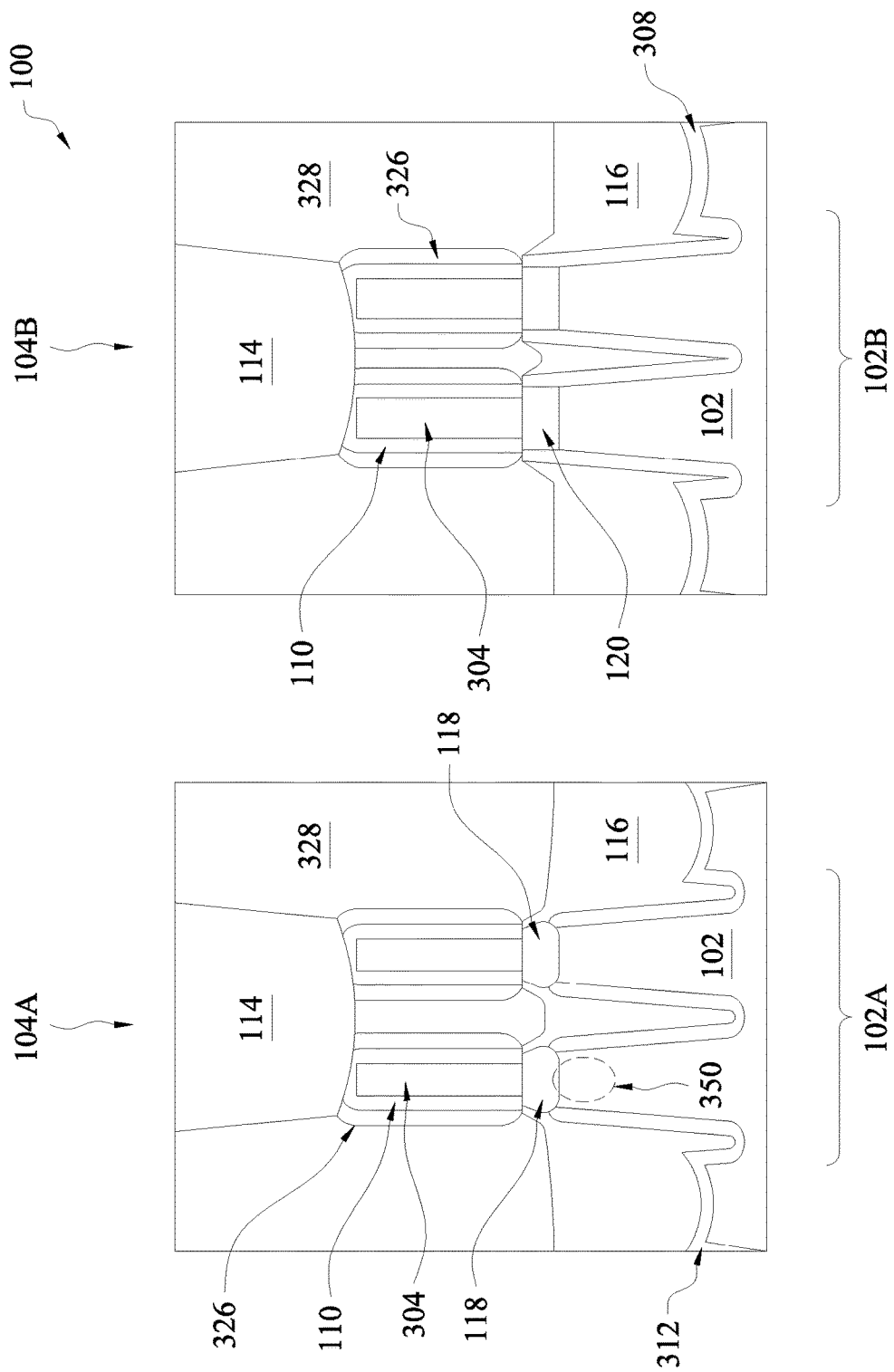
FIG. 18A is a sectional view of the semiconductor structure of FIG. 18, constructed in accordance with some embodiments.

FIG. 18A is a sectional view of the semiconductor structure 100, constructed in accordance with some embodiments. The first fin feature 104A includes the buried isolation semiconductor feature 118 while the second feature 104B includes the semiconductor feature 120. The buried isolation feature 118 is surrounded from the sidewalls by the isolation feature 116 horizontally and interposed between the source and drain features 110 and the substrate 102 vertically. The source and drain features 110 are formed on the fin features of the second semiconductor material (such as silicon), which is different from the semiconductor material (such as silicon germanium) of the source and drain features 110. Especially, the substrate 102 includes a first semiconductor material; the semiconductor feature 120 includes a second semiconductor material; and the first and second fin features include a third semiconductor material. The buried isolation feature 118 includes an oxide of the second semiconductor material. The second semiconductor material is different from the third semiconductor material in composition. In some embodiments, the second semiconductor material is different from the first semiconductor material in composition. For example, the first and third semiconductor materials include silicon. In the present embodiment, the second semiconductor material is a compound semiconductor material, such as silicon germanium. In furtherance of the embodiment, the semiconductor feature 120 includes silicon germanium; and the buried isolation feature 118 includes silicon germanium oxide. Furthermore, an APT feature 350 formed by APT ion implantation at the block 202 is disposed in the substrate 102 and is underlying the buried isolation feature 118.

The buried isolation feature 118 is formed from a semiconductor material of the second semiconductor material by a selective oxidation process that is tuned to oxidize the second semiconductor material but not oxidize the third semiconductor material. Especially, the buried isolation feature 118 is converted from a portion of a semiconductor layer of the second semiconductor material that forms the semiconductor feature 120. The buried isolation feature 118 has a first thickness T1 and the semiconductor feature 120 has a second thickness T2 different from the first thickness T1. In the present embodiment, the second thickness T2 is less than the first thickness T1. In furtherance of the embodiment, the first thickness T1 is about twice of the second thickness T2, within a variation less than 30%, or preferably less than 10%. In some embodiments, the first thickness T1 ranges from 10 nm to 30 nm and the second thickness T2 ranges from 5 nm to 15 nm.

Figure 19:
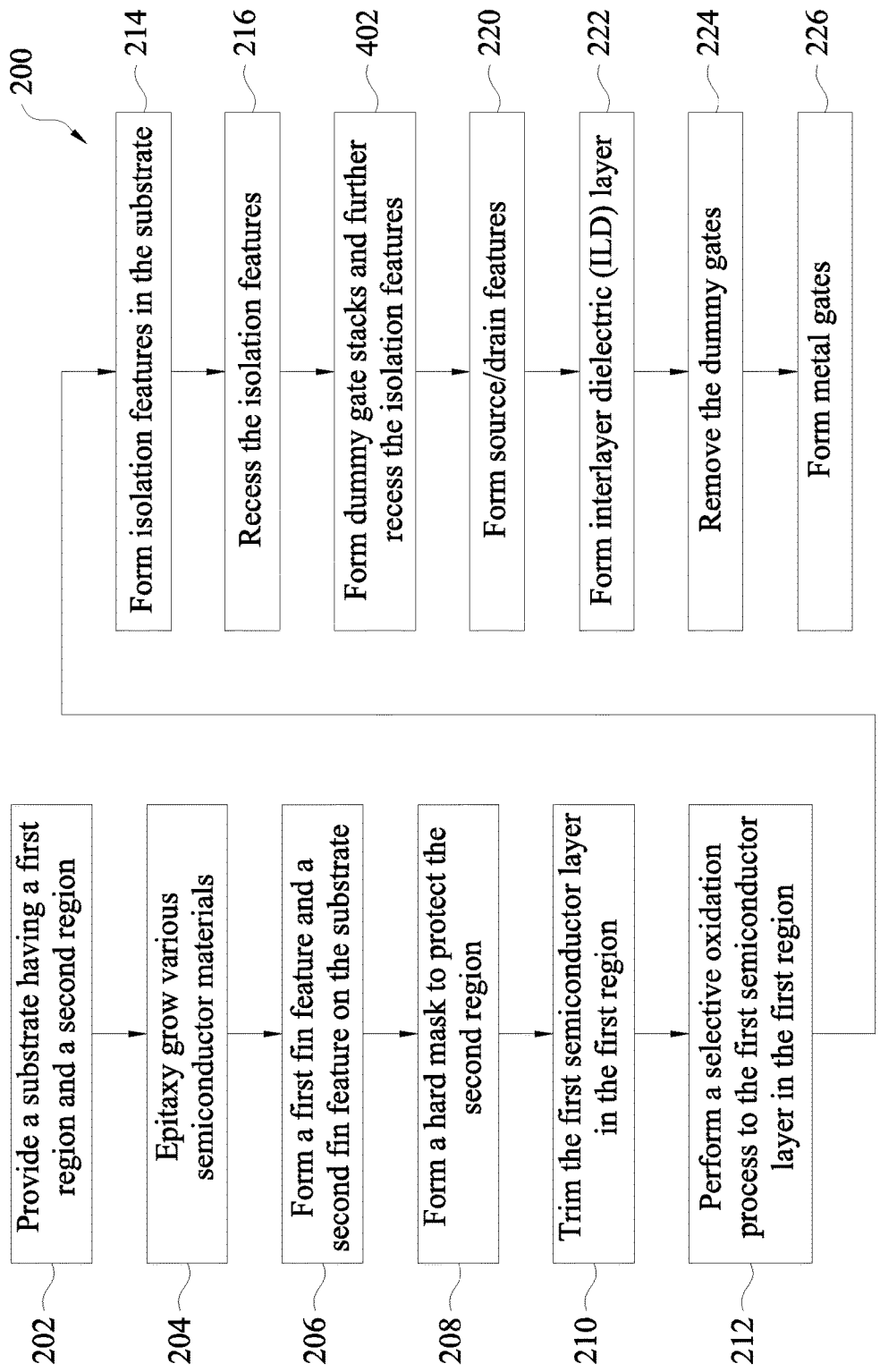
FIG. 19 is a flowchart of an integrated circuit fabrication method in accordance with some embodiments.

According to some other embodiments, methods of forming the workpiece 100 are described with reference to FIGS. 19-35. FIG. 19 is a flowchart of a method 400 for fabricating a FinFET or other fin-based device on a workpiece 100 according to various aspects of the present disclosure. The figures that follow refer perspective views of the workpiece 100, and/or cross-sections taken through the channel region 112 (e.g., along plane 122) or through the source/drain regions 110 (e.g., along plane 124) of the FinFET device 106. It is understood that additional steps can be provided before, during, and after the method 400 and that some of the steps described can be replaced or eliminated for other embodiments of the method. The method 400 is similar to the method 200. The similar description is not repeated for simplicity.

Referring first to FIG. 19 and to FIG. 20, a workpiece 100 is received a substrate 102 having the first region 102A and the second region 102B. Suitable substrates 102 include a bulk silicon substrate, or alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

The received workpiece 100 may have one or more dopants already introduced upon it. In the illustrated embodiment, the workpiece 100 includes an APT dopant introduced to the substrate 102 within the first region 102A by an ion implantation process 252. The ion implantation process 252 is designed to introduce a proper type of dopant into the corresponding channel regions, such as p-type dopant for an nFET or n-type dopant for a pFET. In some embodiments, the APT ion implantation process 252 includes forming a first mask by lithography patterning and performing an n-type ion implantation selectively to the pFET using the first mask as an implantation mask. The APT ion implantation process 252 may further include forming a second mask by lithography patterning and performing a p-type ion implantation selectively to the nFET using the second mask as an implantation mask. The first and second masks are patterned to protect the nFET region and the pFET region from the corresponding ion implantation, respectively. In some embodiments, the APT doping process has a doping dose ranging between $10^{18}$ and $10^{19}$ /cm$^2$.

Figure 21:
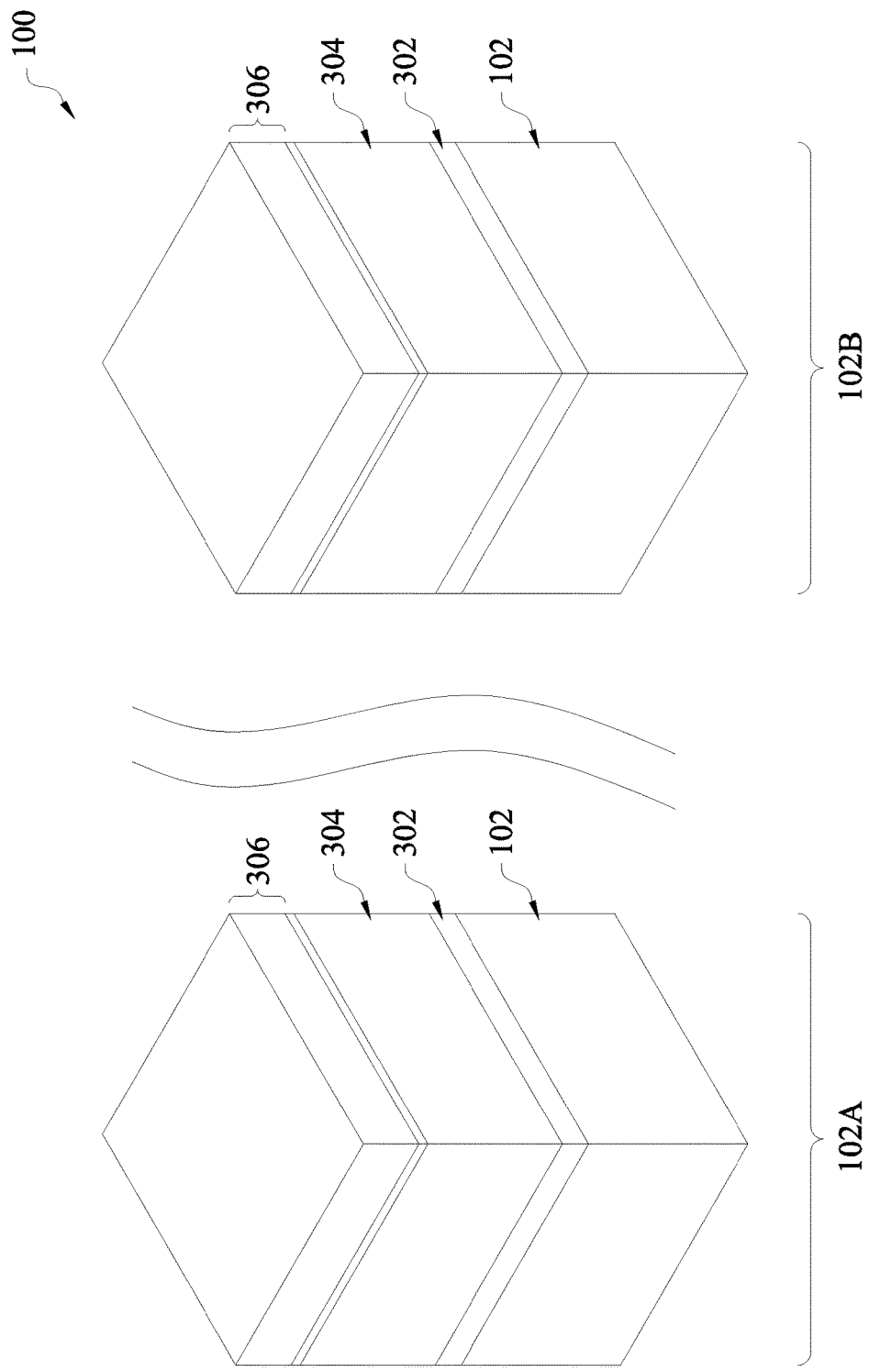

Referring FIG. 19 and to FIG. 21, the method 400 includes an operation 204 by epitzxy grow various semiconductor material layers on the substrate 102. In the illustrated embodiment, a first semiconductor layer 302 formed on the substrate 102 and a second semiconductor layer 304 formed on the first semiconductor layer 302. The first semiconductor layer 302 includes a first semiconductor material and the second semiconductor layer 304 includes a second semiconductor material different from the first semiconductor material. The first and second semiconductor layers epitaxially grown by suitable techniques, such as SEG.

Figure 22:
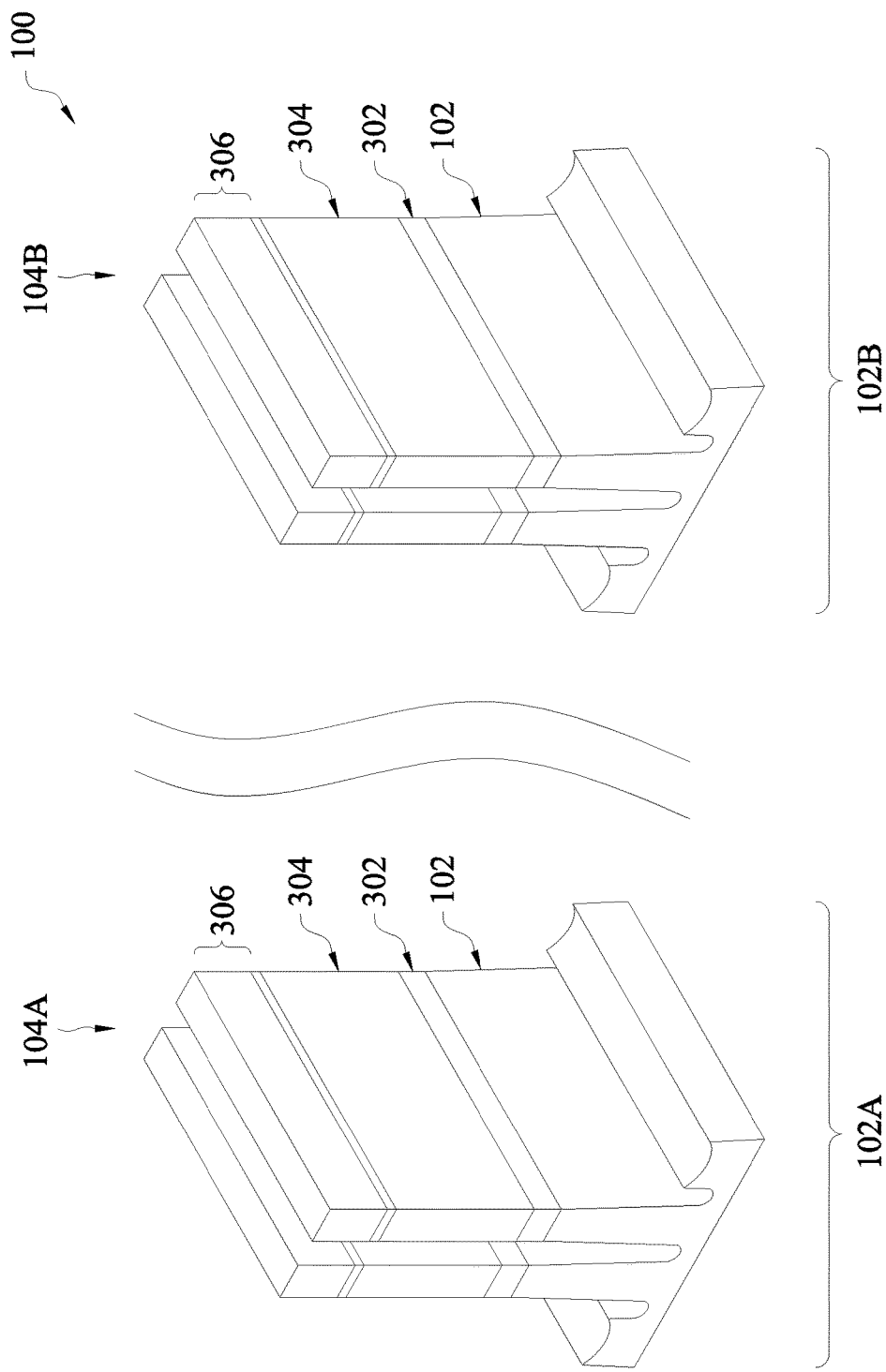

Referring to FIGS. 19 and 22, the method 400 includes an operation 206 by forming the fin structure 104 on the substrate, particularly forming the fin structure having the first fin feature 104A in the first region 102A and the second fin feature 104B in the second region 102B. In the present embodiment for illustration, two exemplary fin features 104A are formed in the first region 102A and two exemplary fin features 104B are formed in the second region 102B.

Figure 23:
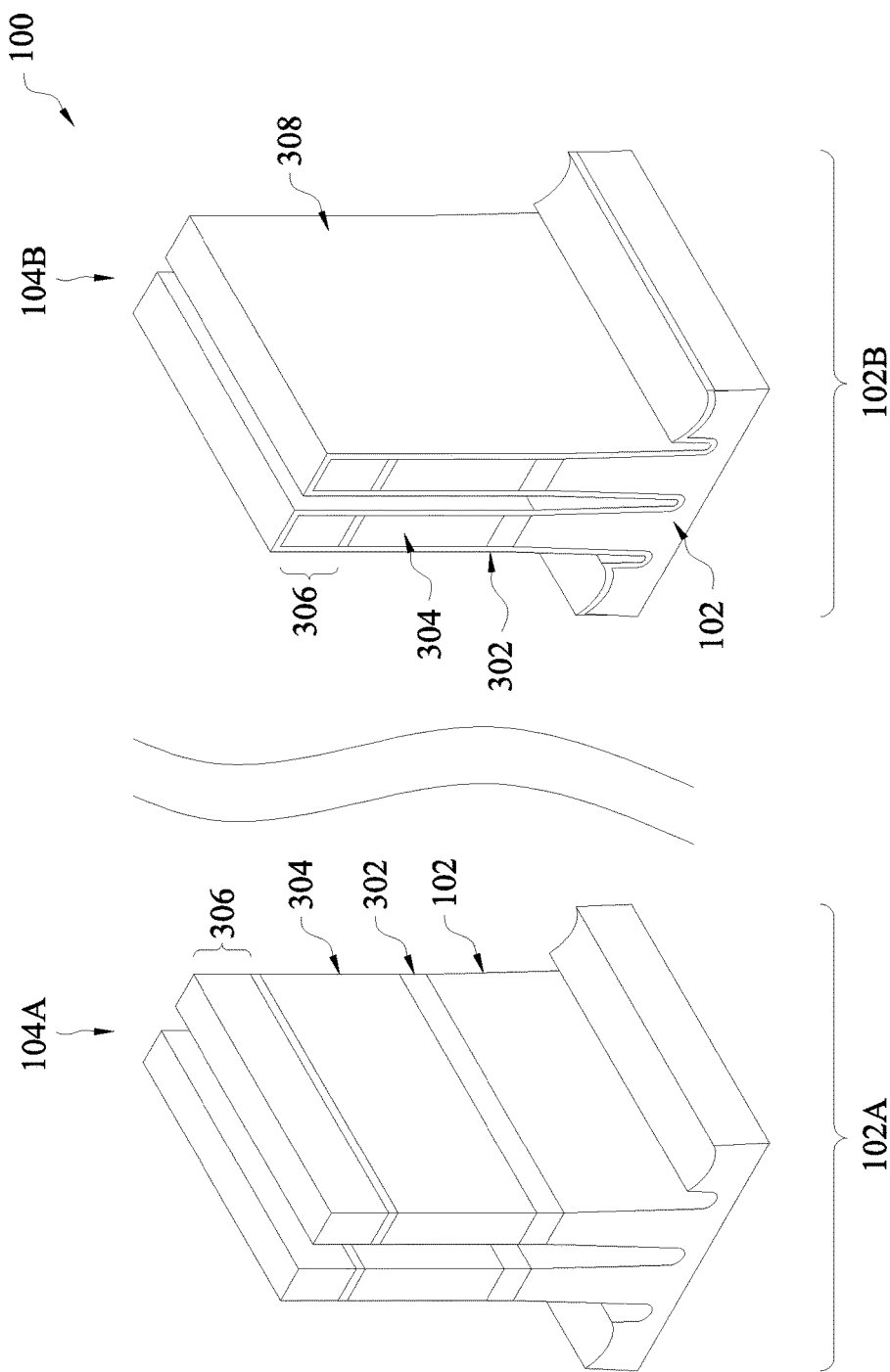

Referring to FIG. 19 and to FIG. 23, the method 400 proceeds to an operation 208 by forming a liner (or second hard mask) 308 to protect the second region 102B. The formation of the hard mask 308 includes deposition and patterning, which is similar to the formation of the hard mask 306. However, the hard mask 306 is a planar layer while the hard mask 308 is three dimensional. The hard mask 308 is patterned to cover the second region 102B and has an opening to expose the first region 102A. In the second region 102B, the hard mask 308 is conformal to the fin feature 104B such that the sidewalls of the second fin feature 104B are also covered thereby.

Figure 24:
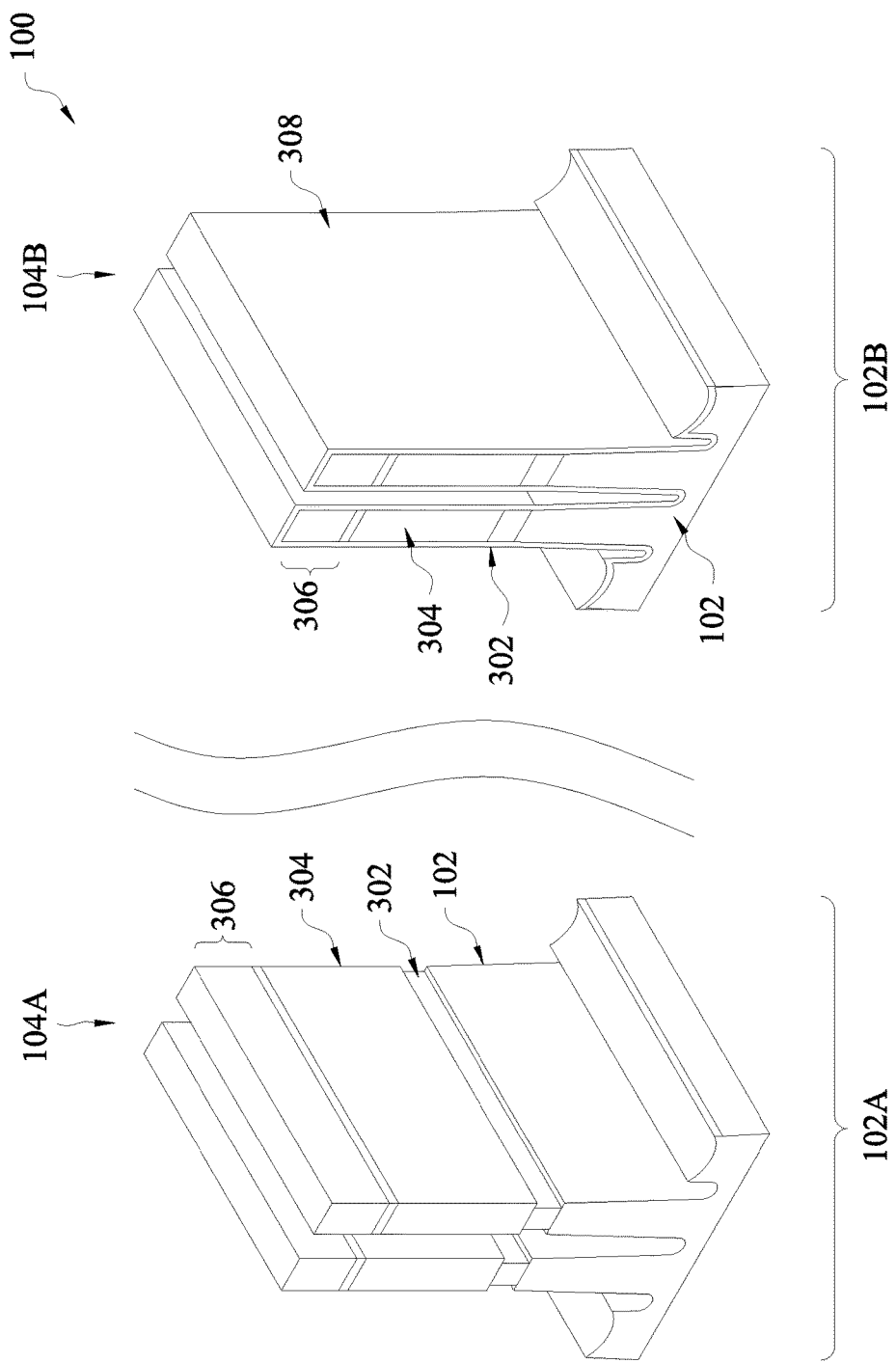

Referring to FIG. 19 and to FIG. 24, the method 400 may proceed to an operation 210 by trimming the first semiconductor layer 302 in the first region 102A, thereby the first semiconductor layer 302 in the first region 102A is recessed horizontal from the sidewalls of the first fin feature 104A. In the present embodiment, the recessed dimension is controlled such that the oxidized feature at later stage fits in the same space. In some embodiments, the trimming process is an etching process designed with an etchant to selectively etch the first semiconductor material of the first semiconductor layer 302 but substantially not etch the second semiconductor material of the second semiconductor layer 304. In some examples, the trimming process may include wet etch, dry etch or a combination thereof.

Figure 25:
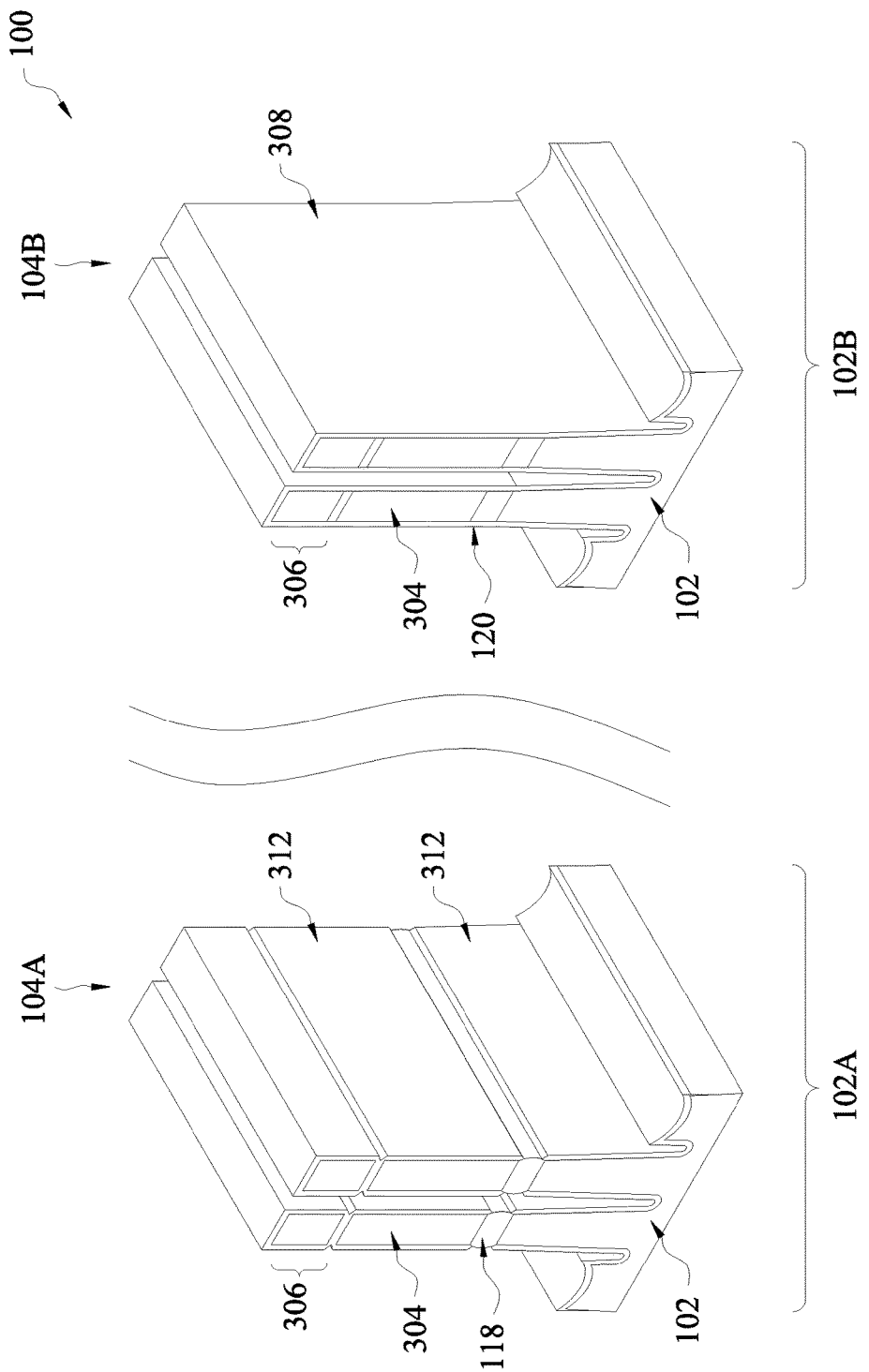

Referring to FIG. 19 and to FIG. 25, the method 400 proceeds to an operation 212 by performing a selective oxidation process to the first semiconductor layer 302 in the first region 102A. The selective oxidation process is designed to selectively oxidize the first semiconductor material of the first semiconductor layer 302 but not the second semiconductor material of the second semiconductor layer 304. In the present example, the first semiconductor material is silicon germanium and the second semiconductor material is silicon. It is found that SiGe and Si have different oxidation rates and different oxidation behaviors, such as temperature dependences. In one example, the oxidation temperature is tuned and chosen in the range between 400° C. and 600° C., the corresponding oxidation process is selective and substantially oxidizes SiGe but substantially does not oxidize Si. Accordingly, the first semiconductor layer 302 is converted into a dielectric material by the selective oxidation. Second, since the second region 102B is covered the patterned hard mask 308, which functions as an oxidation mask and protects the portion of the first semiconductor layer 302 within the second region from oxidation. Thus, with the selective oxidation process using the hard mask 308, the portion of the first semiconductor layer 302 in the first region 102A is converted to a dielectric layer or particularly, the dielectric feature (buried isolation feature) 118 underlying the first fin feature 104A, while the portion of the first semiconductor layer 302 in the second region 102B remains as semiconductor material or particularly, the semiconductor feature 120 underlying the second fin feature 104B.

It is further noted, even though the oxidation process is tuned to be selective, the oxidation rate of silicon is substantially less than that of SiGe but may not be zero. In this case, a semiconductor oxide (such as silicon oxide) layer 312 of the second semiconductor layer 304 is formed on the sidewalls of the first fin feature 104A and the sidewalls of the substrate in the first region 102A.

Figure 26:
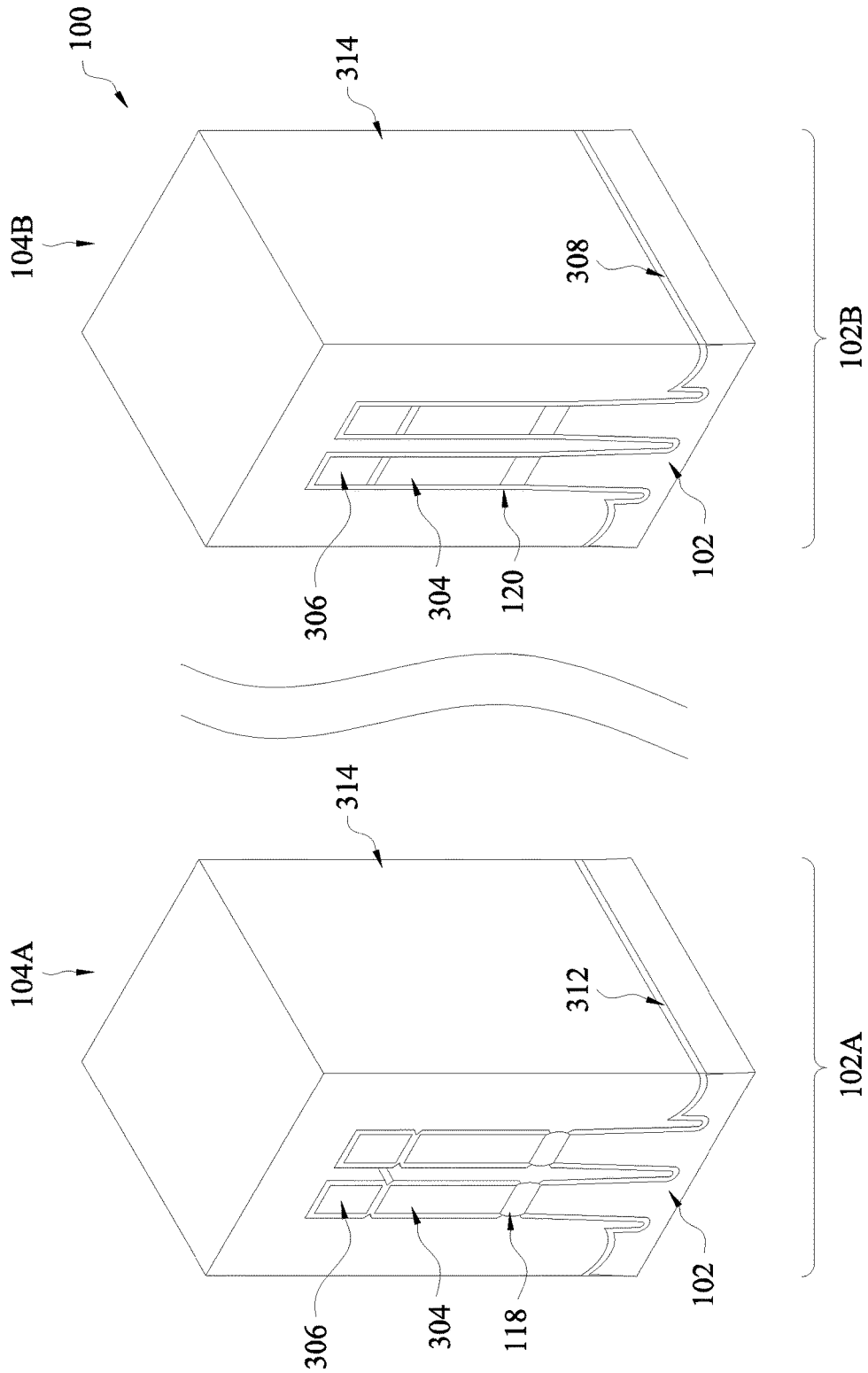
Figure 27:
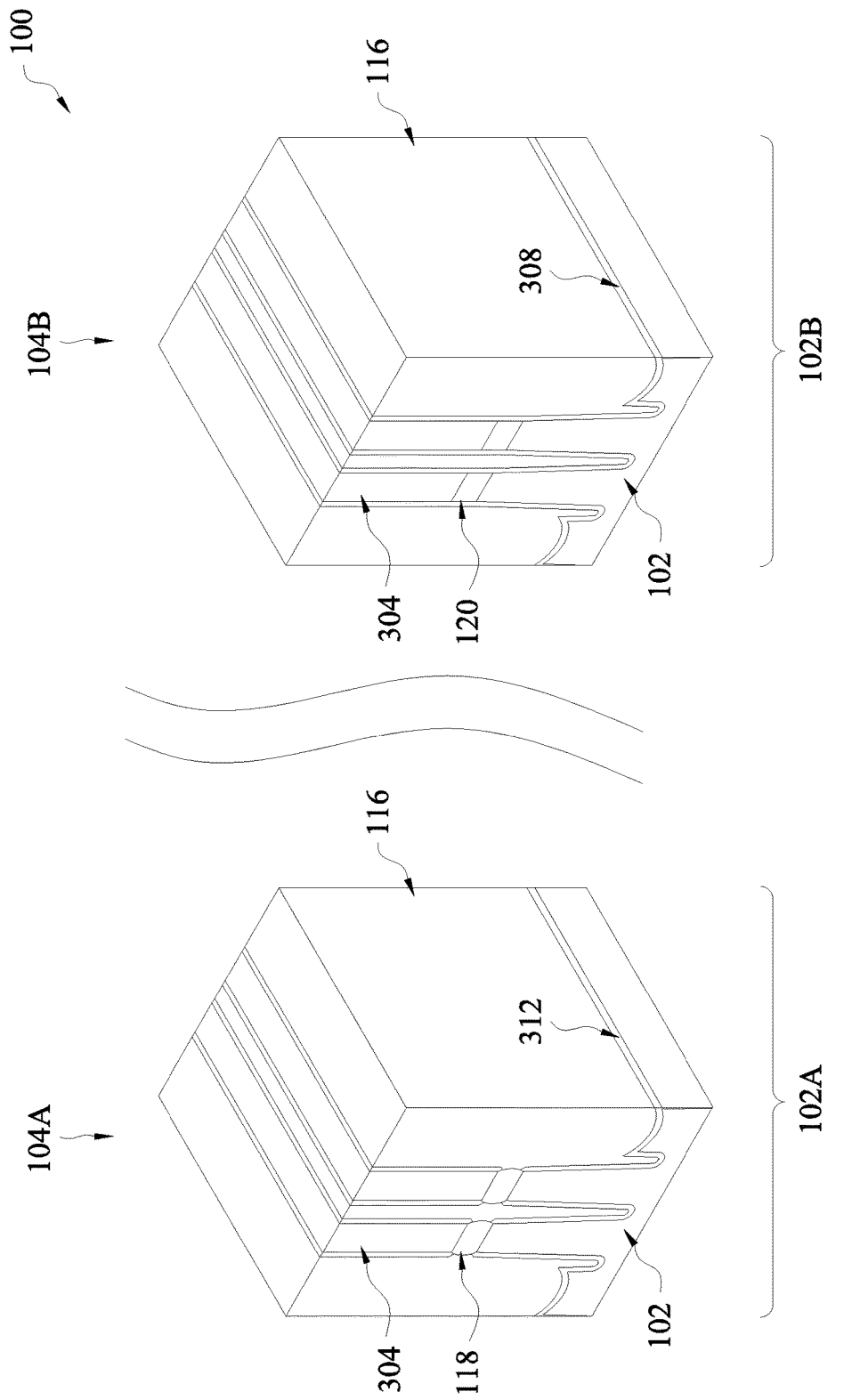

Referring to FIG. 19 and to FIGS. 26 and 27, the method 400 proceeds to an operation 214 by forming isolation features 116 on the substrate 102. Shallow trench isolation (STI) features or other type of isolation features may be formed between raised active regions of the fin structure 104 as shown in FIG. 10. The formation of the isolation features 314 includes deposition and polishing.

Referring to FIG. 26, a dielectric material 314 is deposited within the isolation feature trenches to form the isolation features. Suitable fill dielectric materials 314 include semiconductor oxides, semiconductor nitrides, semiconductor oxynitrides, FSG, low-K dielectric materials, and/or combinations thereof.

Referring to FIG. 27, the deposition of the dielectric material 314 may be followed by a CMP process. The CMP process may use the hard mask layers 306 as a polishing stop layer to prevent polishing the semiconductor layer 304. In the illustrated embodiment, the CMP process completely removes the hard mask layers 306, further embodiments, some portion of the hard mask layers 306 remain after the CMP process. In some embodiments, the CMP process includes two steps with different slurries tuned effectively remove the dielectric material 314 and the hard mask. In some embodiments, the CMP process is controlled with proper endpoint checking mechanism such that it stops after the hard mask layer 306 is removed.

Figure 28:
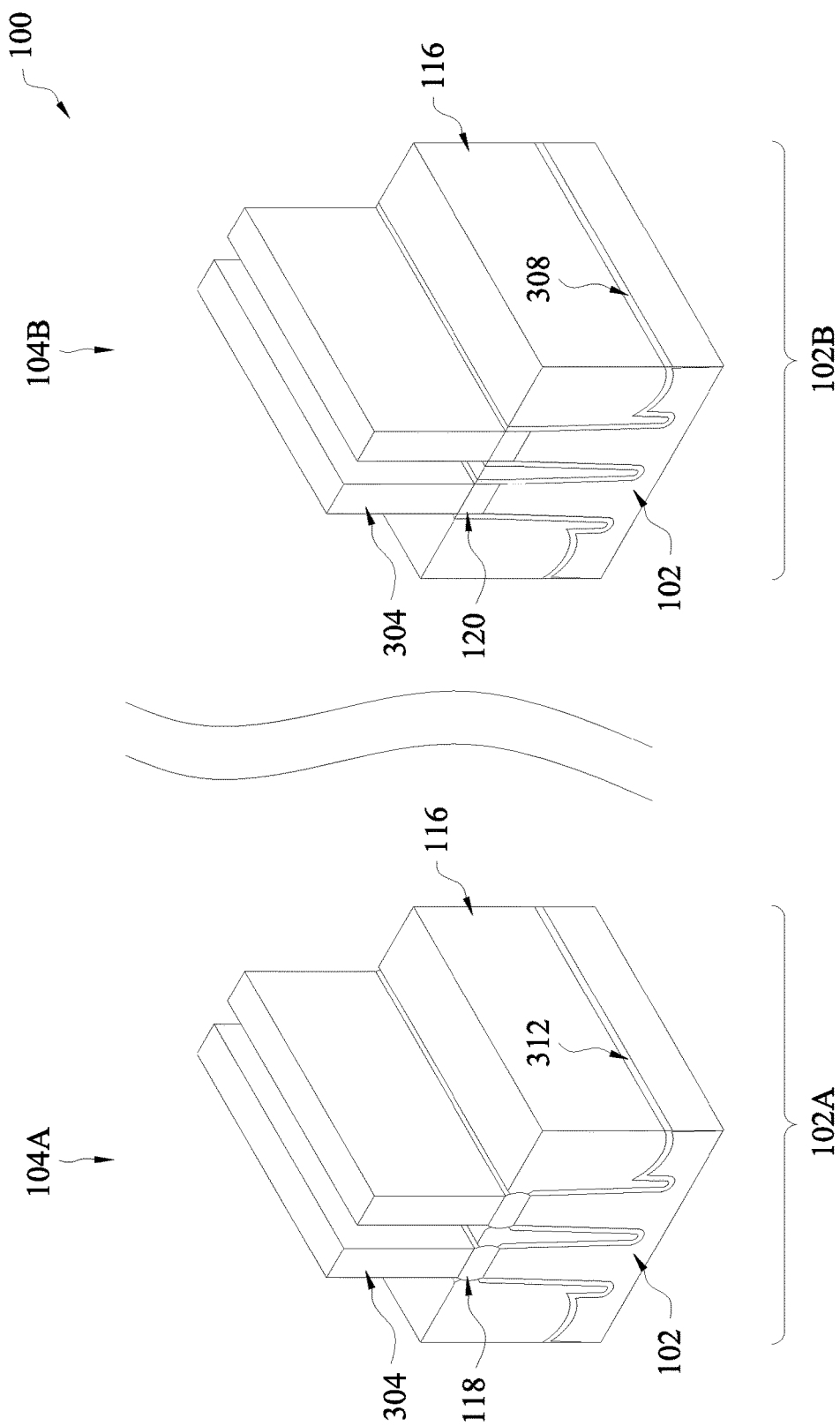

Referring to FIG. 19 and to FIG. 28, the method 400 proceeds to an operation 216 by recessing the isolation features 116 to expose the second semiconductor layer 304, thereby forming raised active regions or fin structure 104, such as the first features 104A and the second fin features 104B. In the illustrated embodiment, the fill material is recessed to expose the semiconductor layer 304 in its entirety. In this embodiment, the fill material 314 is recessed such that the upper surface of the fill material 314 is below the upper surfaces of the second semiconductor layer 304 with a distance tuned according to the desired fin height. Any suitable etching technique may be used to recess the fill material 314 including dry etching, wet etching, RIE, and/or other etching methods, and in an exemplary embodiment, an anisotropic dry etching is used to selectively remove the fill material 314 without etching the second semiconductor layer 304.

In the first region 102A, the first fin features 104A are electrically isolated from each other and from the substrate 102 by the buried isolation feature 118 and STI features 116. In the second region 102B, the second fin features 104B are electrically coupled to the substrate 102 through the semiconductor feature 120.

Figure 29:
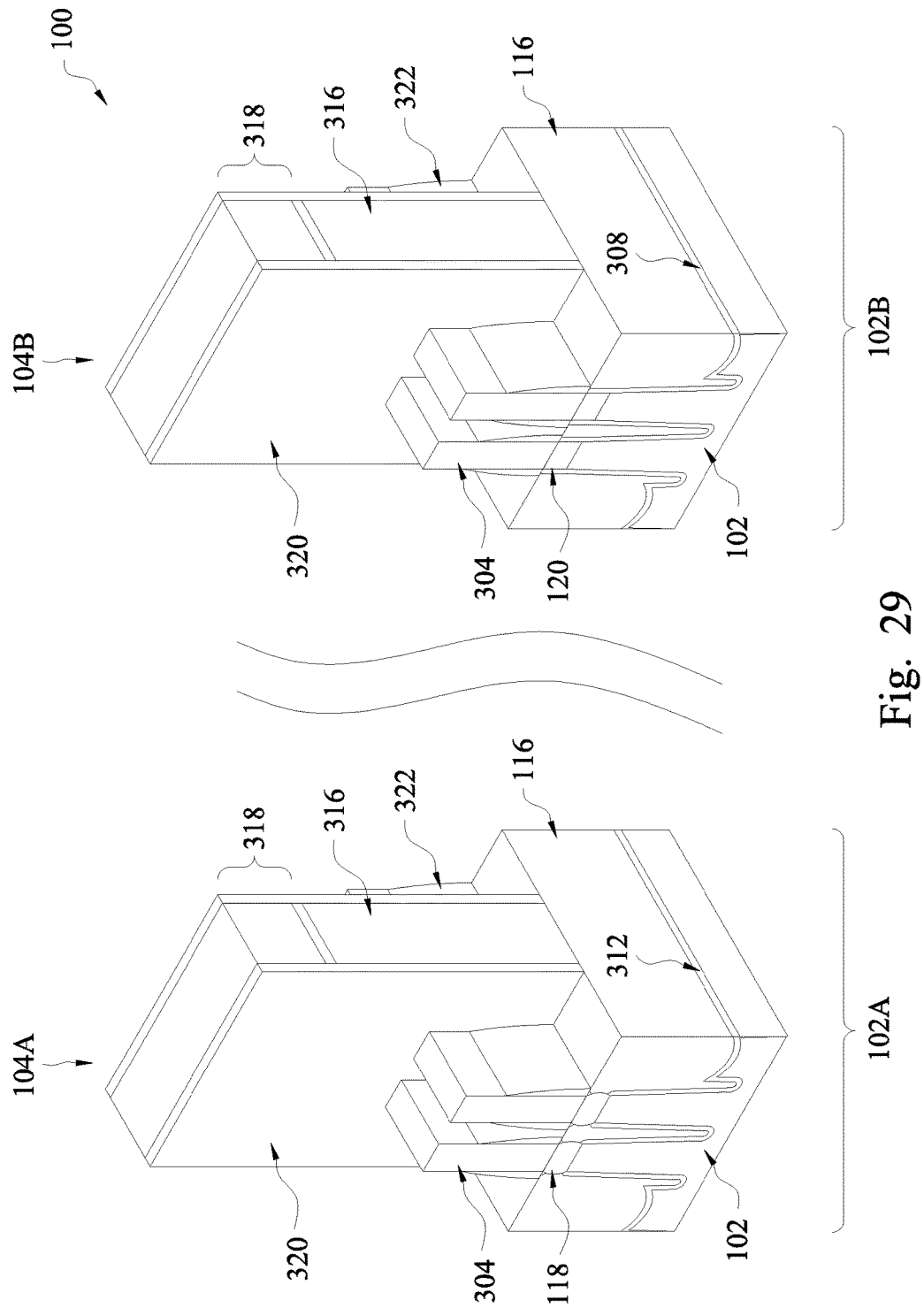
Figure 30:
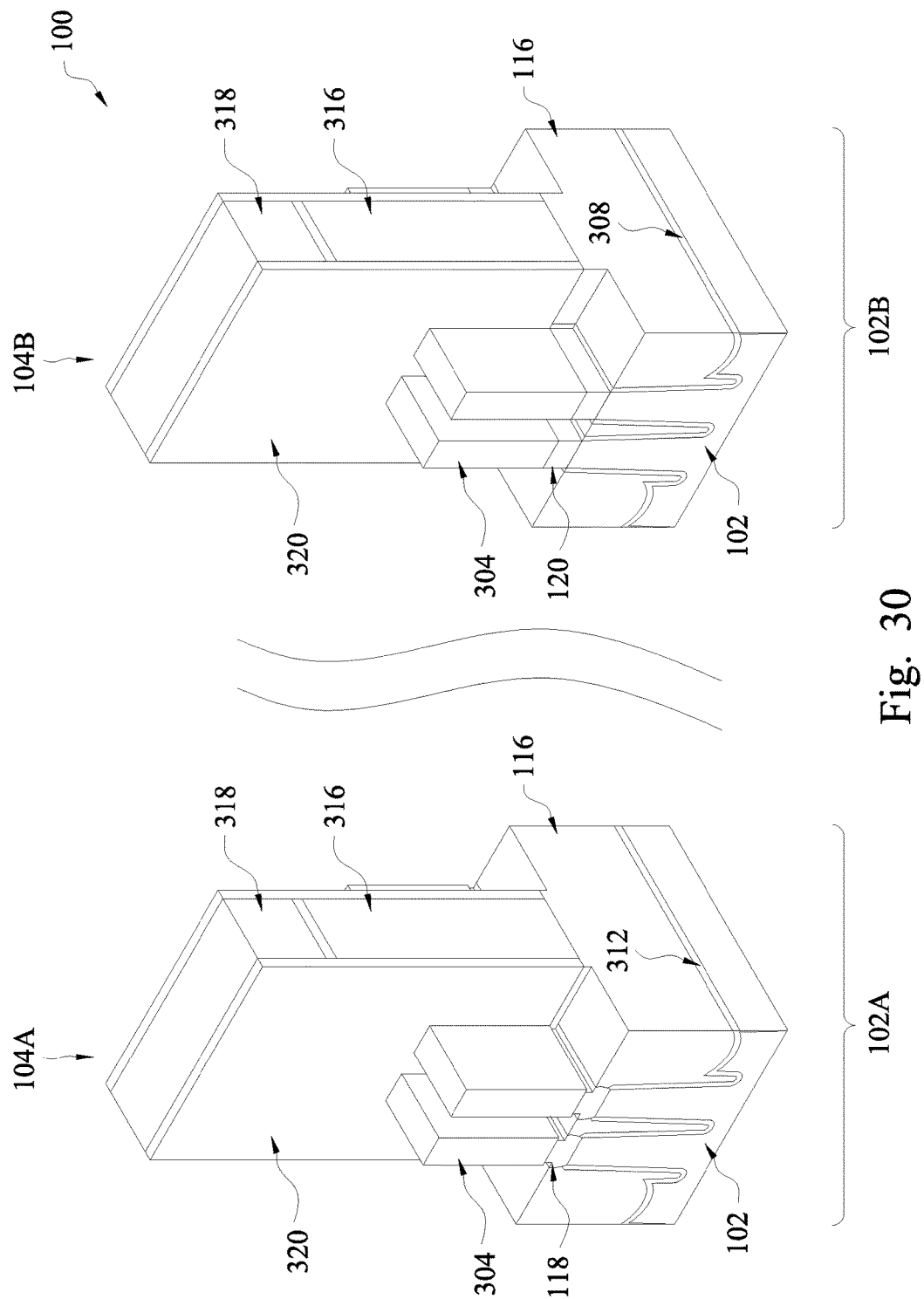
Figure 31:
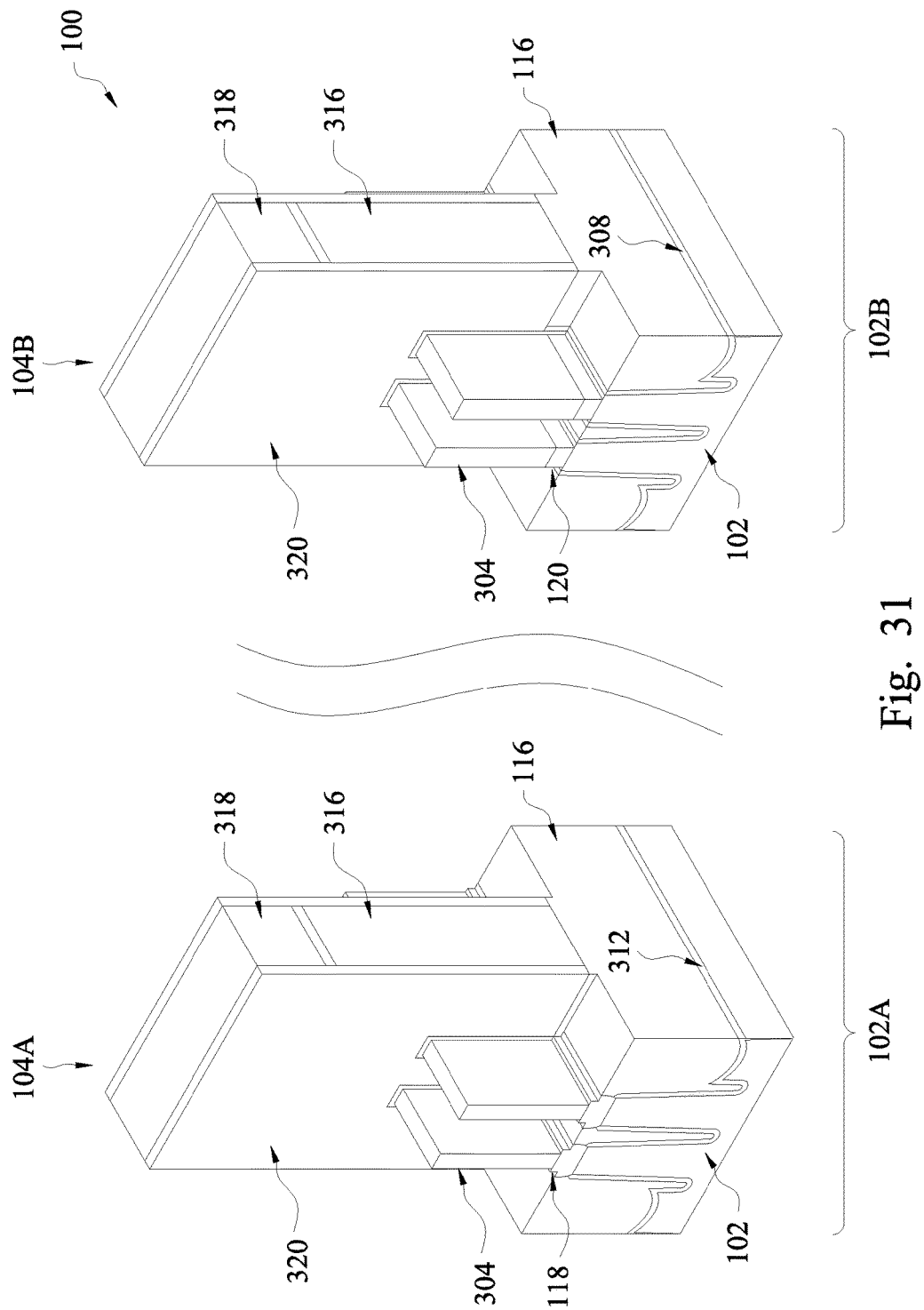

Referring to of FIG. 19 and to FIGS. 29 through 31, the method 400 proceeds to an operation 402 by forming dummy gates 316 and further recessing the isolation features 116. The dummy gates 316 are formed over the channel region 112 (the portions of the fin features covered by the dummy gates, respectively). Forming the dummy gate 316 may include depositing a dummy gate layer containing polysilicon or other suitable material and patterning the layer in a lithographic process. A gate hard mask layer 318 may be formed on the dummy gate 316.

In some embodiments, gate spacers 320 or sidewall spacers are formed on the sidewalls of the dummy gate 316. The gate spacers 320 may be used to offset the subsequently formed source/drain features and may be used for designing or modifying the source/drain structure (junction) profile. The gate spacers 320 may include any suitable dielectric material, such as a semiconductor oxide, a semiconductor nitride, a semiconductor carbide, a semiconductor oxynitride, other suitable materials, and/or combinations thereof. The formation of the gate spacer includes deposition and anisotropic etching, such as dry etching. When the spacers 320 are formed on the sidewalls of the dummy gates 316, spacers 322 are simultaneously formed on the sidewalls of the fin structure 104 as well.

Referring to FIG. 30, the fin spacers 322 are removed, such as for subsequent epitaxy growth to form the source and drain features. The removal of the fin spacers 322 is achieved by a proper etching procedure.

Still referring to FIG. 30, the isolation features 116 are further recessed such that the upper surface of the isolation features 116 is below the upper surface of the first semiconductor layer 302, particularly below the upper surfaces of the dielectric feature 118 and the semiconductor feature 120. In some embodiments, the after the further recessing of the isolation features 116, sidewalls of the dielectric feature 118 and the semiconductor feature 120 are completely exposed, or the upper surface of the isolation features 116 is coplanar with or below than the upper surface of the first semiconductor layer 302. The further recessing of the isolation features 116 may uses an etch process similar to the etching process used in the operation 216.

Referring to FIG. 31, the fin structure 104 may be trimmed to reduce the dimensions of the fin features, such as 104A and 104B, by an etching process. The etching process may be a wet etch, a dry etch, or a combination thereof. The etching process is designed with a suitable etchant to selectively etch the second semiconductor layer. For example, this etching process may be similar to the etching process used to pattern the semiconductor layer 304 at the operation 206.

Figure 32:
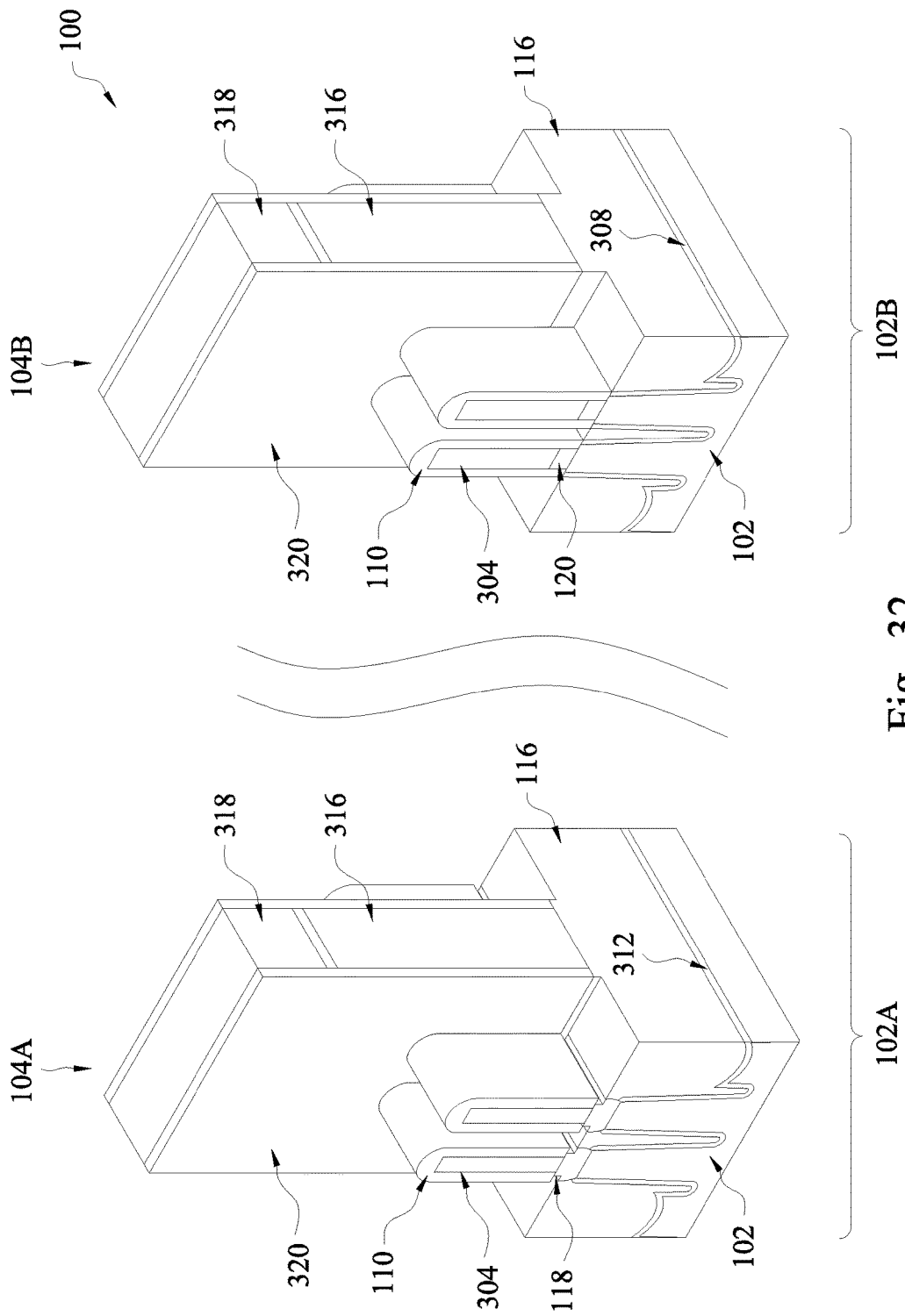
Figure 33:
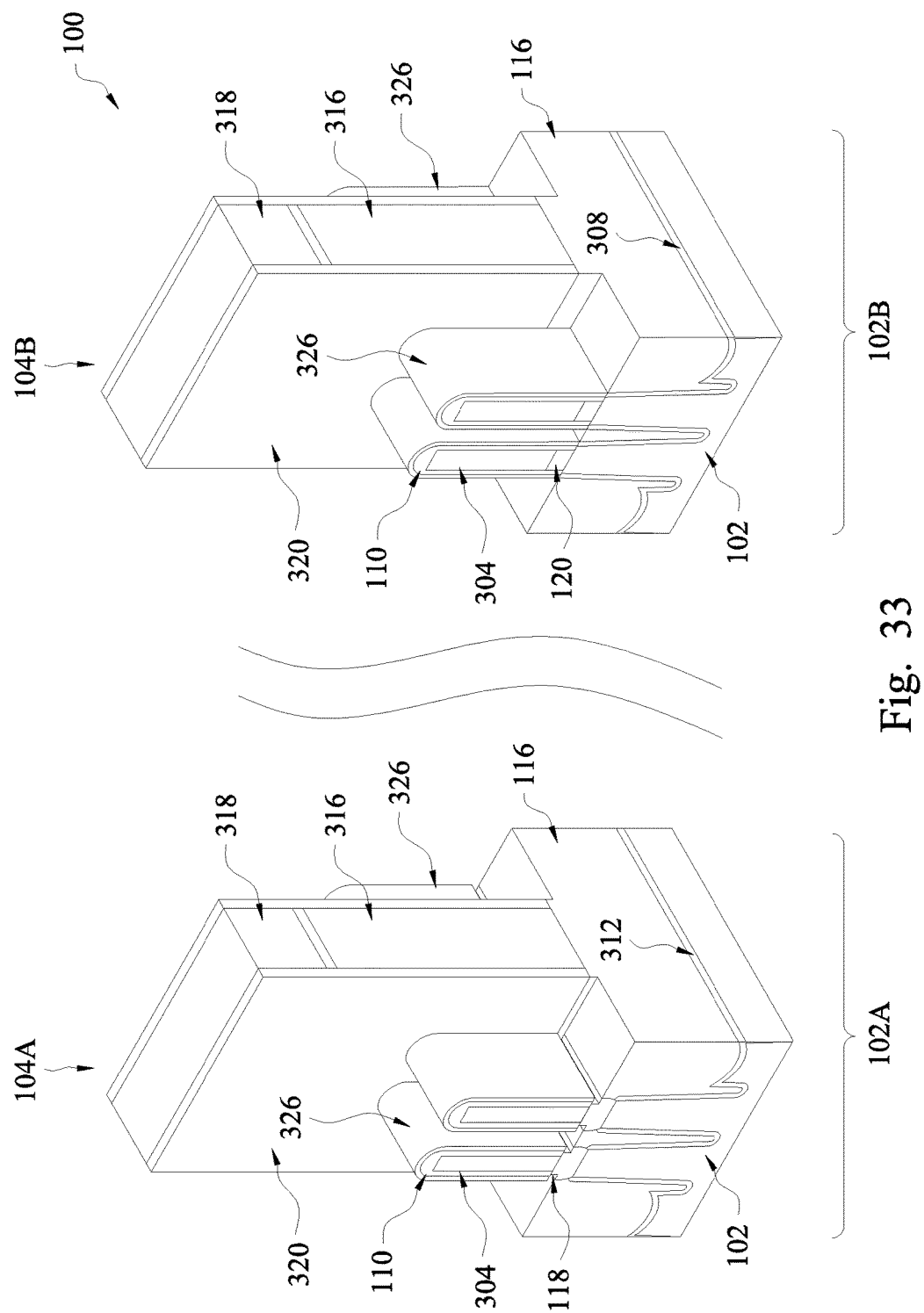

Referring to FIG. 19 and to FIGS. 32 and 33, the method 400 proceeds to an operation 220 by forming the source and drain features 110. The raised source/drain (S/D) features 110 are formed on the raised fin active regions. The dummy gate 316 and/or gate spacers 320 limit the source/drain features 110 to the source/drain regions. In many embodiments, the source/drain features 110 are formed by one or more epitaxy or epitaxial processes, whereby Si features, SiGe features, SiC features, and/or other suitable features are grown in a crystalline state on the fin structure 104. In the illustrated embodiments, since the fin spacers 322 are removed, the epitaxy growth are on top surfaces and sidewalls of the fin features, or surrounding (cladding) the fin features from various surfaces.

The source/drain features 110 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 110 are not in-situ doped, an implantation process (i.e., a junction implant process) is performed to dope the source/drain features 110. In an exemplary embodiment, the source/drain features 110 in an NMOS include SiCP or SiP, while those in a PMOS include GeSnB (tin may be used to tune the lattice constant) and/or SiGeSnB. One or more annealing processes may be performed to activate the source/drain features 110. Suitable annealing processes include rapid thermal annealing (RTA) and/or laser annealing processes.

Referring to FIG. 33, silicide features 326 may be formed on the source and drain features 110. The silicide features 326 may include such materials as nickel silicide, cobalt silicide, tungsten silicide, tantalum silicide, titanium silicide, platinum silicide, erbium silicide, palladium silicide, or combinations thereof. The silicide features 326 may be formed by silicidation such as self-aligned silicid, in which a metal is deposited, reacted with silicon during an annealing process, and then the unreacted metal is removed by etch. Particularly, after the metal deposition, temperature is raised to for annealing to enhance reaction between Si and metal to form silicide, finally unreacted metal may be etched away. Annealing may be one step or multi-step annealing depending on metal material and other conditions. Alternatively, the silicide features 326 may be formed by a procedure including silicide deposition, such as CVD, PVD, or ALD.

Figure 34:
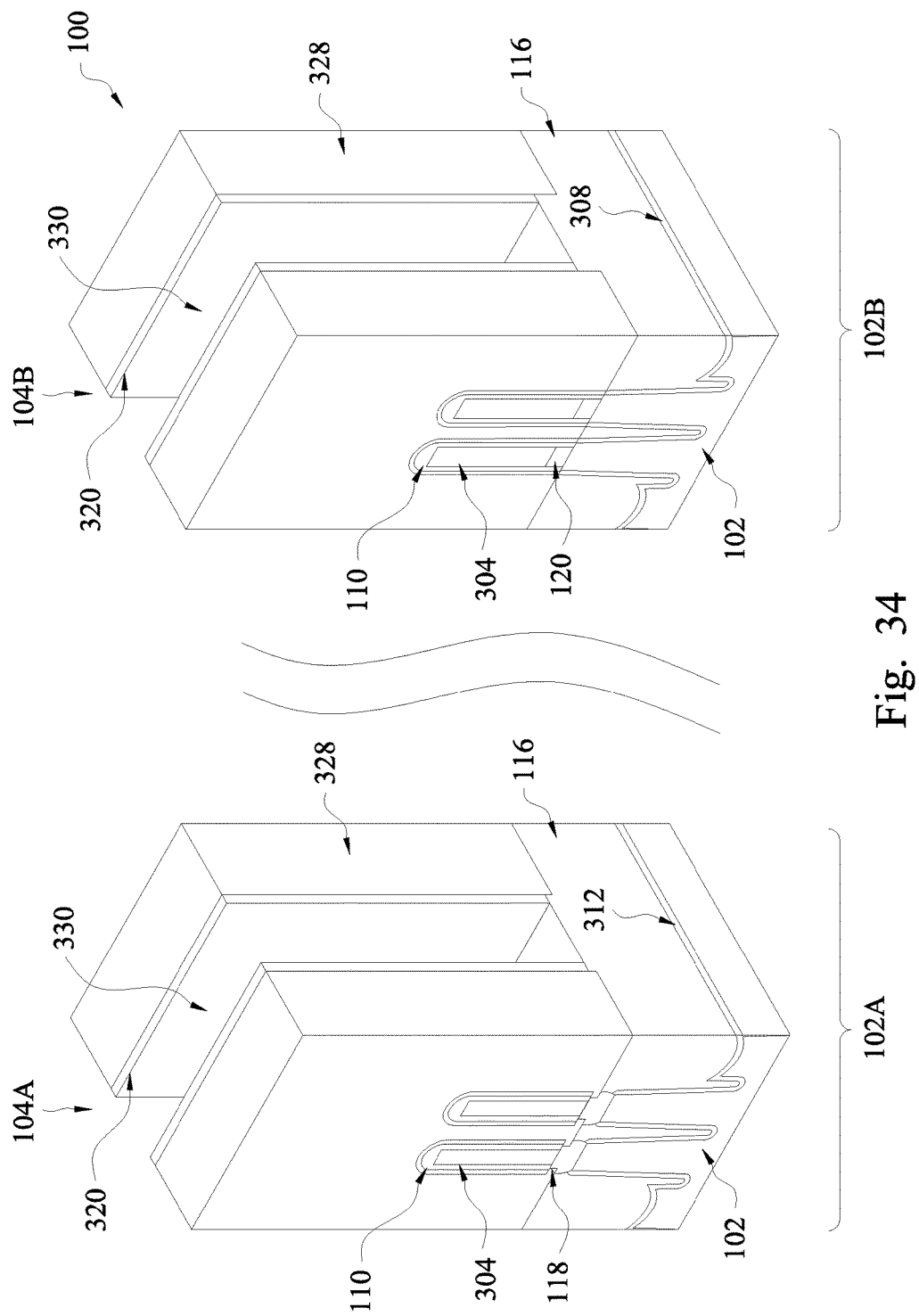

Referring to FIG. 19 and to FIG. 34, the method 400 proceeds to an operation 222 by forming an inter-level dielectric (ILD) 328 on the substrate 102. Particularly, the ILD 328 is formed on the source/drain features 110 in the source/drain regions. The ILD 328 may surround the dummy gates 316 and/or gate spacers 320 allowing these features to be removed and replacement gates to be formed in the resulting cavity. The ILD 328 may include any suitable dielectric material, such as a semiconductor oxide, a semiconductor nitride, a semiconductor oxynitride, a semiconductor carbide, other suitable materials, and/or combinations thereof. In some embodiments, the formation of the ILD 328 includes deposition and CMP. The ILD layer 328 may also be part of an electrical interconnect structure that electrically interconnects the devices of the workpiece. In such embodiments, the ILD 328 acts as an insulator that supports and isolates the conductive traces.

Referring to FIG. 19 and to FIG. 34, the method 400 proceeds to an operation 224 by removing the dummy gates 316. The dummy gates 316 are removed after depositing the ILD layer 328, resulting in gate trenches (cavities) 330 in the ILD layer 328, as shown in FIG. 34.

Figure 35:
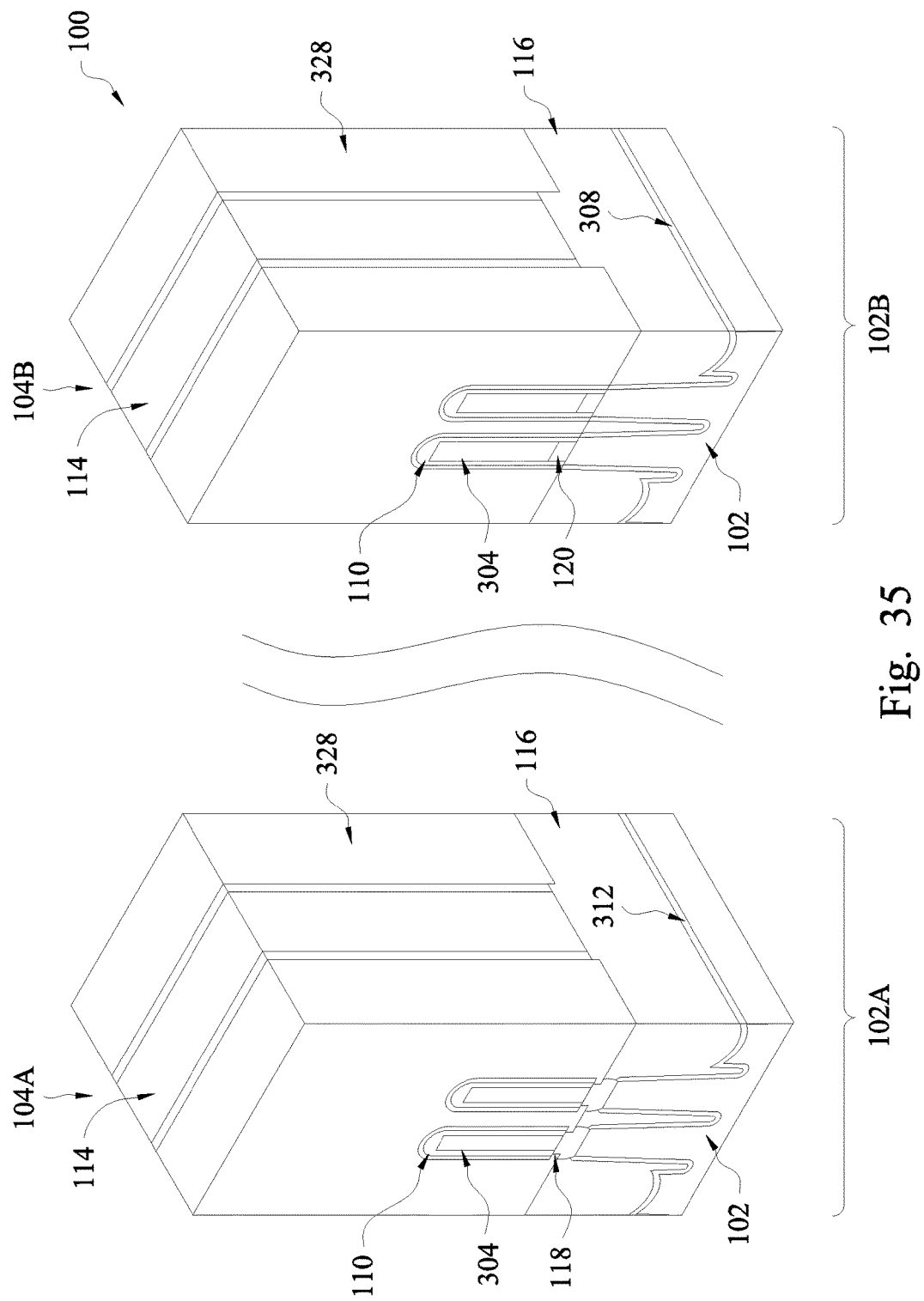

Referring to FIG. 19 and to FIG. 35, the method 400 proceeds to an operation 226 by forming gate stacks 114 on the workpiece 100. The gate stacks 114 are formed on the workpiece 100 wrapping around the channel regions 112 of the fin structure 104. The gate stacks 114 are formed in the gate trenches 330 by a procedure, such as a procedure that includes deposition and CMP. Although it is understood that the gate stacks 114 may be any suitable gate structure, in some embodiments, gate stack 114 is a high-k metal gate that includes a gate dielectric layer, and a gate electrode layer that each may include a number of sub-layers.

Figure 35A:
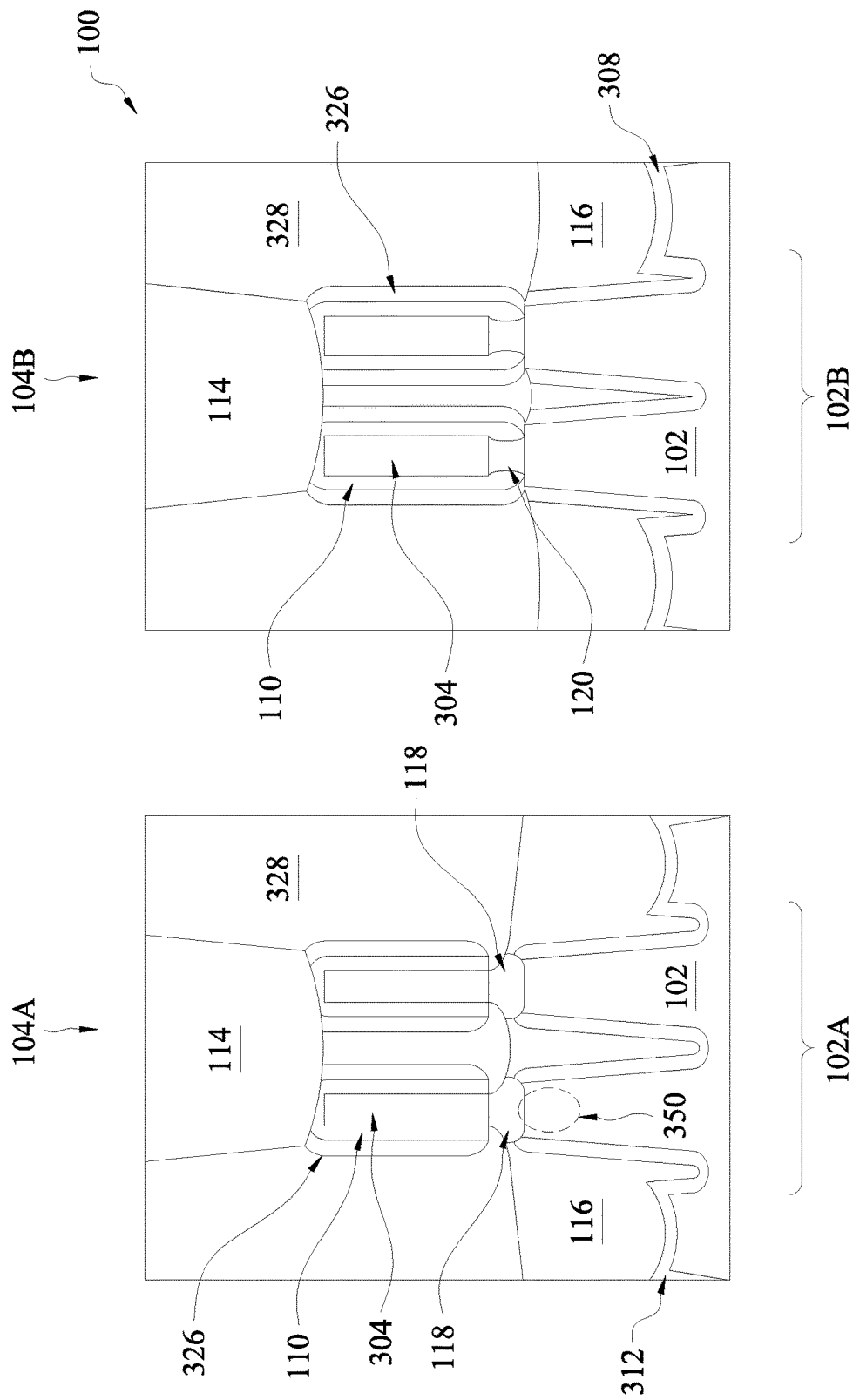
FIG. 35A is a sectional view of the semiconductor structure of FIG. 35, constructed in accordance with some embodiments.

FIG. 35A is a sectional view of the semiconductor structure 100, constructed in accordance with some embodiments. The first fin feature 104A includes the buried isolation semiconductor feature 118 while the second feature 104B includes the semiconductor feature 120. The buried isolation feature 118 has an upper surface higher than the upper surface of the isolation feature 116. The buried isolation feature 118 is formed from a semiconductor material of the second semiconductor material by a selective oxidation process that is tuned to oxidize the second semiconductor material but not oxidize the third semiconductor material. Especially, the buried isolation feature 118 is converted from a portion of a semiconductor layer of the second semiconductor material that forms the semiconductor feature 120. The buried isolation feature 118 has a first thickness T1 and the semiconductor feature 120 has a second thickness T2 different from the first thickness T1. In the present embodiment, the second thickness T2 is less than the first thickness T1. In furtherance of the embodiment, the first thickness T1 is about twice of the second thickness T2, within a variation less than 30%, or preferably less than 10%. In some embodiments, the first thickness T1 ranges from 10 nm to 30 nm and the second thickness T2 ranges from 5 nm to 15 nm. Furthermore, the source and drain features 110 surround the semiconductor feature 120 in the second region 102B and contact the sidewalls of the semiconductor feature 120. In the illustrated embodiment, the silicide features 326 have a bottom surface being coplanar with the bottom surface of the semiconductor feature 120. In the first region 102A, the buried isolation feature 118 is below the source/drain features 110, and is at least partially surrounded by the ILD 328. Furthermore, an APT feature 350 formed by APT ion implantation at the block 202 is disposed in the substrate 102 and is underlying the buried isolation feature 118.

Figure 36:
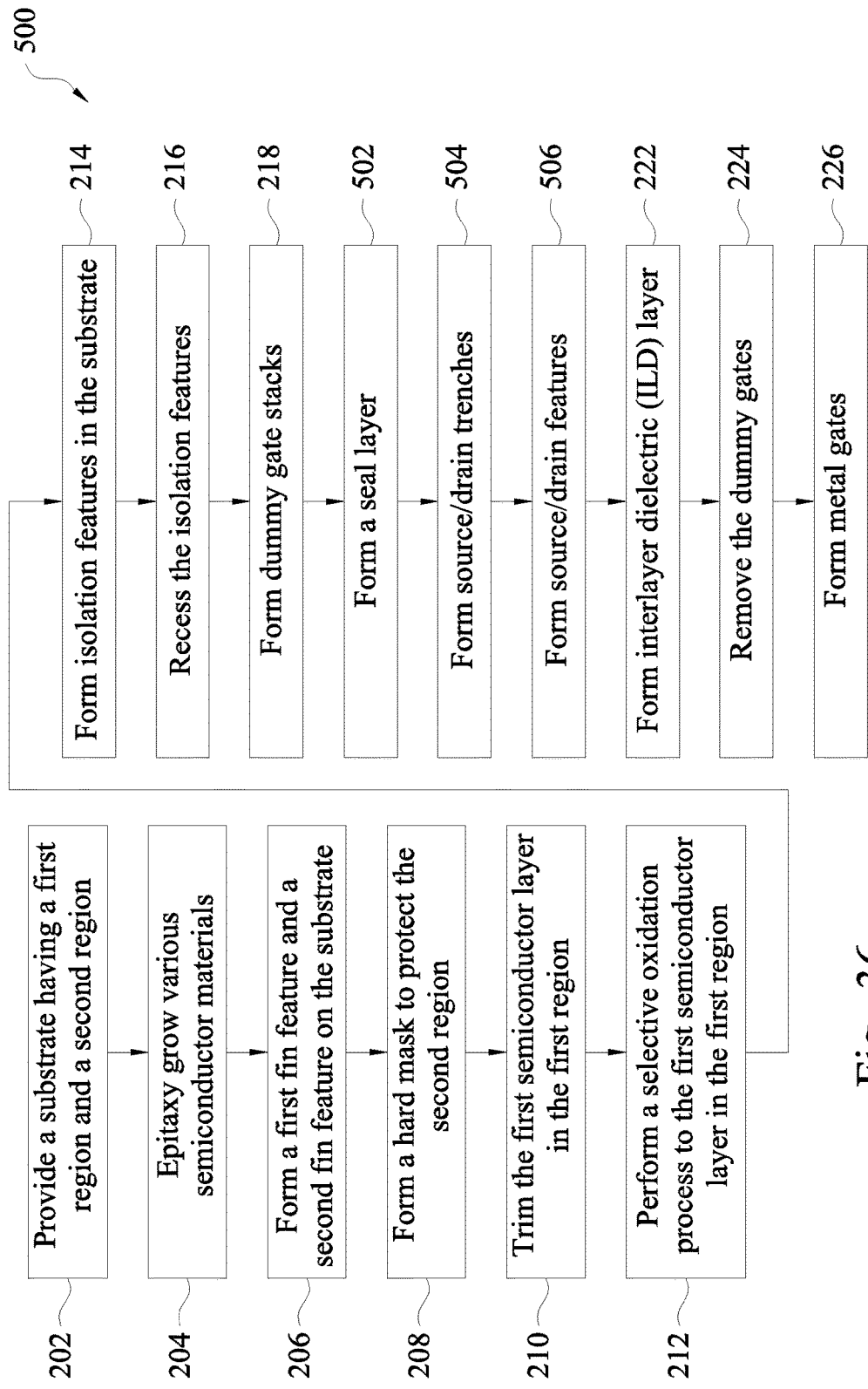
FIG. 36 is a flowchart of an integrated circuit fabrication method in accordance with some embodiments.

According to some other embodiments, methods of forming the workpiece 100 are described with reference to FIGS. 36-55. FIG. 36 is a flowchart of a method 500 for fabricating a FinFET or other fin-based device on a workpiece 100 according to various aspects of the present disclosure. The figures that follow refer perspective views of the workpiece 100, and/or cross-sections taken through the channel region 112 (e.g., along plane 122) or through the source/drain regions 110 (e.g., along plane 124) of the FinFET device 106. It is understood that additional steps can be provided before, during, and after the method 500 and that some of the steps described can be replaced or eliminated for other embodiments of the method. The method 500 is similar to the method 200. The similar description is not repeated for simplicity.

Referring first to FIG. 36 and to FIG. 37, a workpiece 100 is received a substrate 102 having the first region 102A and the second region 102B. Suitable substrates 102 include a bulk silicon substrate, or alternatively, the substrate 102 may include an elementary semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. The received workpiece 100 may have one or more dopants already introduced upon it. In the illustrated embodiment, the workpiece 100 includes an APT dopant introduced to the substrate 102 within the first region 102A by an ion implantation process 252.

Figure 38:
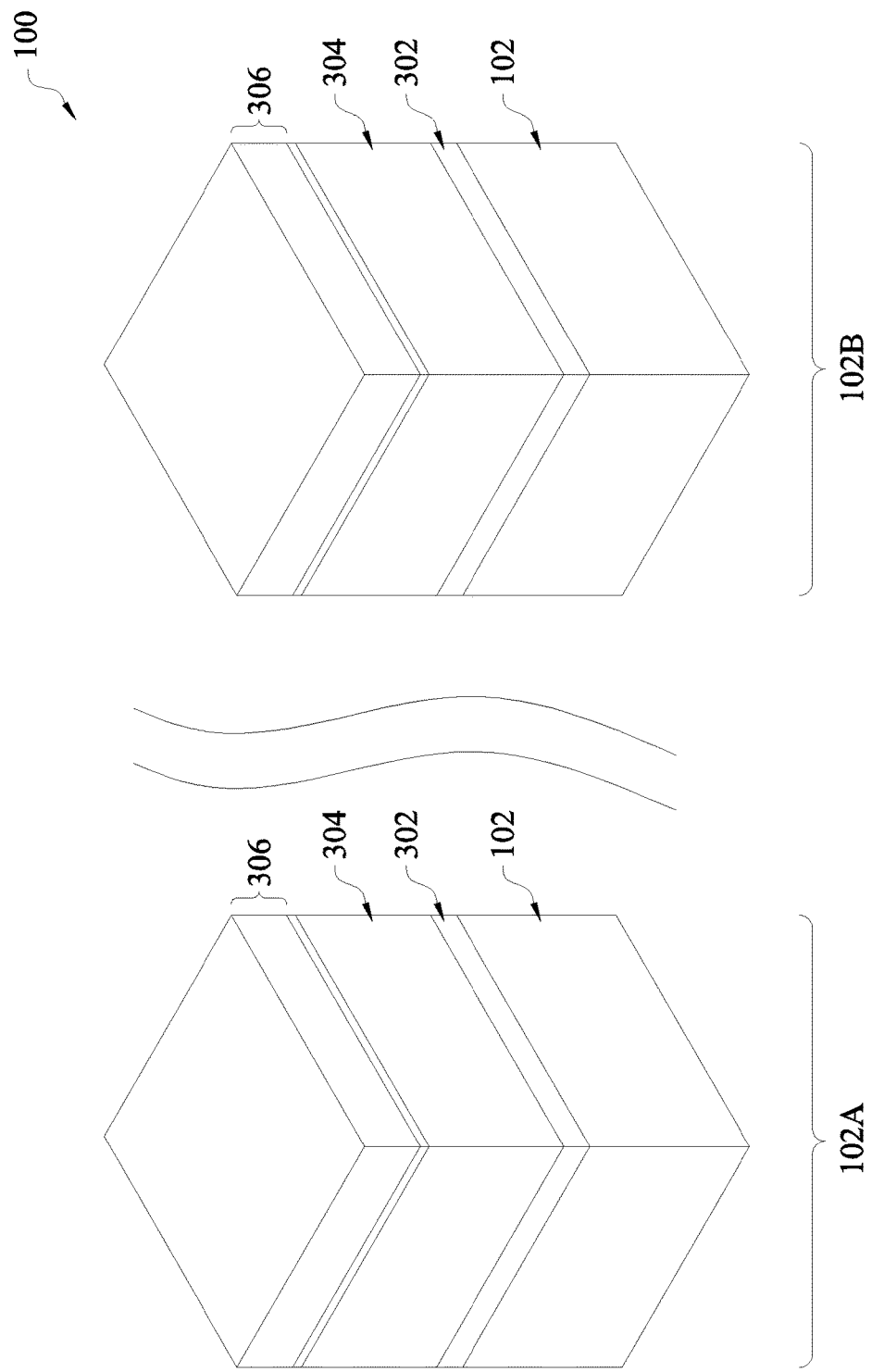

Referring FIG. 36 and to FIG. 38, the method 500 includes an operation 204 by epitzxy grow various semiconductor material layers on the substrate 102. In the illustrated embodiment, a first semiconductor layer 302 formed on the substrate 102 and a second semiconductor layer 304 formed on the first semiconductor layer 302. The first semiconductor layer 302 includes a first semiconductor material and the second semiconductor layer 304 includes a second semiconductor material different from the first semiconductor material. The first and second semiconductor layers epitaxially grown by suitable techniques, such as SEG.

Figure 39:
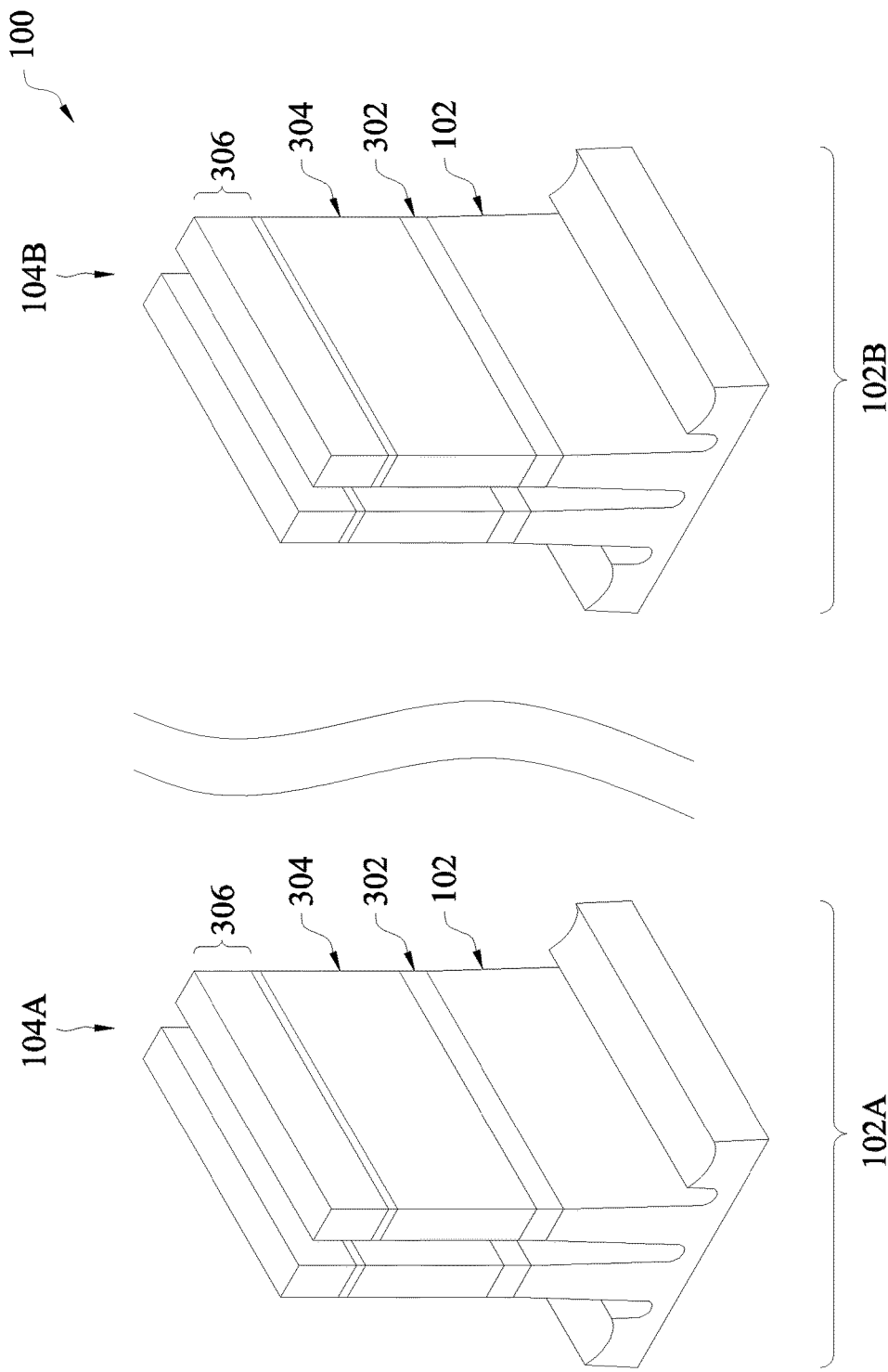

Referring to FIGS. 36 and 39, the method 500 includes an operation 206 by forming the fin structure 104 on the substrate, particularly forming the fin structure having the first fin feature 104A in the first region 102A and the second fin feature 104B in the second region 102B. In the present embodiment for illustration, two exemplary fin features 104A are formed in the first region 102A and two exemplary fin features 104B are formed in the second region 102B.

Figure 40:
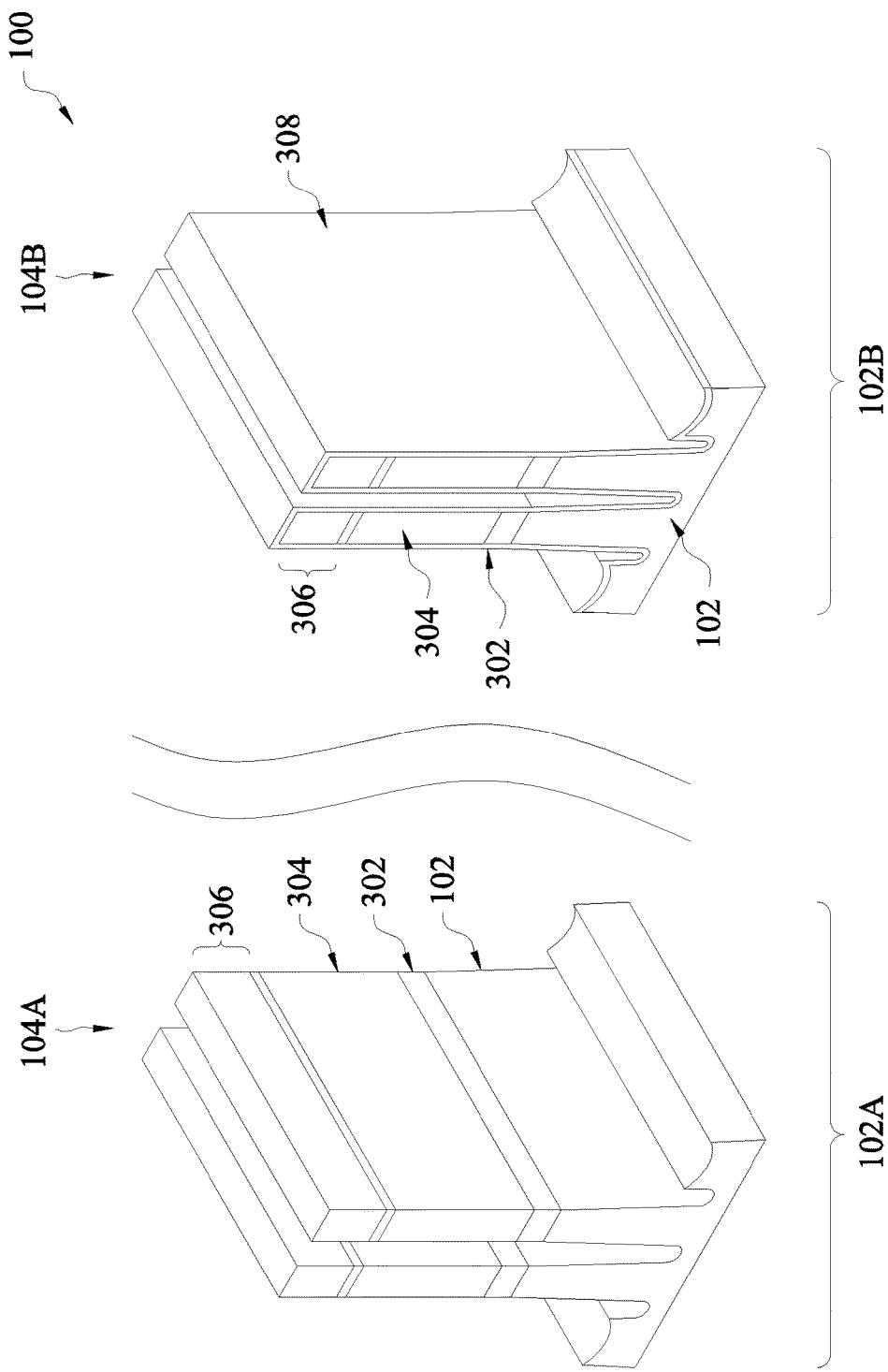

Referring to FIG. 36 and to FIG. 40, the method 500 proceeds to an operation 208 by forming a liner (or second hard mask) 308 to protect the second region 102B. The formation of the hard mask 308 includes deposition and patterning, which is similar to the formation of the hard mask 306. However, the hard mask 306 is a planar layer while the hard mask 308 is three dimensional. The hard mask 308 is patterned to cover the second region 102B and has an opening to expose the first region 102A. In the second region 102B, the hard mask 308 is conformal to the fin feature 104B such that the sidewalls of the second fin feature 104B are also covered thereby.

Figure 41:
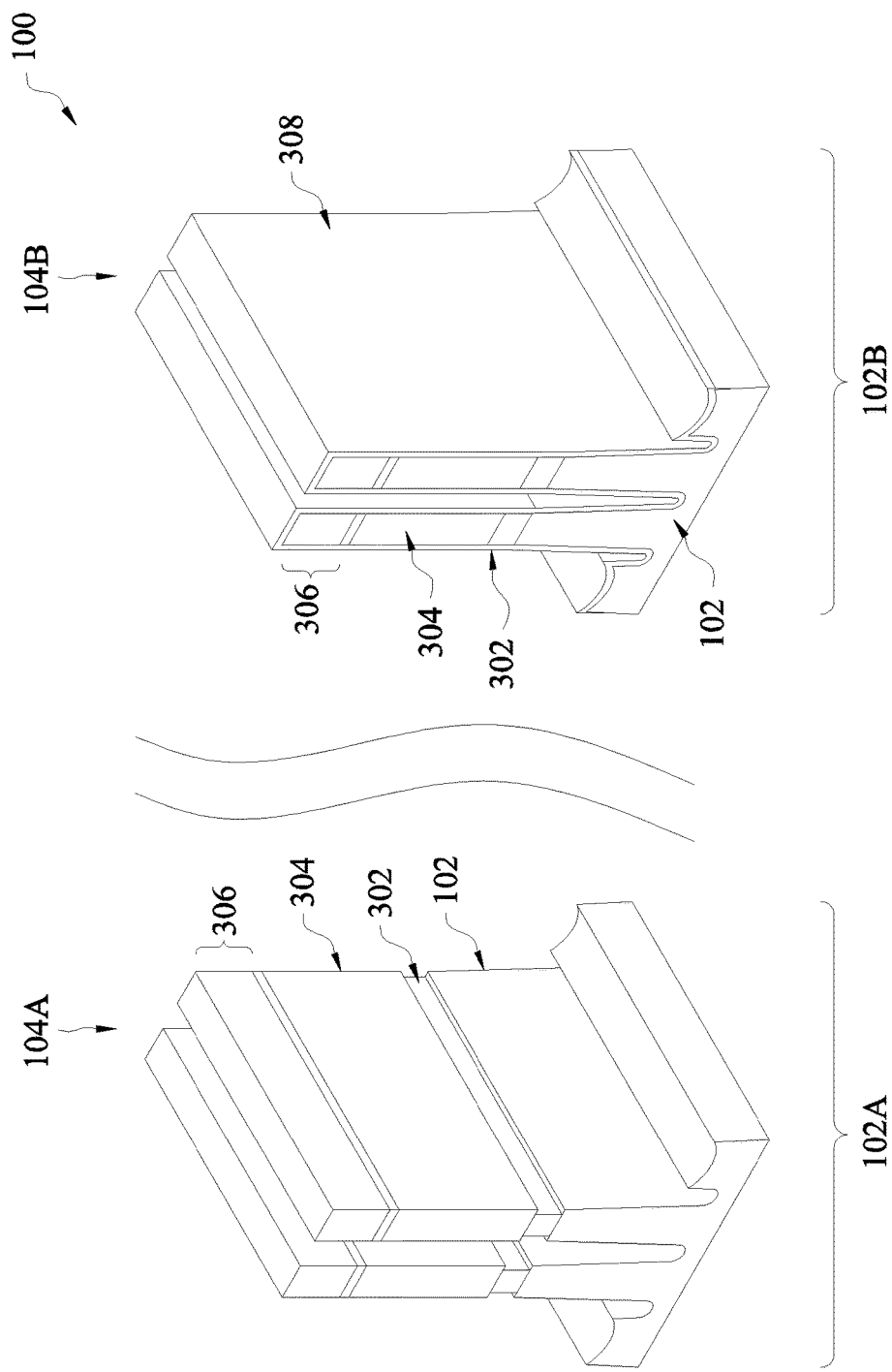

Referring to FIG. 36 and to FIG. 41, the method 500 may proceed to an operation 210 by trimming the first semiconductor layer 302 in the first region 102A, thereby the first semiconductor layer 302 in the first region 102A is recessed horizontal from the sidewalls of the first fin feature 104A. In the present embodiment, the recessed dimension is controlled such that the oxidized feature at later stage fits in the same space. In some embodiments, the trimming process is an etching process designed with an etchant to selectively etch the first semiconductor material of the first semiconductor layer 302 but substantially not etch the second semiconductor material of the second semiconductor layer 304. In some examples, the trimming process may include wet etch, dry etch or a combination thereof.

Figure 42:
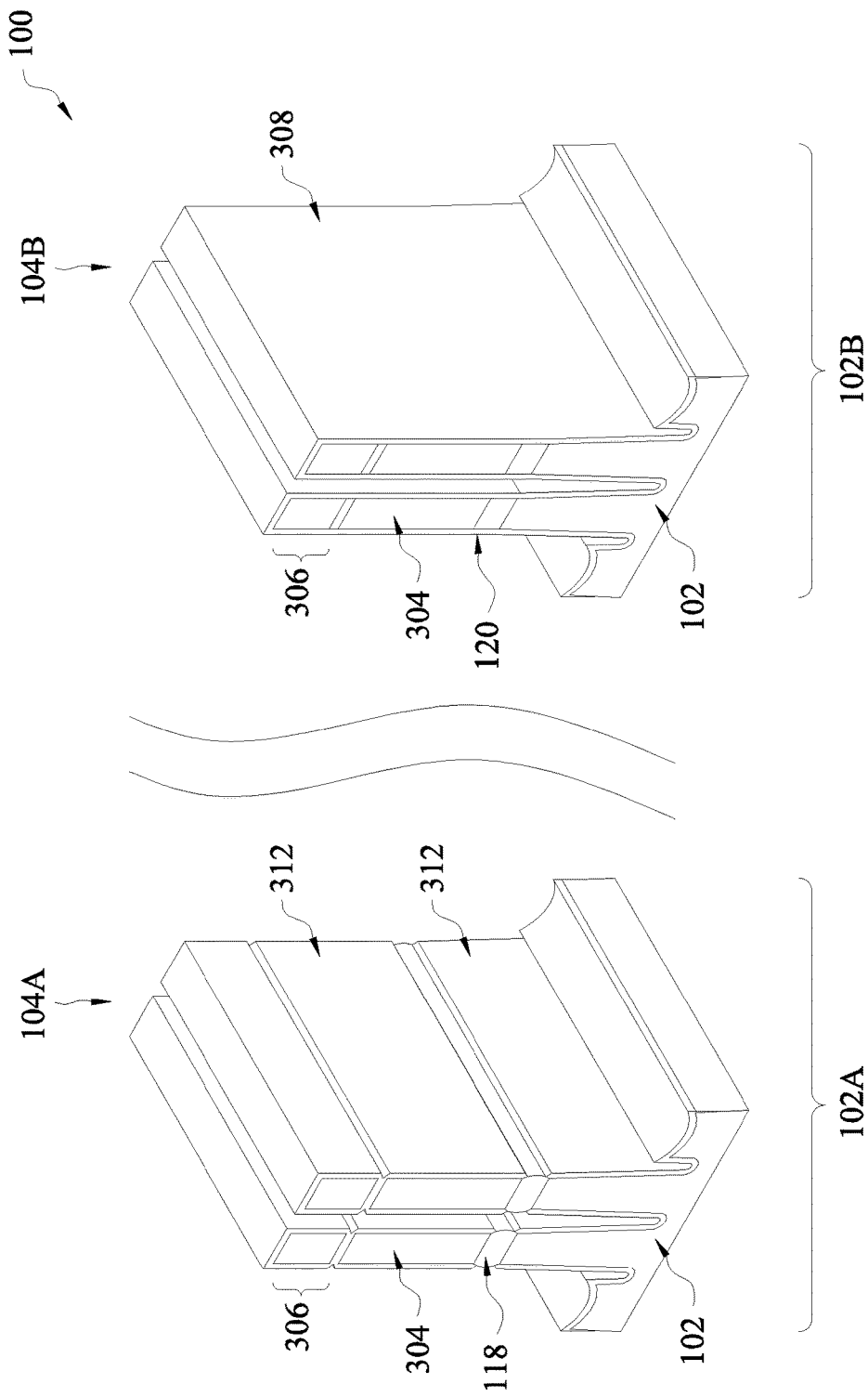

Referring to FIG. 36 and to FIG. 42, the method 500 proceeds to an operation 212 by performing a selective oxidation process to the first semiconductor layer 302 in the first region 102A. The selective oxidation process is designed to selectively oxidize the first semiconductor material of the first semiconductor layer 302 but not the second semiconductor material of the second semiconductor layer 304. In the present example, the first semiconductor material is silicon germanium and the second semiconductor material is silicon. It is found that SiGe and Si have different oxidation rates and different oxidation behaviors, such as temperature dependences. In one example, the oxidation temperature is tuned and chosen in the range between 400° C. and 600° C., the corresponding oxidation process is selective and substantially oxidizes SiGe but substantially does not oxidize Si. Accordingly, the first semiconductor layer 302 is converted into a dielectric material by the selective oxidation. Second, since the second region 102B is covered the patterned hard mask 308, which functions as an oxidation mask and protects the portion of the first semiconductor layer 302 within the second region from oxidation. Thus, with the selective oxidation process using the hard mask 308, the portion of the first semiconductor layer 302 in the first region 102A is converted to a dielectric layer or particularly, the dielectric feature (buried isolation feature) 118 underlying the first fin feature 104A, while the portion of the first semiconductor layer 302 in the second region 102B remains as semiconductor material or particularly, the semiconductor feature 120 underlying the second fin feature 104B.

It is further noted, even though the oxidation process is tuned to be selective, the oxidation rate of silicon is substantially less than that of SiGe but may not be zero. In this case, a semiconductor oxide (such as silicon oxide) layer 312 of the second semiconductor layer 304 is formed on the sidewalls of the first fin feature 104A and the sidewalls of the substrate in the first region 102A.

Figure 43:
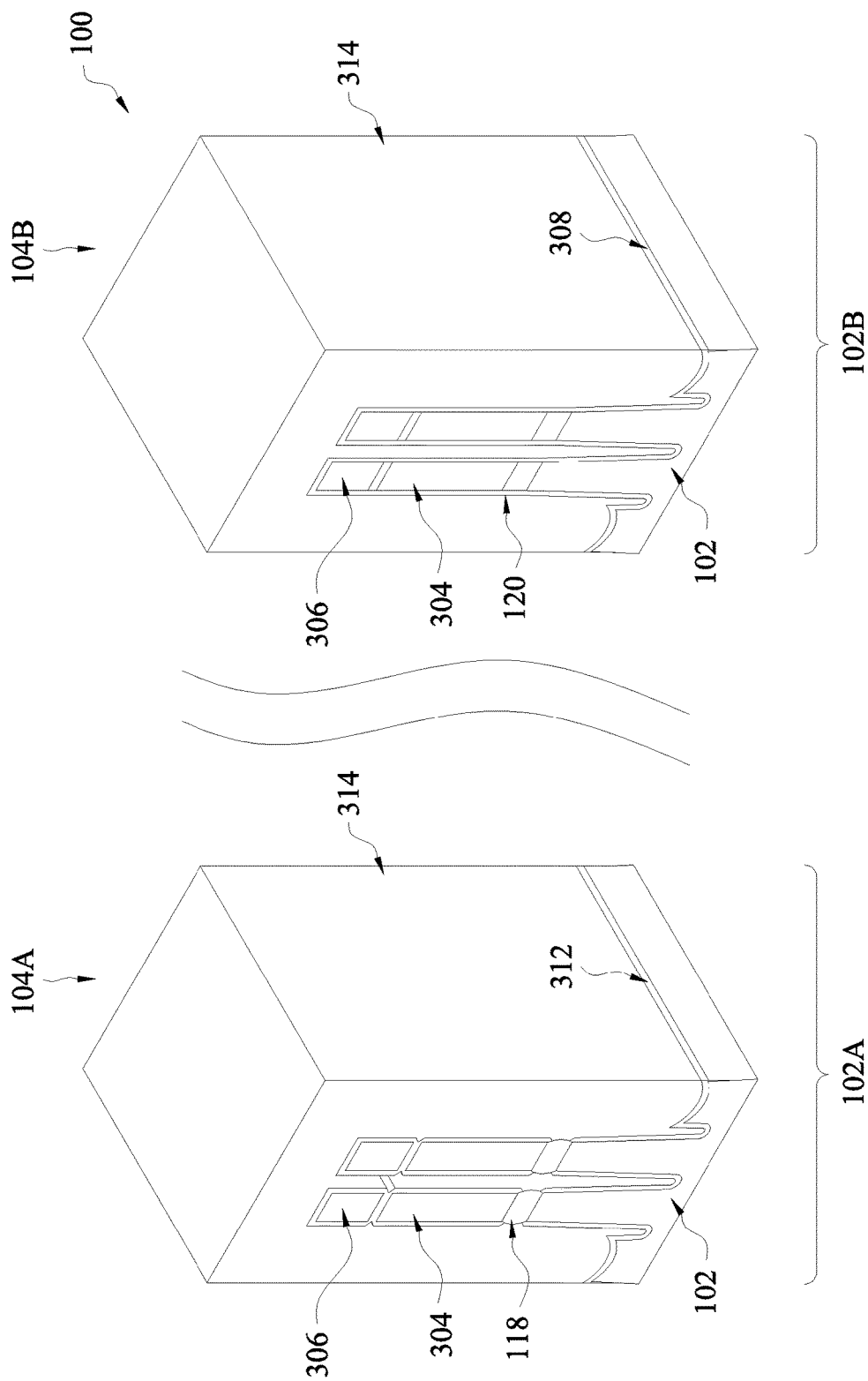
Figure 44:
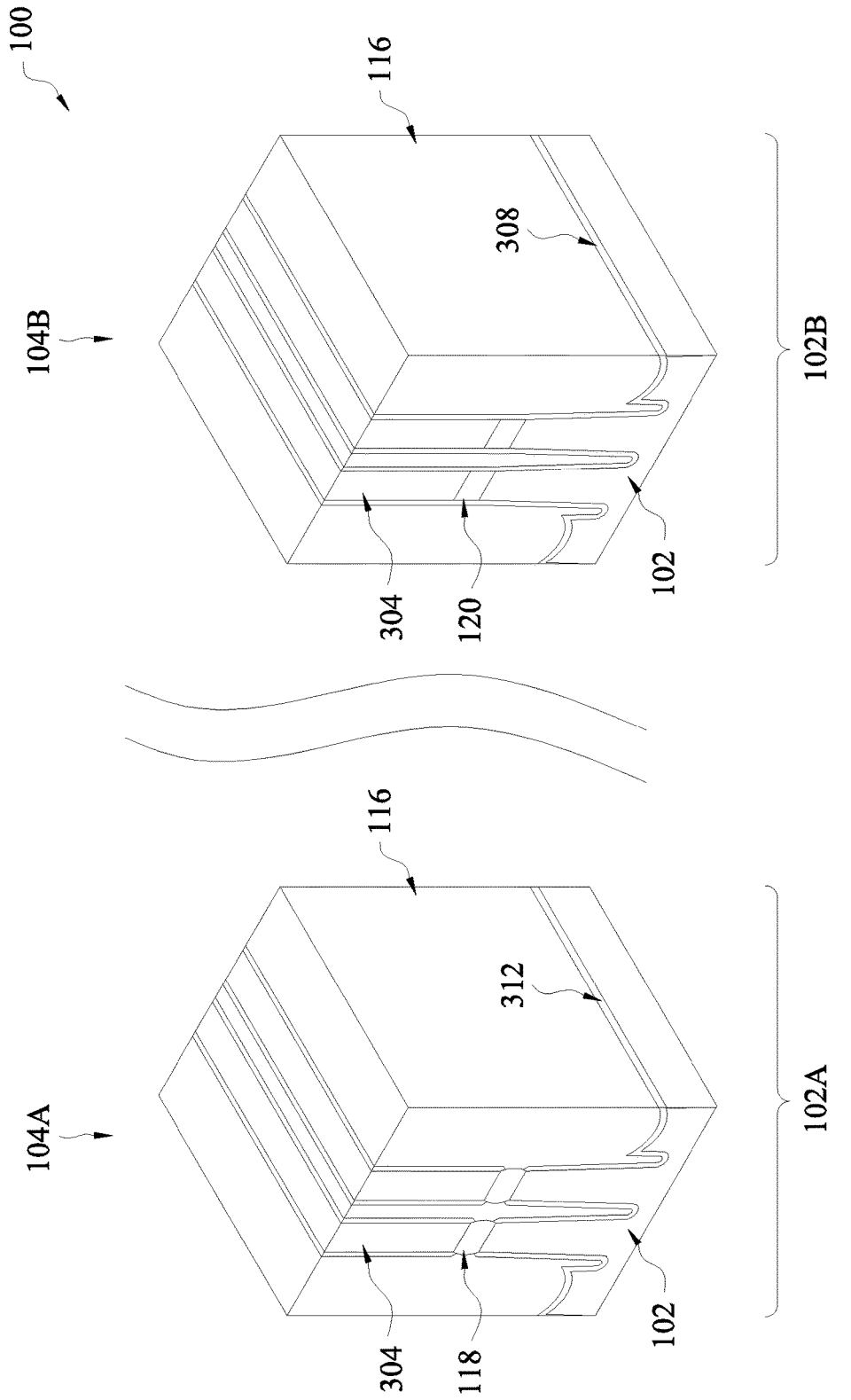

Referring to FIG. 36 and to FIGS. 43 and 44, the method 500 proceeds to an operation 214 by forming isolation features 116 on the substrate 102. Shallow trench isolation (STI) features or other type of isolation features may be formed between raised active regions of the fin structure 104 as shown in FIG. 10. The formation of the isolation features 314 includes deposition and polishing.

Referring to FIG. 43, a dielectric material 314 is deposited within the isolation feature trenches to form the isolation features. Suitable fill dielectric materials 314 include semiconductor oxides, semiconductor nitrides, semiconductor oxynitrides, FSG, low-K dielectric materials, and/or combinations thereof.

Referring to FIG. 44, the deposition of the dielectric material 314 may be followed by a CMP process. The CMP process may use the hard mask layers 306 as a polishing stop layer to prevent polishing the semiconductor layer 304. In the illustrated embodiment, the CMP process completely removes the hard mask layers 306, further embodiments, some portion of the hard mask layers 306 remain after the CMP process. In some embodiments, the CMP process includes two steps with different slurries tuned effectively remove the dielectric material 314 and the hard mask. In some embodiments, the CMP process is controlled with proper endpoint checking mechanism such that it stops after the hard mask layer 306 is removed.

Figure 45:
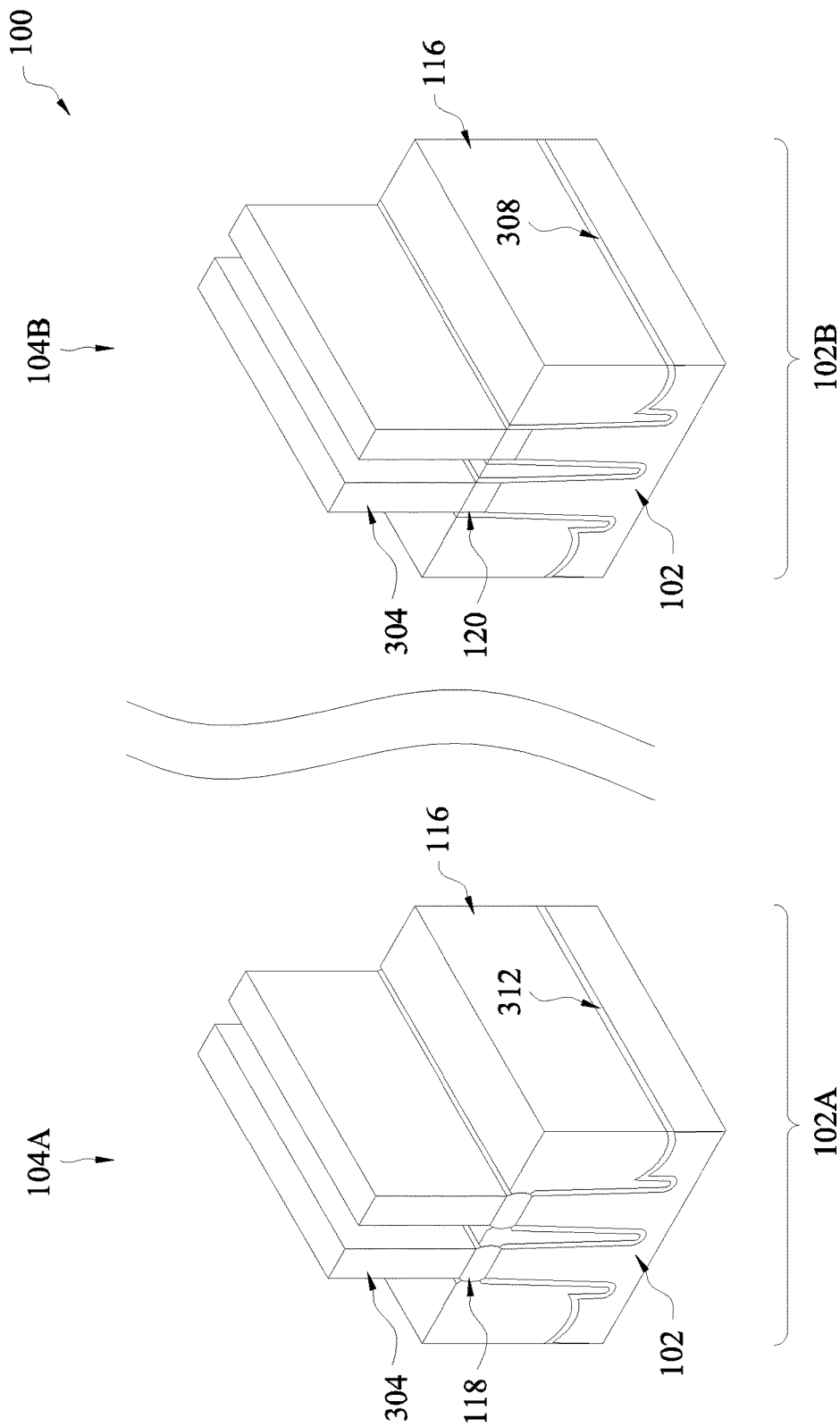

Referring to FIG. 36 and to FIG. 45, the method 500 proceeds to an operation 216 by recessing the isolation features 116 to expose the second semiconductor layer 304, thereby forming raised active regions or fin structure 104, such as the first features 104A and the second fin features 104B. In the illustrated embodiment, the fill material is recessed to expose the semiconductor layer 304 in its entirety. In this embodiment, the fill material 314 is recessed such that the upper surface of the fill material 314 is below the upper surfaces of the second semiconductor layer 304 with a distance tuned according to the desired fin height. Any suitable etching technique may be used to recess the fill material 314 including dry etching, wet etching, RIE, and/or other etching methods, and in an exemplary embodiment, an anisotropic dry etching is used to selectively remove the fill material 314 without etching the second semiconductor layer 304.

In the first region 102A, the first fin features 104A are electrically isolated from each other and from the substrate 102 by the buried isolation feature 118 and STI features 116. In the second region 102B, the second fin features 104B are electrically coupled to the substrate 102 through the semiconductor feature 120.

Referring to of FIG. 36 and to FIG. 46, the method 500 proceeds to an operation 218 by forming dummy gate(s) 316. The dummy gates 316 are formed over the channel region 112 (the portions of the fin features covered by the dummy gates, respectively). Forming the dummy gate 316 may include depositing a dummy gate layer containing polysilicon or other suitable material and patterning the layer in a lithographic process. A gate hard mask layer 318 may be formed on the dummy gate 316. In the illustrated embodiments, no spacers are formed on the sidewalls of the dummy gate 316 or on the sidewalls of the fin features, as shown in FIG. 46.

Figure 47:
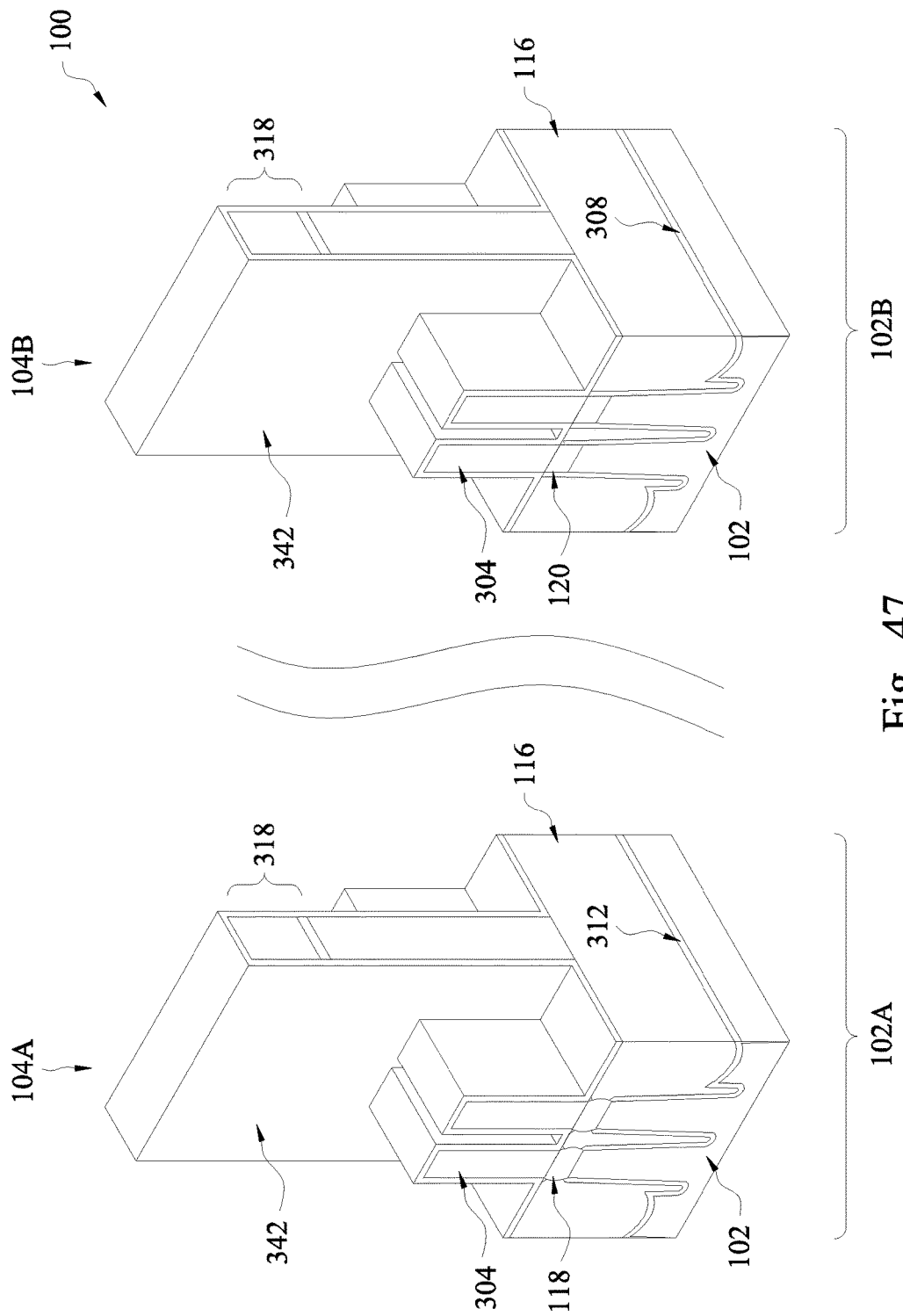

Referring to of FIG. 36 and to FIG. 47, the method 500 proceeds to an operation 502 by forming a seal layer 342 on the semiconductor structure 100. The seal layer 342 is formed on top surfaces and sidewalls of the dummy gate 316 and the fin structure 104 and on the substrate 102. In the illustrated embodiment, the seal layer 342 is a dielectric material layer conformal to the profile of the semiconductor structure 100. The seal layer 342 may include any suitable dielectric material, such as a semiconductor oxide, a semiconductor nitride, a semiconductor carbide, a semiconductor oxynitride, other suitable materials, and/or combinations thereof. The formation of the seal layer 342 includes a suitable deposition, such as dry CVD or ALD. The seal layer 342 is a dielectric layer of a dielectric material being different from the subsequent material, in order to provide etch selectivity. For example, the seal layer 342 is a silicon nitride layer if the subsequent dielectric material layer 348 is silicon oxide.

Figure 48:
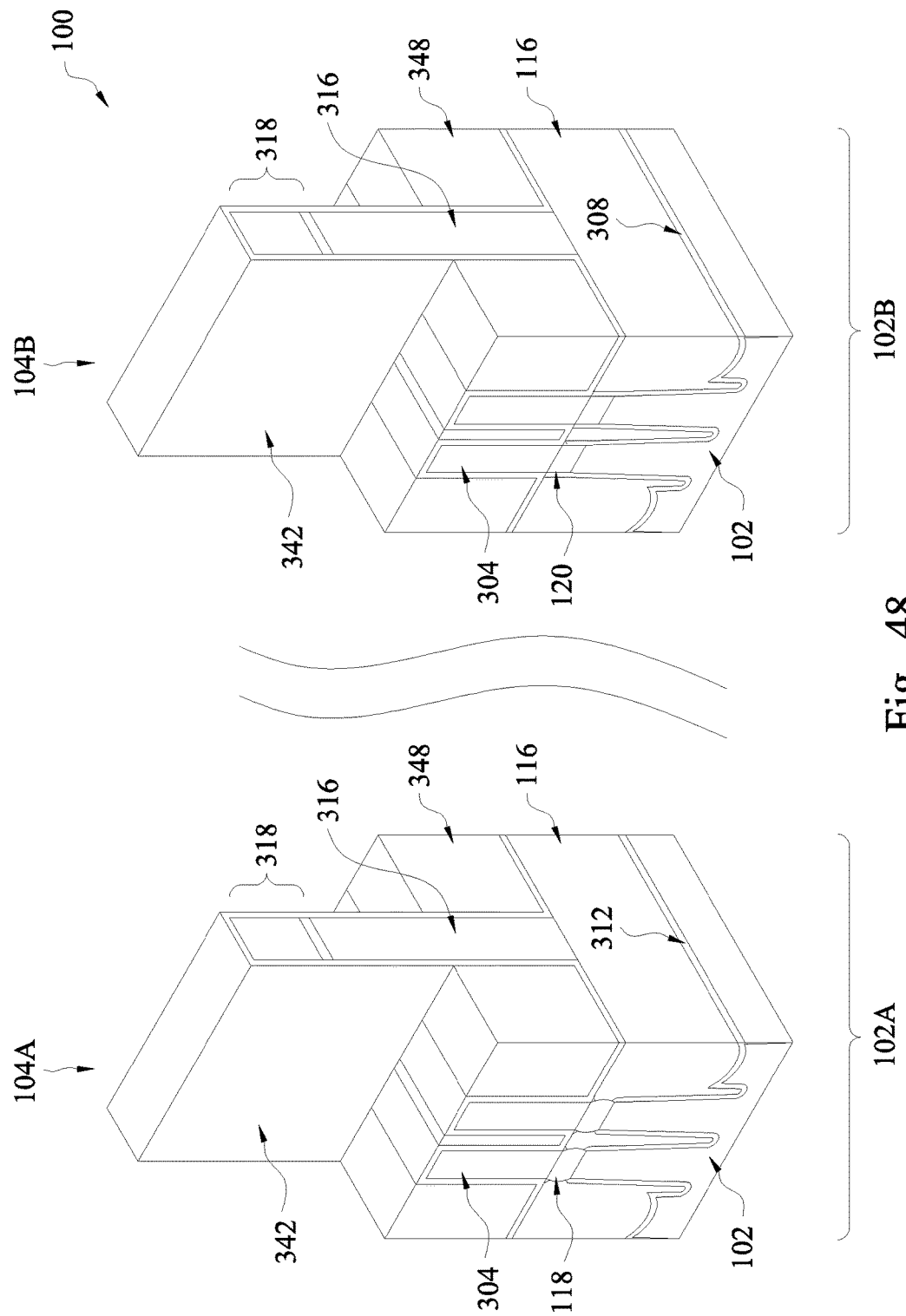
Figure 49:
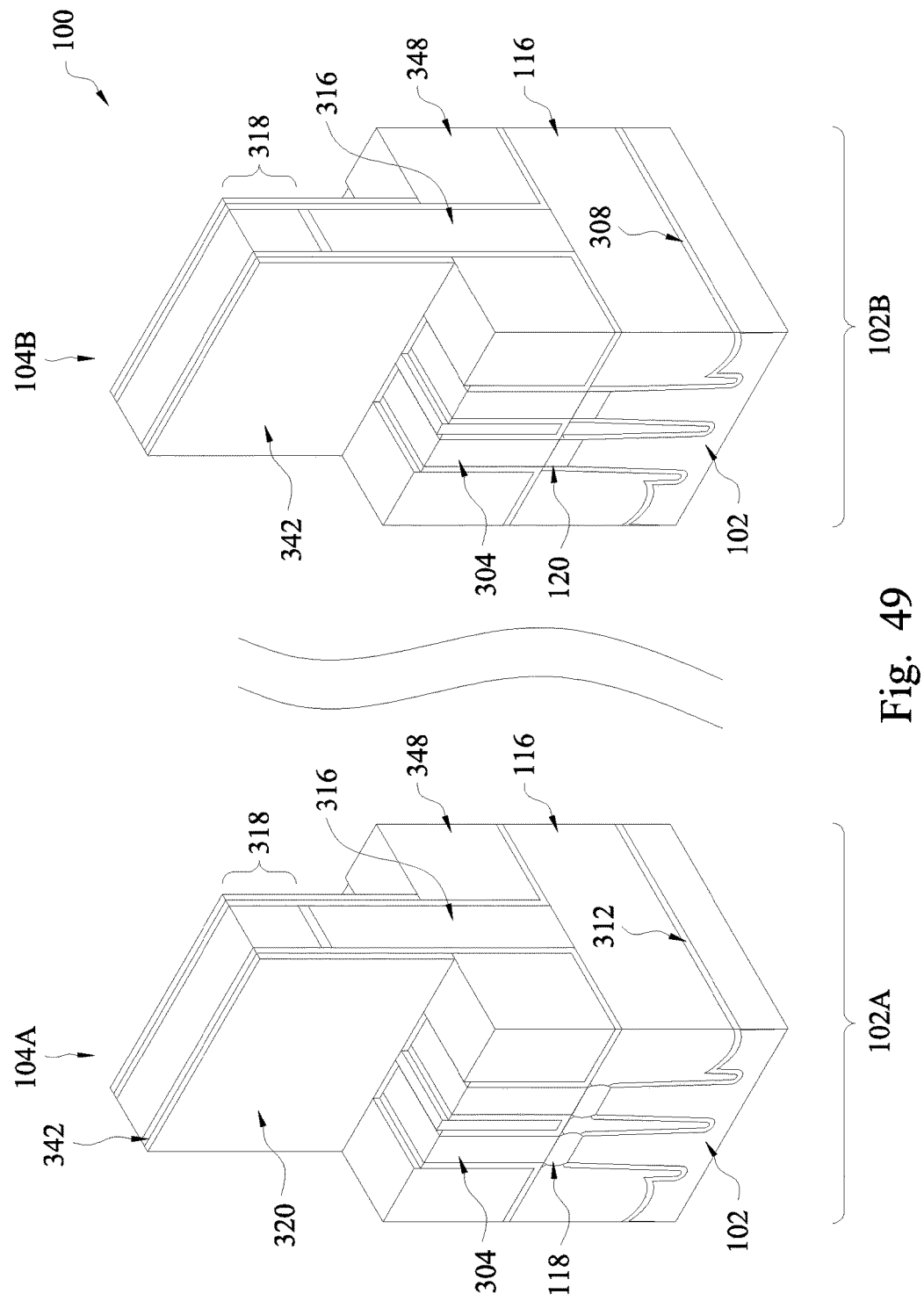
Figure 50:
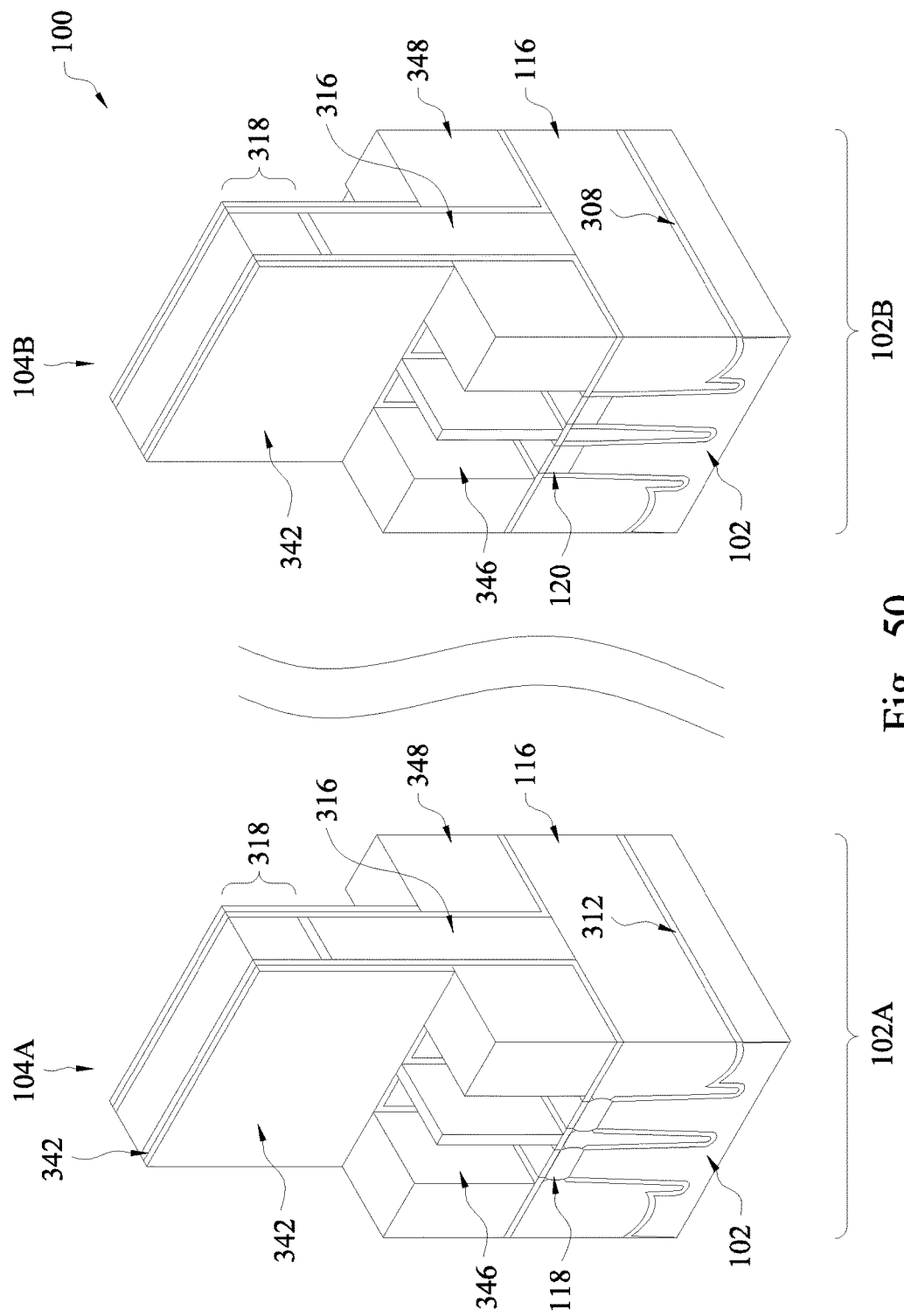

Referring to FIG. 36 and FIGS. 48 through 50, the method 500 proceeds to an operation 504 by forming the source and drain trenches 346. At the operation 504, the portions of the fin features in the source and drain regions are removed, resulting in source and drain trenches as shown in FIG. 50. Thus, the source and drain features are able to be formed in the source and drain trenches with constrain for desired shape.

Referring to FIG. 48, a dielectric material layer 348 is formed on the semiconductor structure 100 by a procedure that includes deposition, polishing and selective etch-back. The dielectric material layer 348 fills in the gaps between the dummy gates and the gaps between the fin features. The dielectric material layer 348 is different from the seal layer 342 in composition for etch selectivity. In the present example, the dielectric material layer 348 is a silicon oxide layer and the seal layer 342 is a silicon nitride layer. The dielectric material layer 348 may be deposited by CVD or other suitable deposition technique, such as FCVD similar to the FCVD described in the operation 214. Then, a CMP process is applied to polish the dielectric material layer 348 and planarize the top surface. The CMP process may stop on the top surface of the dummy gates, such as stop on the gate hard mask 318, for example. Thereafter, a selective etch-back process is applied to the dielectric material layer 348 to recess the dielectric material layer until the fin structure 104 is exposed. The etch-back process is an etch process designed to selectively etch the dielectric material layer 348

(such as selectively etch silicon oxide if the dielectric material layer 348 is silicon oxide) while the gate stacks 316 are protected from etching by the seal layer 342 and the gate hard mask 318.

Referring to FIG. 49, gate spacers 320 are formed on the sidewalls of the dummy gates 316. The formation of the gate spacers 320 includes deposition and anisotropic etch (such as dry etch), similar to the formation of the gate spacer 320 at the operation 218 of the method 200 in terms of composition and formation. However, at this situation, the spacers 320 are not formed on the sidewalls of the fin features (104A and 104B) as being surrounded by the dielectric material layer 348. The gate spacers 320 may be used to offset the subsequently formed source/drain features and may be used for designing or modifying the source/drain structure (junction) profile. The gate spacers 320 may include any suitable dielectric material, such as a semiconductor oxide, a semiconductor nitride, a semiconductor carbide, a semiconductor oxynitride, other suitable materials, and/or combinations thereof.

Referring to FIG. 50, the fin features (104A and 104B) are recessed by etch, thereby forming the source and drain trenches 346. The etching process is designed with etchant to selectively etch the second semiconductor material of the second semiconductor layer 304. The etching process may be wet etch, dry etch or a combination thereof. In some examples, the etching process is similar to the etching process used to pattern the second semiconductor layer 304 in the operation 206. In some examples, the etching process includes a wet etch with an etchant, such as KOH, HCl or HNO3/H2O/HF. The fin features covered by the gate stacks 316 are protected from etching. In the present embodiment, the second semiconductor material layer 304 within the source and drain regions is controlled to be substantially removed but not completely removed such that the epitaxy growth is able to occur using the remaining portions of the second semiconductor material as the epitaxy seed layer. The seal layer 342 may be removed as well, such as from the sidewalls of the source and drain trenches 346, by a suitable etch, such as wet etching.

Figure 51:
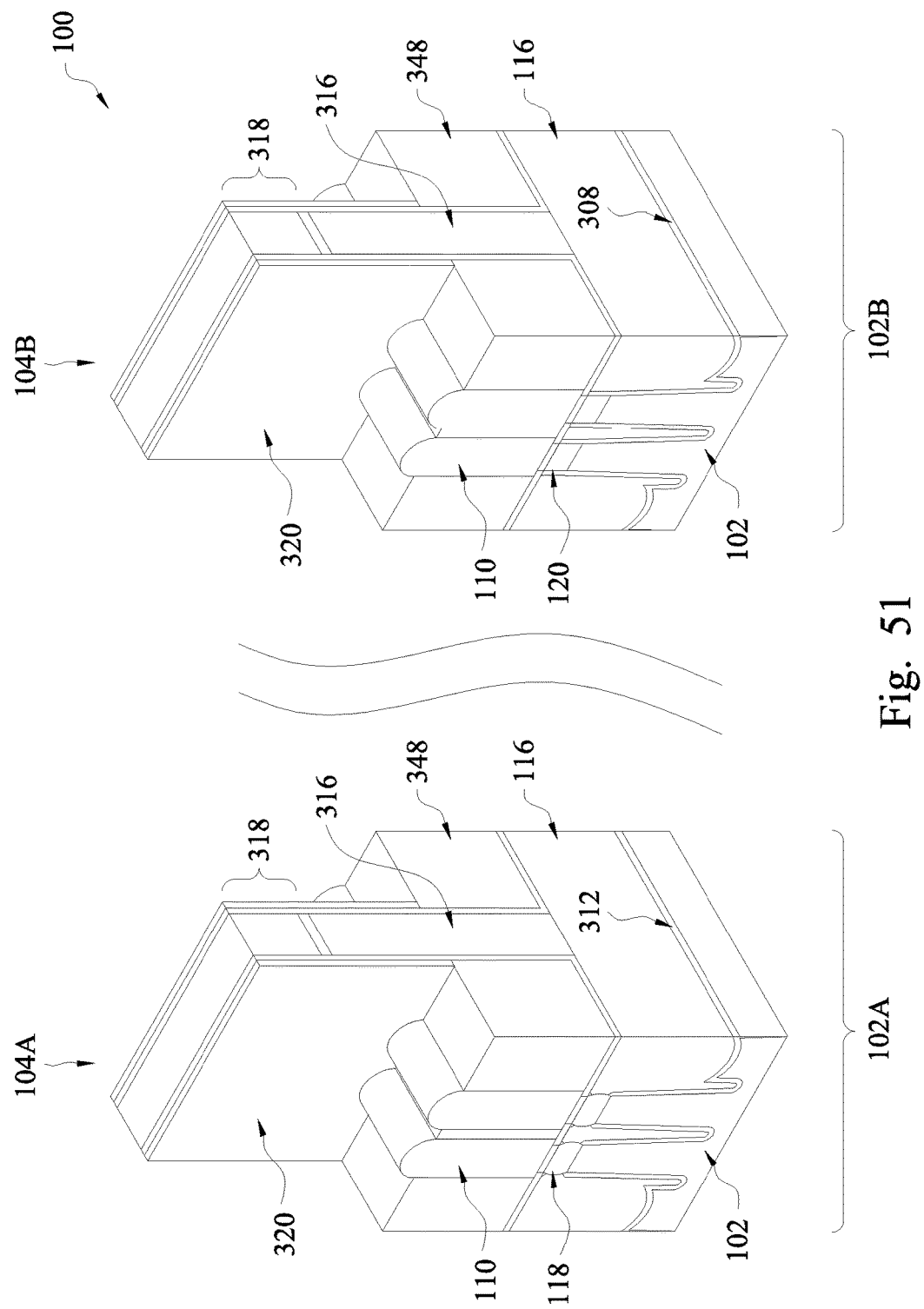
Figure 52:
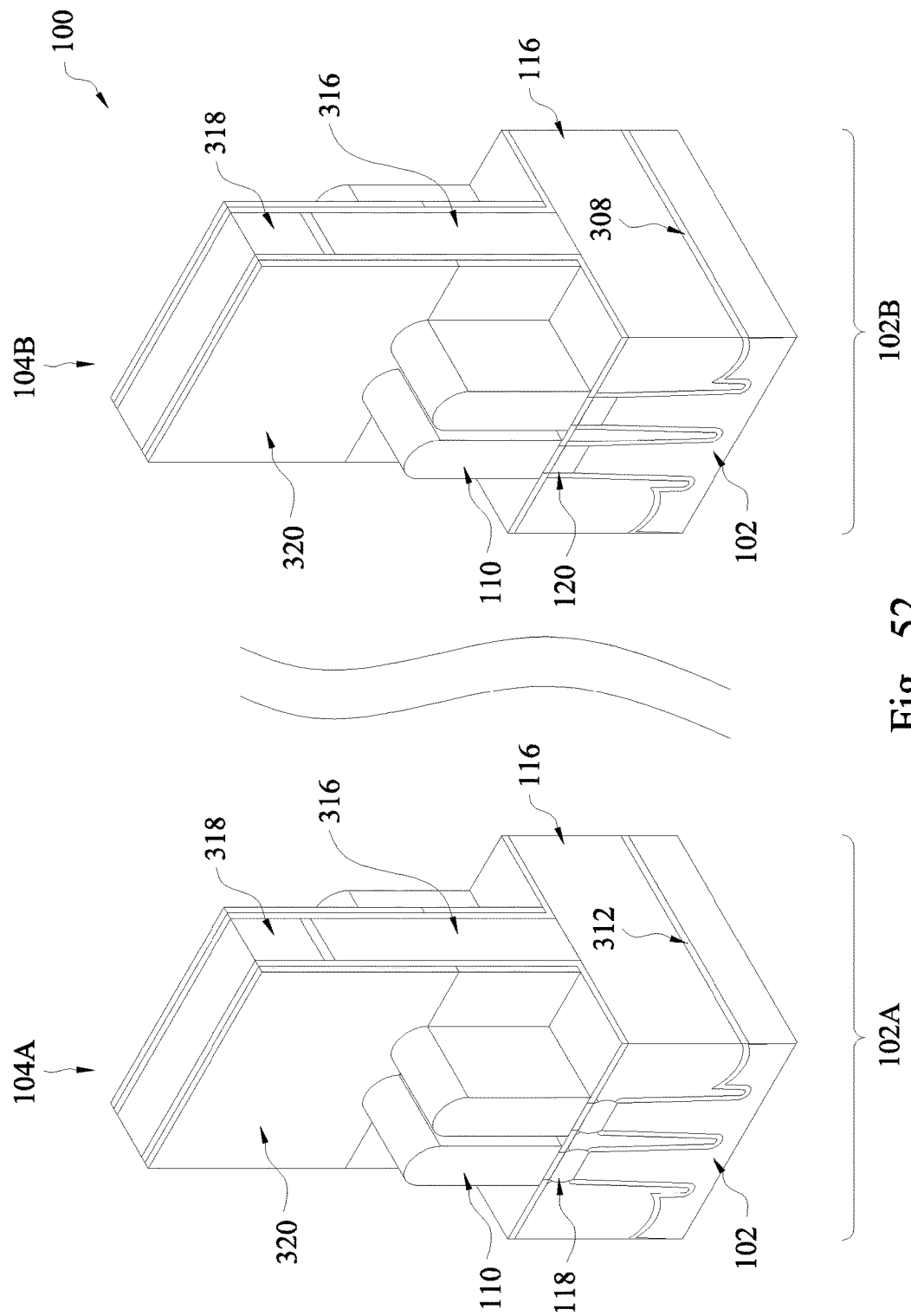
Figure 53:
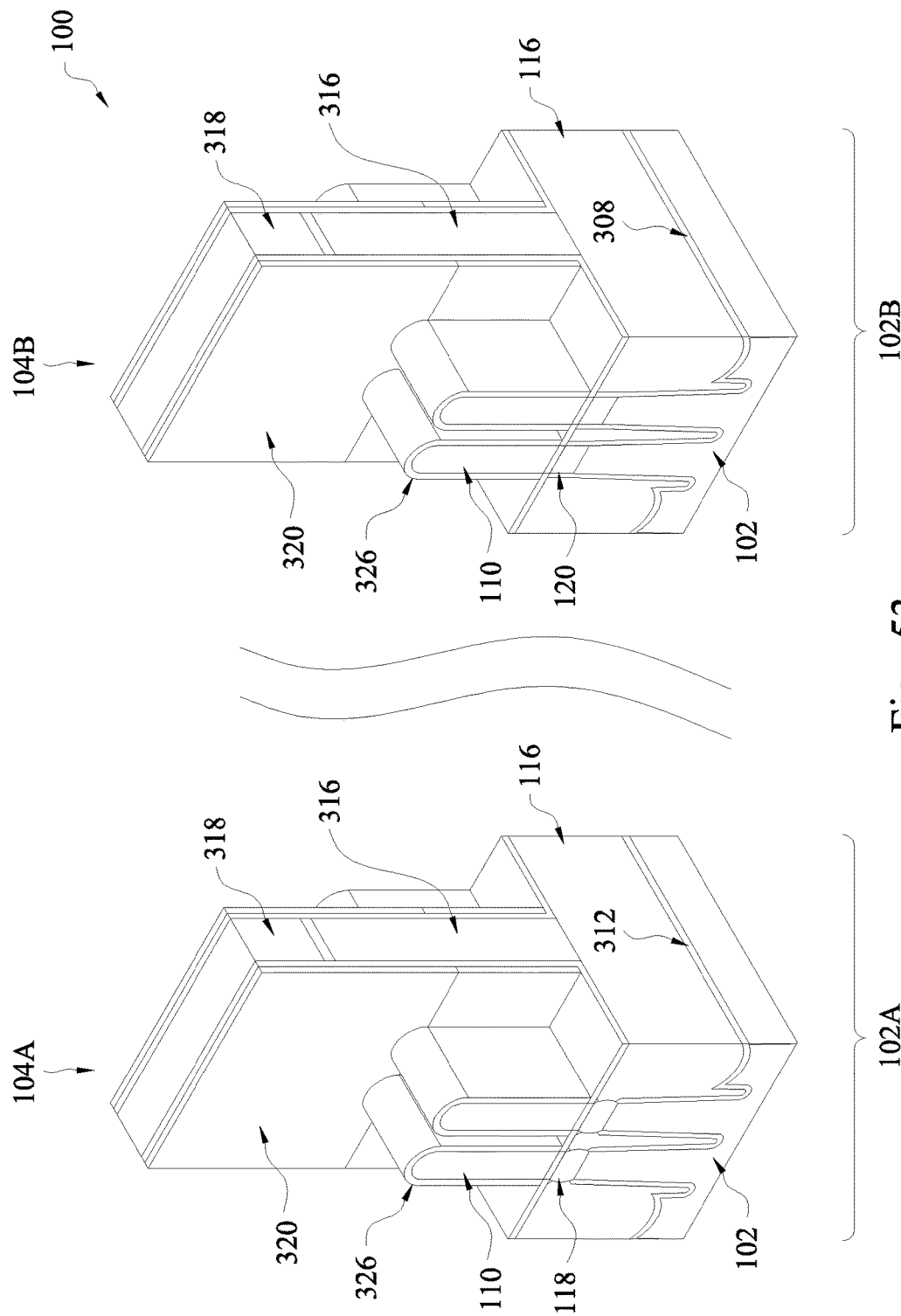

Referring to FIG. 36 and to FIGS. 51 through 53, the method 500 proceeds to an operation 506 to form the source and drain features 110 in the source and drain trenches 346. The source/drain (S/D) features 110 are formed by epitaxy growth. The dielectric material layer 348, the dummy gates 316 and/or gate spacers 320 limit the source/drain features 110 to be formed the source/drain regions. Particularly, the source and drain trenches 346 defined in the dielectric material layer 348 constrain the epitaxy growth such that the formed source and drain features 110 are in the desired shape, as shown in FIG. 51. In many embodiments, the source/drain features 110 are formed by one or more epitaxy or epitaxial processes, whereby Si features, SiGe features, SiC features, and/or other suitable features are grown in a crystalline state on the fin structure 104.

The source/drain features 110 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 110 are not in-situ doped, an implantation process (i.e., a junction implant process) is performed to dope the source/drain features 110. In an exemplary embodiment, the source/drain features 110 in an NMOS include SiCP or SiP, while those in a PMOS include GeSnB (tin may be used to tune the lattice constant) and/or SiGeSnB. One or more annealing processes may be performed to activate the source/drain features 110. Suitable annealing processes include rapid thermal annealing (RTA) and/or laser annealing processes.

Referring to FIG. 52, the dielectric material layer 348 is recessed by an etching process. After the recessing, the sidewalls of the source and drain features 110 are at least partially exposed. The etching process to recess the dielectric material layer 348 may uses an etch process similar to the etching process used in the operation 216. In one example, the dielectric material layer 348 of silicon oxide may be removed by HF solution using the seal layer 342 interposed between the isolation feature 116 and the dielectric material layer 348 as an etch stop layer.

Referring to FIG. 53, silicide features 326 may be formed on the source and drain features 110. The silicide features 326 may include such materials as nickel silicide, cobalt silicide, tungsten silicide, tantalum silicide, titanium silicide, platinum silicide, erbium silicide, palladium silicide, or combinations thereof. The silicide features 326 may be formed by silicidation such as self-aligned silicid, in which a metal is deposited, reacted with silicon during an annealing process, and then the unreacted metal is removed by etch.

Figure 54:
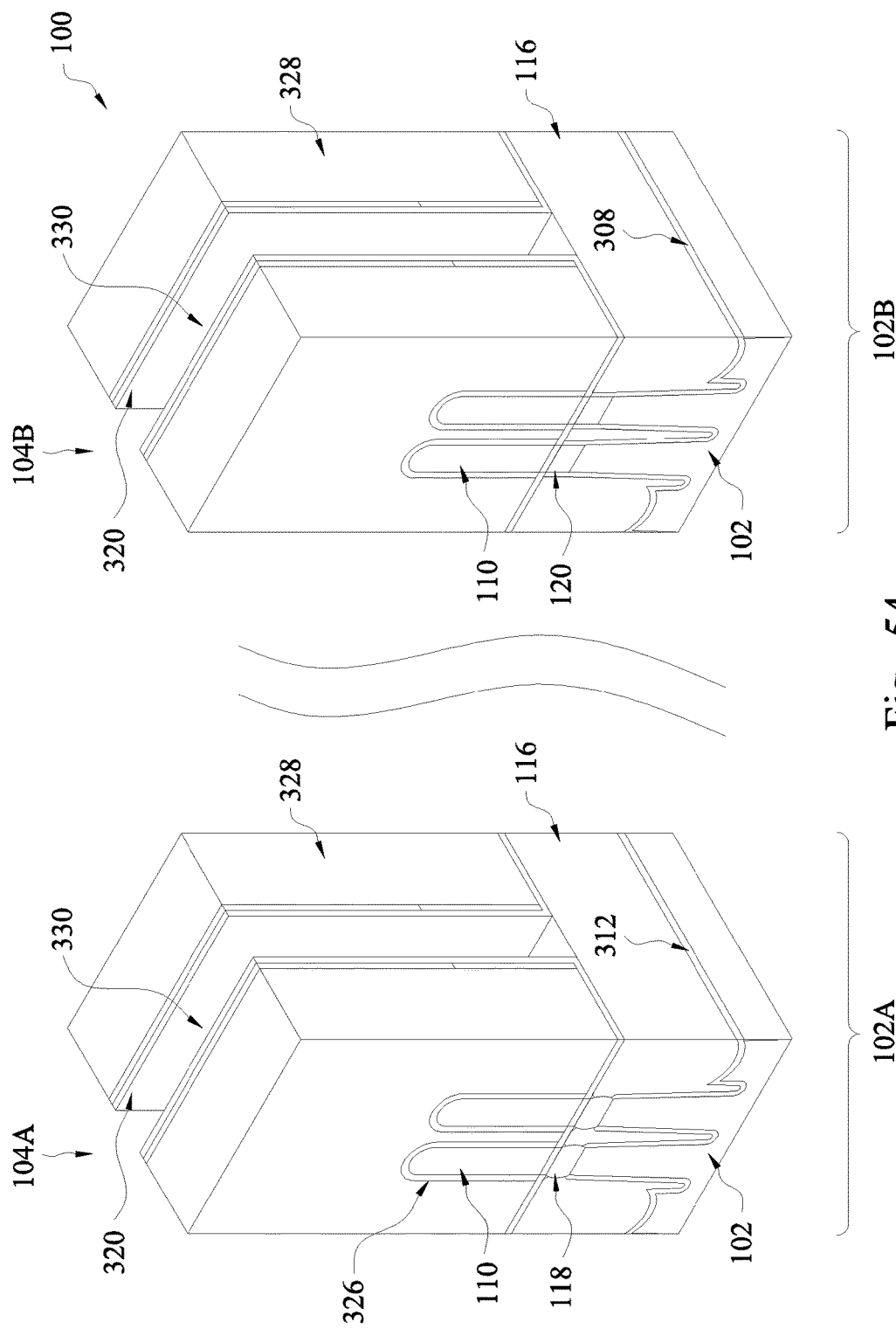

Referring to FIG. 36 and to FIG. 54, the method 500 proceeds to an operation 222 by forming an ILD 328 on the substrate 102. Particularly, the ILD 328 is formed on the source/drain features 110 in the source/drain regions. The ILD 328 may surround the dummy gates 316 and/or gate spacers 320 allowing these features to be removed and replacement gates to be formed in the resulting cavity. The ILD 328 may include any suitable dielectric material, such as a semiconductor oxide, a semiconductor nitride, a semiconductor oxynitride, a semiconductor carbide, other suitable materials, and/or combinations thereof. In some embodiments, the formation of the ILD 328 includes deposition and CMP. The ILD layer 328 may also be part of an electrical interconnect structure that electrically interconnects the devices of the workpiece. In such embodiments, the ILD 328 acts as an insulator that supports and isolates the conductive traces.

Referring to FIG. 36 and to FIG. 54, the method 500 proceeds to an operation 224 by removing the dummy gates 316. The dummy gates 316 are removed after depositing the ILD layer 328, resulting in gate trenches (cavities) 330 in the ILD layer 328, as shown in FIG. 34.

Figure 55:
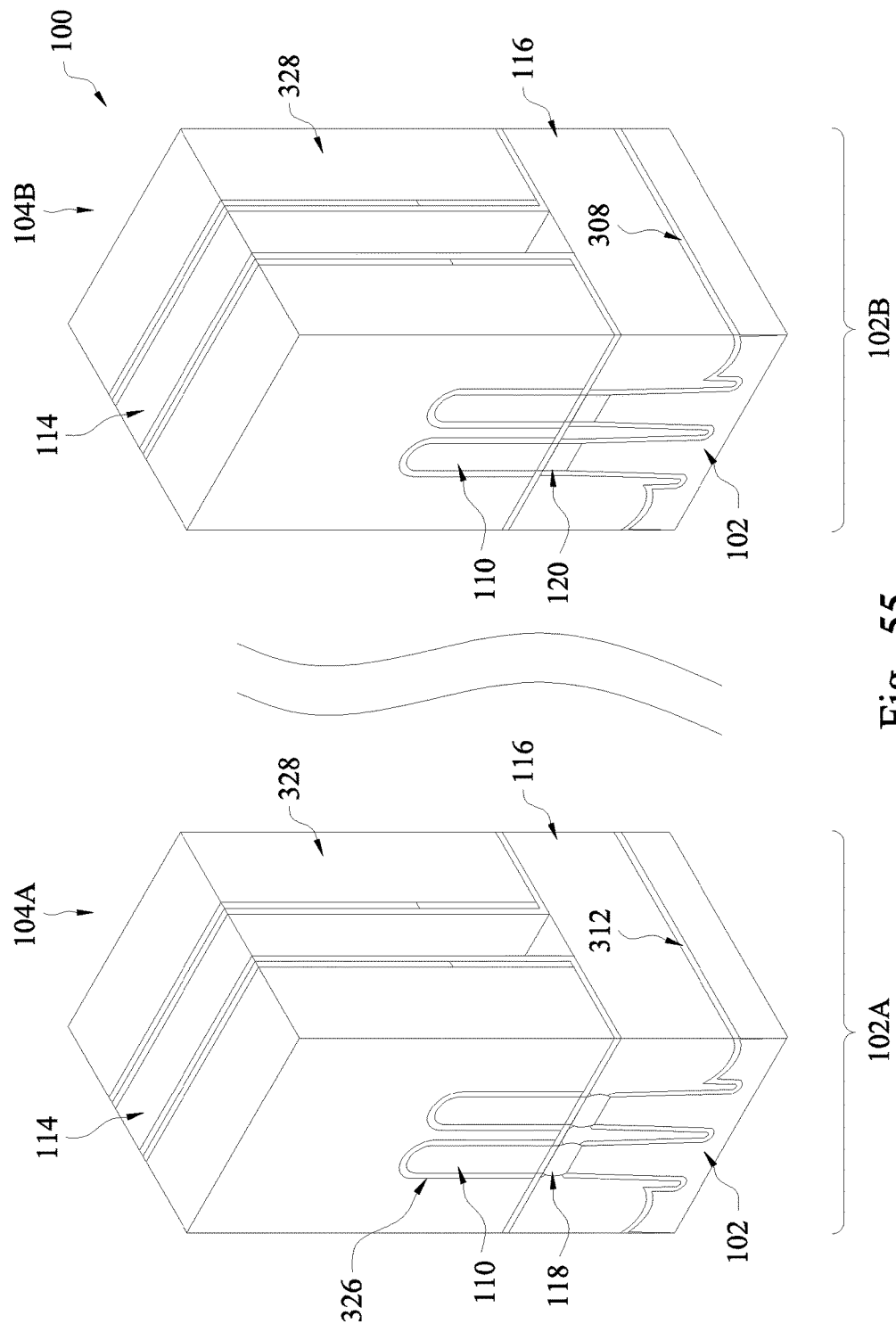

Referring to FIG. 36 and to FIG. 55, gate stacks 114 are formed on the workpiece 100. The gate stacks 114 are formed on the workpiece 100 wrapping around the channel regions 112 of the fin structure 104. The gate stacks 114 are formed in the gate trenches 330 by a procedure, such as a procedure that includes deposition and CMP. In some embodiments, gate stack 114 is a high-k metal gate that includes a gate dielectric layer, and a gate electrode layer that each may include a number of sub-layers.

Figure 55A:
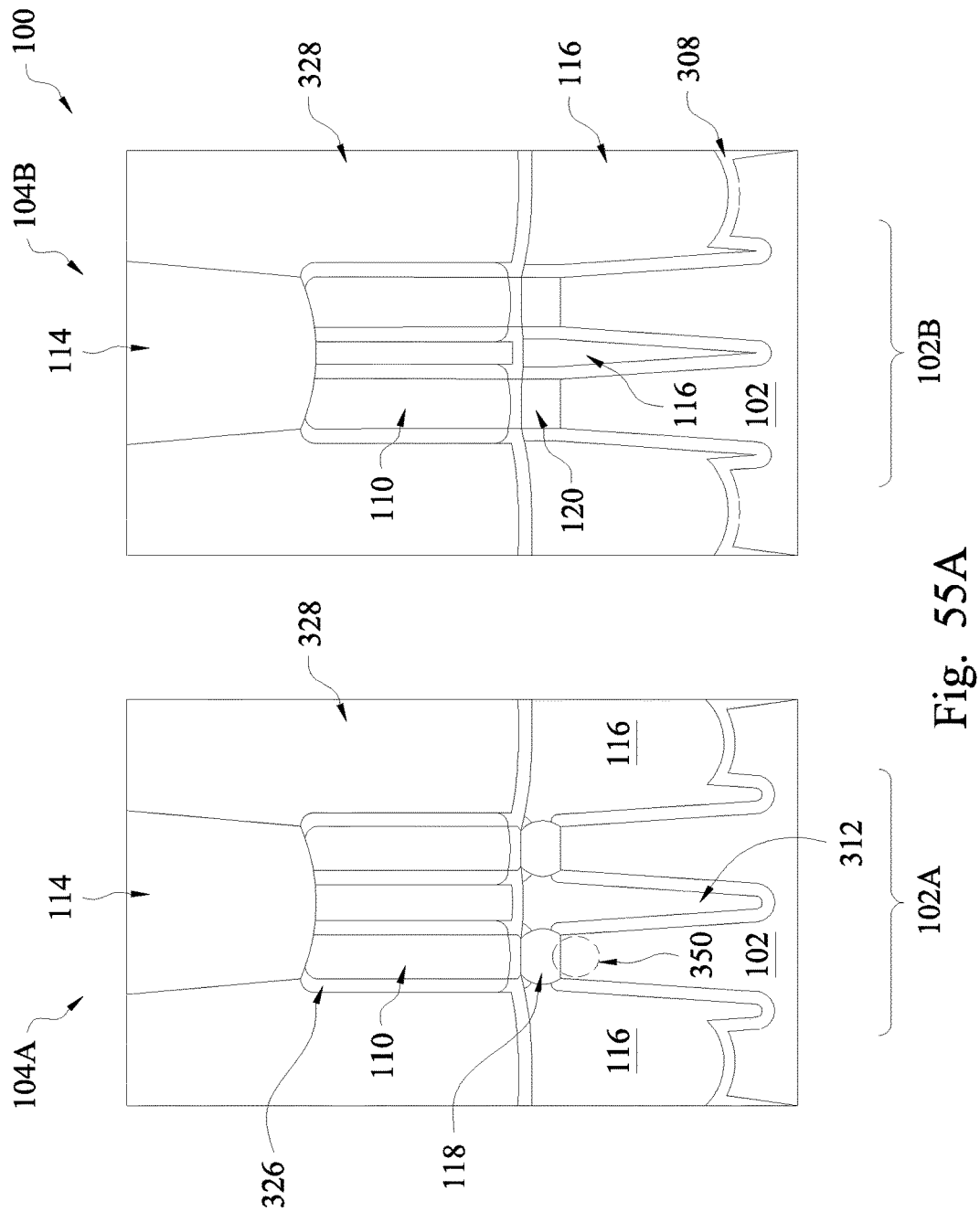
FIG. 55A is a sectional view of the semiconductor structure of FIG. 55, constructed in accordance with some embodiments.

FIG. 55A is a sectional view of the semiconductor structure 100, constructed in accordance with some embodiments. The first fin feature 104A includes the buried isolation semiconductor feature 118 while the second feature 104B includes the semiconductor feature 120. The buried isolation feature 118 is surrounded from the sidewalls by the isolation feature 116 horizontally and interposed between the source and drain features 110 and the substrate 102 vertically. Similarly, the semiconductor feature 120 is surrounded from the sidewalls by the isolation feature 116 horizontally and interposed between the source and drain features 110 and the substrate 102 vertically. The source and drain features 110 are formed on the buried isolation feature 118 (or the semiconductor feature 120). The substrate 102 includes a first semiconductor material; the semiconductor feature 120 includes a second semiconductor material; and the first and second fin features include a third semiconductor material. The buried isolation feature 118 includes an oxide of the second semiconductor material. The second semiconductor material is different from the third semiconductor material in composition. In some embodiments, the second semiconductor material is different from the first semiconductor material in composition. For example, the first and third semiconductor materials include silicon. In the present embodiment, the second semiconductor material is a compound semiconductor material, such as silicon germanium. In furtherance of the embodiment, the semiconductor feature 120 includes silicon germanium; and the buried isolation feature 118 includes silicon germanium oxide. Furthermore, an APT feature 350 formed by APT ion implantation at the block 202 is disposed in the substrate 102 and is underlying the buried isolation feature 118.

The buried isolation feature 118 is formed from a semiconductor material of the second semiconductor material by a selective oxidation process that is tuned to oxidize the second semiconductor material but not oxidize the third semiconductor material. Especially, the buried isolation feature 118 is converted from a portion of a semiconductor layer of the second semiconductor material that forms the semiconductor feature 120. The buried isolation feature 118 has a first thickness T1 and the semiconductor feature 120 has a second thickness T2 different from the first thickness T1. In the present embodiment, the second thickness T2 is less than the first thickness T1. In furtherance of the embodiment, the first thickness T1 is about twice of the second thickness T2, within a variation less than 30%, or preferably less than 10%. In some embodiments, the first thickness T1 ranges from 10 nm to 30 nm and the second thickness T2 ranges from 5 nm to 15 nm.

The present disclosure provides a semiconductor structure and a method making the same. The semiconductor structure includes a substrate having a core region and a non-core region. The core region is for core devices, such as FinFETs and the non-core region is for devices, such as BJT, pickup features, diodes or a combination thereof. The semiconductor feature 120 is formed in the non-core region 102B and electrically couples the fin feature 104B to the substrate 102, thereby reducing defects and voids from epitaxy growth. The buried isolation feature 118 is formed in the core region 102A and electrically isolates the fin feature 102A from the substrate 102. Such formed buried isolation layer 118 provides full isolation of the fin structure 104 from the substrate 102, thereby effectively reducing (or eliminating) the anti-punch-through effect, reducing the leakage, and enhancing the device performance.

Thus, the present disclosure provides a semiconductor structure in accordance with some embodiments. The semiconductor structure includes a substrate having a first region and a second region; a first fin feature formed on the substrate within the first region; and a second fin feature formed on the substrate within the second region. The first fin feature includes a first semiconductor feature of a first semiconductor material formed on a dielectric feature that is an oxide of a second semiconductor material. The second fin feature includes a second semiconductor feature of the first semiconductor material formed on a third semiconductor feature of the second semiconductor material.

The present disclosure also provides a semiconductor structure in accordance with some other embodiments. The semiconductor structure includes a first and a second fin feature formed on a substrate; a field effect transistor (FET) formed on the first fin feature. The FET includes a gate stack formed over the first fin feature; source/drain regions over the substrate and disposed on opposing sides of the gate stack; a channel region defined in the first fin feature and underlying the gate stack; and a buried isolation feature disposed vertically between the channel region and the substrate, wherein the buried isolation feature includes an oxide of a compound semiconductor. The semiconductor structure further includes a semiconductor device formed on the second fin feature, wherein the semiconductor device is selected from the group consisting of a diode, a contact pickup, a bipolar junction transistor, and a combination thereof, wherein the second fin feature is disposed on a semiconductor feature of the compound semiconductor material.

The present disclosure provides a method of fabricating a nonplanar circuit device in accordance with some embodiments. The method includes forming a first semiconductor layer of a first semiconductor material on a substrate and a second semiconductor layer of a second semiconductor material on the first semiconductor layer, wherein the second semiconductor material is different from the first semiconductor material; patterning the first and second semiconductor layers, thereby forming a first fin semiconductor feature of the second semiconductor material and a first semiconductor feature of the first semiconductor material in a first region, and a second fin semiconductor feature of the second semiconductor material and a second semiconductor feature of the first semiconductor material in a second region; forming a hard mask, wherein the hard mask protects the second fin semiconductor feature and the second semiconductor feature, and has an opening, in the first region, that exposes the first fin semiconductor feature and the second semiconductor feature; and performing a selective oxidization process to the first semiconductor layer, thereby converting the first semiconductor feature into a dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having a first region and a second region;
a first fin feature formed on the substrate within the first region; and
a second fin feature formed on the substrate within the second region,
wherein the first fin feature includes a first semiconductor feature of a first semiconductor material formed on a dielectric feature that is an oxide of a second semiconductor material,
wherein the second fin feature includes a second semiconductor feature of the first semiconductor material formed on a third semiconductor feature of the second semiconductor material,
wherein a field effect transistor (FET) is formed on the first semiconductor feature, and wherein a semiconductor device other than a FET is formed on the second semiconductor feature.

2. The semiconductor structure of claim 1, wherein the first semiconductor material includes silicon and the second semiconductor material includes silicon germanium.

3. The semiconductor structure of claim 1, wherein the semiconductor device is a device selected from the group consisting of a diode, a contact pickup, a bipolar junction transistor, and a combination thereof.

4. The semiconductor structure of claim 1, further comprising a first shallow trench isolation (STI) feature within the first region and a second STI feature within the second region, wherein the substrate is a semiconductor substrate that includes the first semiconductor material.

5. The semiconductor structure of claim 4, wherein
the first STI feature contacts sidewalls of the dielectric feature and fully covers the sidewalls of the dielectric feature; and
the second STI feature fully covers sidewalls of the third semiconductor feature.

6. The semiconductor structure of claim 1, wherein the dielectric feature has a first thickness and the third semiconductor feature has a second thickness less than the first thickness.

7. The semiconductor structure of claim 6, wherein the first thickness is about 2 times of the second thickness.

8. The semiconductor structure of claim 6, wherein the first thickness ranges between 10 nm and 30 nm and the second thickness ranges between 5 nm and 15 nm.

9. The semiconductor structure of claim 1, wherein the FET further includes a source and drain cladding on the first semiconductor feature, wherein the source and drain includes a silicon germanium doped with a p-type dopant.

10. The semiconductor structure of claim 1, wherein the FET further includes a source and drain cladding on the first semiconductor feature, wherein the source and drain includes a silicon carbide doped with an n-type dopant.

11. A semiconductor structure, comprising:
a first and a second fin features formed on a substrate;
a field effect transistor (FET) formed on the first fin feature, wherein the FET includes a gate stack formed over the first fin feature; source/drain features over the substrate and disposed on opposing sides of the gate stack; a channel region defined in the first fin feature and underlying the gate stack; and a buried isolation feature disposed vertically between the channel region and the substrate, wherein the buried isolation feature includes an oxide of a compound semiconductor; and
a semiconductor device formed on the second fin feature, wherein the semiconductor device is selected from the group consisting of a diode, a contact pickup, a bipolar junction transistor, and a combination thereof, wherein the second fin feature is disposed on a semiconductor feature of the compound semiconductor material.

12. The semiconductor device of claim 11, wherein the buried isolation feature is configured to completely electrically isolate the channel region from the substrate.

13. The semiconductor structure of claim 11, wherein the buried isolation feature has a first thickness and the semiconductor feature has a second thickness less than the first thickness.

14. The semiconductor device of claim 11, wherein
the compound semiconductor material includes silicon germanium; and
the first and second fin features include a semiconductor material different from the compound semiconductor material in composition.

15. The semiconductor structure of claim 11, further comprising a first shallow trench isolation (STI) feature within the first region and a second STI feature within the second region, wherein
the first STI feature contacts sidewalls of the buried isolation feature and fully covers the sidewalls of the buried isolation feature; and
the second STI feature fully covers sidewalls of the semiconductor feature.

16. A semiconductor structure, comprising:
a first and a second fin features formed on a substrate;
a field effect transistor (FET) formed on the first fin feature, wherein the FET includes a gate stack formed over the first fin feature; source/drain features over the substrate and disposed on opposing sides of the gate stack; a channel region defined in the first fin feature and underlying the gate stack; and a buried isolation feature disposed vertically between the channel region and the substrate, wherein the buried isolation feature includes an oxide of a compound semiconductor, wherein sidewalls of the buried isolation feature are in contact with and covered by a shallow trench isolation (STI) feature; and
a semiconductor device formed on the second fin feature, wherein the semiconductor device is selected from the group consisting of a diode, a contact pickup, a bipolar junction transistor, and a combination thereof, wherein the second fin feature is disposed on a semiconductor feature of the compound semiconductor material, wherein sidewalls of the semiconductor feature are covered by a semiconductor oxide layer.

17. The semiconductor structure of claim 16, wherein sidewalls of the source/drain features are covered by a dielectric material layer disposed on a seal layer, and wherein the seal layer and the dielectric material layer are of different chemical compositions.

18. The semiconductor structure of claim 17, wherein the STI feature is in contact with and covered by the seal layer.

19. The semiconductor structure of claim 16, wherein the buried isolation feature has a first thickness and the semiconductor feature has a second thickness less than the first thickness.

20. The semiconductor structure of claim 19, wherein the first thickness is about 2 times of the second thickness.

* * * * *